US012628638B2

(12) United States Patent
Xie et al.

(10) Patent No.: US 12,628,638 B2
(45) Date of Patent: May 12, 2026

(54) BURIED VIA-TO-BACKSIDE POWER RAIL (VBPR) FOR STACKED FIELD-EFFECT TRANSISTOR (FET)

(71) Applicant: INTERNATIONAL BUSINESS MACHINES CORPORATION, Armonk, NY (US)

(72) Inventors: Ruilong Xie, Niskayuna, NY (US); Nicholas Anthony Lanzillo, Wynantskill, NY (US); Julien Frougier, Albany, NY (US); Kangguo Cheng, Schenectady, NY (US); Eric Miller, Watervliet, NY (US); Lawrence A Clevenger, Saratoga Springs, NY (US); Daniel James Dechene, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 641 days.

(21) Appl. No.: 17/662,748

(22) Filed: May 10, 2022

(65) Prior Publication Data

US 2023/0369217 A1 Nov. 16, 2023

(51) Int. Cl.
H10W 20/41 (2026.01)
H10D 30/01 (2025.01)
(Continued)

(52) U.S. Cl.
CPC ...... H10W 20/427 (2026.01); H10D 30/0198 (2025.01); H10D 30/031 (2025.01);
(Continued)

(58) Field of Classification Search
CPC ..................... H01L 23/5286; H10D 30/6735; H10D 94/85; H10W 20/427; H10W 20/023
See application file for complete search history.

(56) References Cited

U.S. PATENT DOCUMENTS 9,659,963 B2 5/2017 Cheng
9,837,414 B1 12/2017 Balakrishnan
(Continued)

FOREIGN PATENT DOCUMENTS

WO 2019035945 A1 2/2019

OTHER PUBLICATIONS

Prasad, Divya, "Can we Bury our Scaling Problems with Buried Power Rails and Back-side Power Delivery?", Community Arm , Mar. 5, 2020, 6 pages, <https://community.arm.com/arm-research/b/articles/posts/can-we-bury-our-scaling-problems-with-buried-power-rails-and-back-side-power-delivery>.
(Continued)

*Primary Examiner* — Davienne N Monbleau
*Assistant Examiner* — Dmitri Mihaliov
(74) *Attorney, Agent, or Firm* — Edward J. Wixted, III

(57) ABSTRACT

Embodiments of the invention include a method for fabricating a semiconductor device and the resulting structure. A first field-effect transistor (FET) having a first source/drain region is formed. A second FET having a second source/drain region is formed, where the second FET is stacked above the first FET. A trench extending from above the second source/drain region to beneath the first source/drain region is formed, where the trench passes through portions of (i) the first source/drain region and (ii) the second source/drain region. A bottom contact is formed in the trench. A dielectric layer is formed in the trench, the dielectric layer on a top surface of the bottom contact. A top contact is formed in the trench, the top contact on a top surface of the dielectric layer.

18 Claims, 46 Drawing Sheets

(51) Int. Cl.

| | |
|---|---|
| *H10D 30/67* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 84/85* | (2025.01) |
| *H10D 88/00* | (2026.01) |
| *H10P 14/20* | (2026.01) |
| *H10W 20/00* | (2026.01) |

(52) U.S. Cl.
  CPC ..... *H10D 30/6713* (2025.01); *H10D 30/6729* (2025.01); *H10D 30/6735* (2025.01); *H10D 30/6757* (2025.01); *H10D 62/118* (2025.01); *H10D 64/017* (2025.01); *H10D 84/0149* (2025.01); *H10D 84/0167* (2025.01); *H10D 84/017* (2025.01); *H10D 84/0186* (2025.01); *H10D 84/038* (2025.01); *H10D 84/856* (2025.01); *H10D 88/01* (2025.01); *H10P 14/3452* (2026.01); *H10W 20/023* (2026.01)

(56) References Cited

U.S. PATENT DOCUMENTS

| | | | |
|---|---|---|---|
| 10,090,193 | B1 | 10/2018 | Chanemougame |
| 10,192,867 | B1 | 1/2019 | Frougier |
| 10,256,158 | B1 | 4/2019 | Frougier |
| 10,304,832 | B1 | 5/2019 | Chanemougame |
| 10,811,415 | B2 | 10/2020 | Sengupta |
| 10,985,064 | B2 | 4/2021 | Zhang |
| 11,094,594 | B2 | 8/2021 | Tsao |
| 2011/0136310 | A1 | 6/2011 | Grivna |
| 2020/0266169 | A1 | 8/2020 | Kang |
| 2021/0035975 | A1* | 2/2021 | Kim ..................... H10D 64/017 |
| 2021/0118798 | A1 | 4/2021 | Liebmann |
| 2022/0037497 | A1* | 2/2022 | Chung .............. H10D 84/0158 |
| 2023/0088101 | A1* | 3/2023 | Naylor ................ H10D 62/118 |
| | | | 257/29 |

OTHER PUBLICATIONS

Prasad, et al., "Buried power rails and Back-side Power Grids: Arm CPU Power Delivery Network Design Beyond 5nm", Proceedings of the 65th International Electron Devices Meeting (IEDM), Dec. 7-11, 2019, San Francisco, California, 4 pages.

Ryckaert J et al., "The Complementary FET (CFET) for CMOS scaling beyond N3", Conference: 2018 IEEE Symposium on VLSI Technology, Jun. 2018, 02 pages.

\* cited by examiner

BURIED VIA-TO-BACKSIDE POWER RAIL (VBPR) FOR STACKED FIELD-EFFECT TRANSISTOR (FET)

BACKGROUND

The present invention relates generally to the field of semiconductor devices and fabrication, and more particularly to stacked integrated circuit structures, containing field-effect transistors (FETs), having a buried via-to-backside power rail (VBPR) that connects bottom source/drain (S/D) of the stacked device to backside power rail (BPR), with a dielectric layer isolating an upper contact from the VBPR.

The use of non-planar semiconductor devices such as, for example, semiconductor fin field effect transistors (FinFETs) is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

Nanosheet formation relies on the selective removal of one semiconductor material (e.g., silicon) to another semiconductor material (e.g., a silicon germanium alloy) to form suspended nanosheets for gate-all-around devices. Source/drain (S/D) regions for nanosheet containing devices are currently formed by epitaxial growth of a semiconductor material upwards from an exposed surface of the semiconductor substrate and from sidewalls of each nanosheet.

A stacked device is formed by stacking one FET over another FET, greatly reducing the footprint of the device and increase the transistor density.

SUMMARY

Embodiments of the invention include a method for fabricating a semiconductor device and the resulting structure. The method includes forming a first field-effect transistor (FET) having a first source/drain region. The method can also include forming a second FET having a second source/drain region, where the second FET is stacked above the first FET. The method can also include forming a trench extending from above the second source/drain region to beneath the first source/drain region, where the trench passes through portions of (i) the first source/drain region and (ii) the second source/drain region. The method can also include forming a bottom contact in the trench. The method can also include forming a dielectric layer in the trench, the dielectric layer on a top surface of the bottom contact. The method can also include forming a top contact in the trench, the top contact on a top surface of the dielectric layer.

DETAILED DESCRIPTION

Figure 1A:
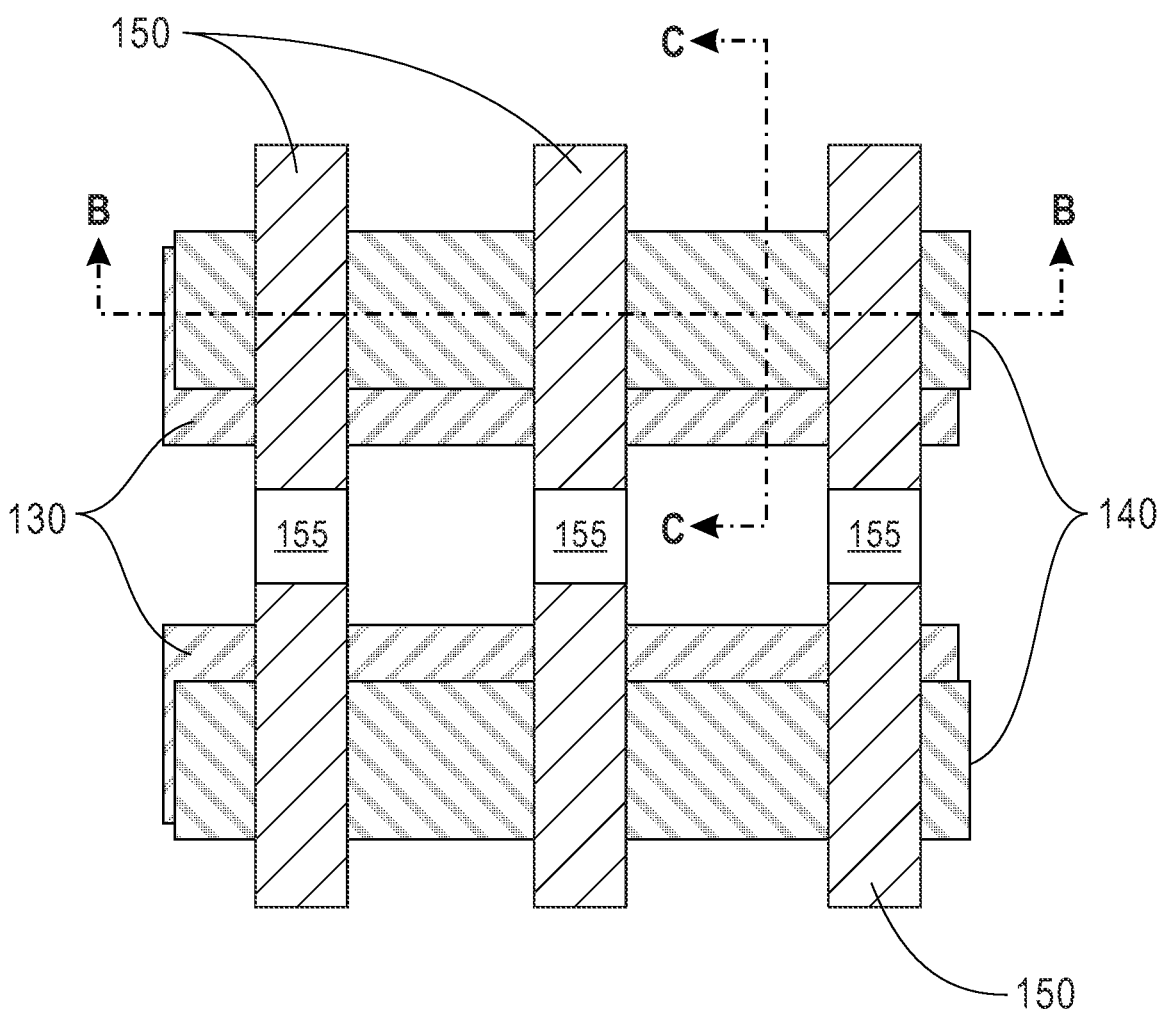
FIG. 1A depicts a top-down view.

Embodiments of the present invention recognize that as fin field-effect transistor (FinFET) and nanosheet devices further scale, to further reduce the footprint of the device at a given footprint, stacked devices may become an attractive option. A stacked device is formed by stacking one field-effect transistor (FET) over another FET, greatly reducing the footprint of the device and increasing transistor density. Embodiments of the present invention recognize that scaling benefits may be achieved from utilizing stacked FETs and improving source/drain contacts. Embodiments of the present invention recognize that contact formation for a stacked FET device can be challenging, especially for the bottom device because the wiring path to back end of line (BEOL) interconnect can be blocked or partially blocked by the top device. Embodiments of the present invention recognize the need to relieve middle of line (MOL) congestion due to cell height scaling.

Embodiments of the present invention describe an approach for fabricating a semiconductor device, the approach including forming a buried via-to-backside power rail (VBPR) contact through the bottom source/drain region to the backside of the wafer. Embodiments of the present invention further describe recessing the VBPR contact such that the VBPR contact is buried underneath and is not shorting the top source/drain region. Embodiments of the present invention further describe forming a dielectric cap over the recessed VBPR contact. Embodiments of the present invention further describe forming a top source/drain contact. Embodiments of the present invention further describe forming a backside interconnect to the VBPR contact.

Embodiments of the present invention describe a resulting semiconductor structure that includes at least a top FET over a bottom FET where a bottom source/drain contact etches through the bottom source/drain region and wires to interconnect at the backside of the wafer. Embodiments of the present invention further describe that at least a top source/drain contact connects the top source/drain region to a BEOL interconnect. Embodiments of the present invention further describe that a bottom source/drain contact cap separates the bottom source/drain contact from the top source/drain contact and the top source/drain region. In some embodiments, the bottom source/drain contact at least partially overlaps in footprint with both the bottom and top active regions. In some embodiments, the top source/drain contact at least partially overlaps in footprint with both bottom and top active regions. In some embodiments, the bottom source/drain contact exhibits a crossbar shape. In some embodiments, a bottom dielectric exists under the bottom source/drain region and the horizontal portion of the crossbar shape of the bottom source/drain contact has a thickness equal to the bottom dielectric.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Each reference number may refer to an item individually or collectively as a group. For example, bottom source/drain region 130 may refer to a single bottom source drain region 130 or multiple bottom source/drain regions 130.

FIGS. 1A, 2A, 3A, 4A, 5A, 6A, 7A, 8A, 9A, 10A, 11A, 12A, 13A, 14A, 15A, 16A, 17A, 18A, 19A, 20A, 21A, 22A, and 23A are simplified depictions of the device and are provided primarily to establish a frame of reference for the presence of the cross-sectional views of the other Figures. Accordingly, many objects and features that are present in the cross-sectional views are not depicted in FIGS. 1A, 2A, 3A, 4A, 5A, 6A, 7A, 8A, 9A, 10A, 11A, 12A, 13A, 14A, 15A, 16A, 17A, 18A, 19A, 20A, 21A, 22A, and 23A. Further, FIGS. 1A, 2A, 3A, 4A, 5A, 6A, 7A, 8A, 9A, 10A, 11A, 12A, 13A, 14A, 15A, 16A, 17A, 18A, 19A, 20A, 21A, 22A, and 23A are all top-view, and are not adjusted in steps where the device is described as having been flipped.

The present invention will now be described in detail with reference to the Figures.

Figures 1B, 1C:
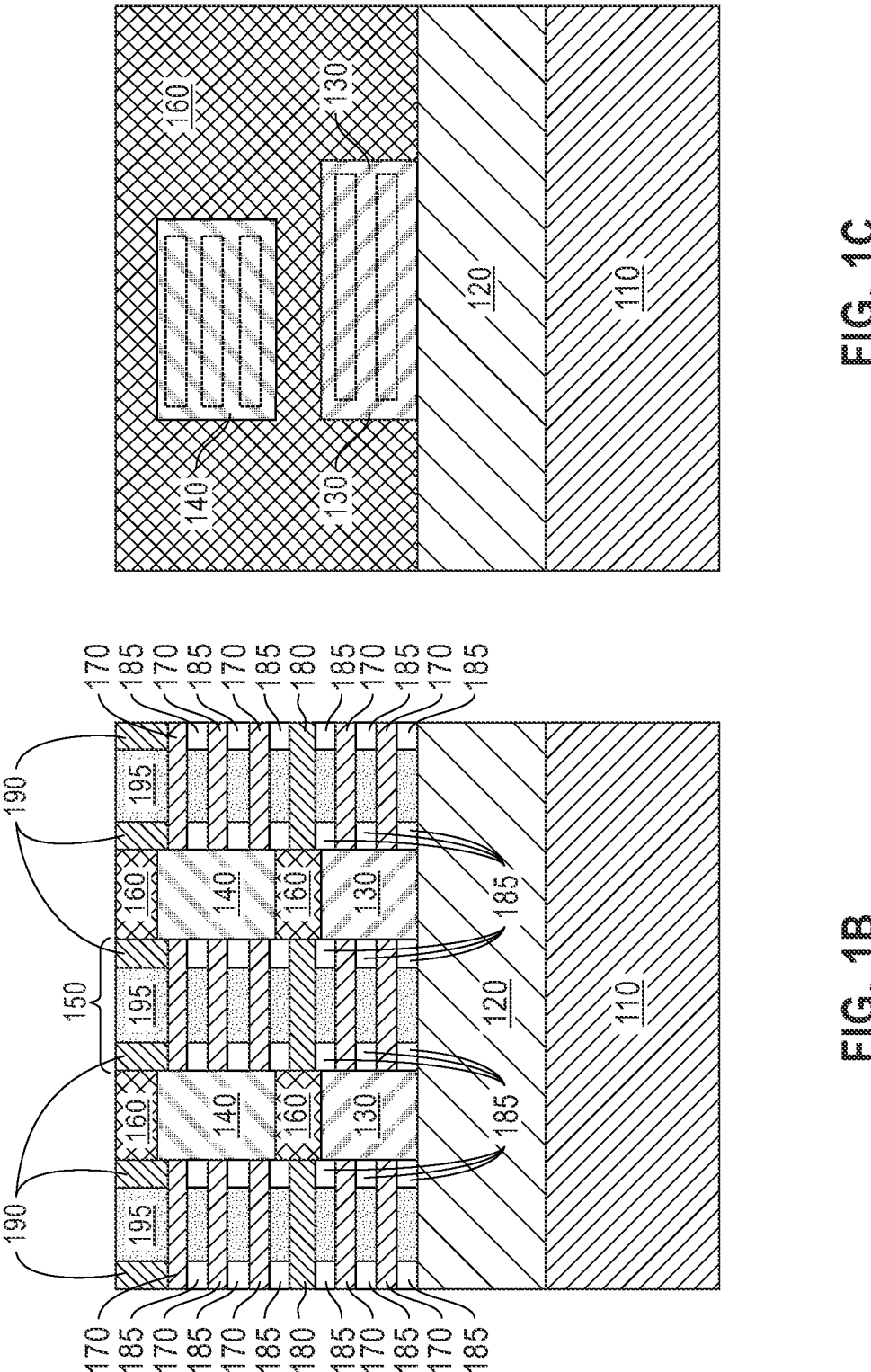
FIG. 1B depicts a cross-sectional view, along section line B of FIG. 1A.
FIG. 1C depicts a cross-sectional view, along section line C of FIG. 1A, of a device at an early stage in the method of forming the device, the device including a stacked field-effect transistor (FET) front end of line (FEOL) formation upon which embodiments of the present invention can be fabricated, in accordance with an embodiment of the invention.

FIG. 1A depicts a top-down view of a device at an early stage in the method of forming the device, FIG. 1B depicts a cross-sectional view along section line B of FIG. 1A and FIG. 1C depicts a cross-sectional view along section line C of FIG. 1A, in accordance with an embodiment of the present invention. More particularly, FIGS. 1A-1C depict a stacked FET front end of line (FEOL) formation.

The semiconductor structure of FIGS. 1A-1C includes a semiconductor substrate upon which embodiments of the invention can be fabricated. FIG. 1A generally shows the location of the gates 150, gate cuts 155, bottom active device area (RX) 130 and top RX 140 of each stacked field-effect transistor (FET) structure.

Semiconductor substrate 110 may be composed of a silicon containing material. Silicon containing materials include, but are not limited to, silicon, single crystal silicon, polycrystalline silicon, SiGe, single crystal SiGe, polycrystalline SiGe, or silicon doped with carbon (C), amorphous silicon, and combinations and multi-layers thereof. Semiconductor substrate 110 can also be composed of other semiconductor materials, such as germanium (Ge), and compound semiconductor substrates, such as type III/V semiconductor substrates, e.g., gallium arsenide (GaAs). In general, semiconductor substrate 110 is a smooth surface substrate. In some embodiments (not shown), semiconductor substrate 110 can be a partially processed complementary metal-oxide semiconductor (CMOS) integrated wafer with transistors and wiring levels or gate electrodes embedded beneath the surface.

Buried oxide layer (BOX) 120 is present above semiconductor substrate 110. Buried oxide layer 120 acts as an electrical insulator. The depicted embodiment includes an illustration of silicon on insulator (SOI) construction, but it should be appreciated by one skilled in the art that embodiments of the invention are not limited to SOI construction.

Stacked FETs are depicted in FIG. 1 and may generally be formed as described herein.

In the depicted embodiment, a semiconductor material stack (sacrificial semiconductor material layer, semiconductor channel material layer 170) is formed upon BOX 120. The semiconductor material stack includes vertically aligned alternating layers of sacrificial semiconductor material layer and semiconductor channel material layer 170. The semiconductor material stack is sequentially formed upon BOX 120. As mentioned above, the semiconductor material stack includes sacrificial semiconductor material layers and semiconductor channel material layers 170, which alternate one atop the other. In FIG. 1, and only by way of one example, the semiconductor material stack includes six layers of sacrificial semiconductor material layer and five layers of semiconductor channel material layer 170 (two layers are for bottom FET and three layers are for top FET). In some embodiments, an additional middle sacrificial layer can be formed between the top and bottom FET, which will later be removed and replaced with a dielectric layer 180, also called middle dielectric isolation (MDI). The semiconductor material stacks that can be employed in embodiments of the present invention are not limited to the specific embodiment illustrated in FIGS. 1A-1C. Instead, the semiconductor material stack can include any number of sacrificial semiconductor material layers and semiconductor channel material layers 170. The semiconductor material stack is used to provide a gate-all-around device that includes vertically stacked semiconductor channel material nanosheets for a p-channel field-effect transistor (pFET) or n-channel field-effect transistor (nFET) device. It should be noted that while the depicted embodiment uses a nanosheet device for the bottom device, the bottom device can be any kind of non-vertical or horizontal device, such as, for example, fin field-effect transistor (FinFET), planar FET, nanowire, or extremely-thin silicon-on-insulator (ETSOI).

Each sacrificial semiconductor material layer is composed of a first semiconductor material which differs in composition from at least an upper portion of BOX 120. In one embodiment, each sacrificial semiconductor material layer is composed of silicon germanium. In such an embodiment, the silicon germanium alloy content of the sacrificial semiconductor material layer may have a germanium content that is less than fifty atomic percent germanium. In one example, the SiGe alloy that makes up the sacrificial semiconductor material layer has a germanium content from twenty atomic percent germanium to forty atomic percent germanium. The first semiconductor material, for each sacrificial semiconductor material layer, can be formed utilizing an epitaxial growth or deposition process.

Each semiconductor channel material layer 170 is composed of a second semiconductor material that has a different etch rate than the first semiconductor material of the sacrificial semiconductor material layers. The second semiconductor material of each semiconductor channel material layer 170 may be the same as, or different than, the semiconductor material of, at least, the upper portion of semiconductor substrate 110. The second semiconductor material can be, for example, silicon. The second semiconductor material can be a SiGe alloy having a germanium content of twenty to fifty atomic percent germanium and the first semiconductor material is different than the second semiconductor material.

In one example, at least the upper portion of semiconductor substrate 110 and each semiconductor channel material layer 170 is composed of Si or a III-V compound semiconductor, while each sacrificial semiconductor material layer is composed of a SiGe alloy. The second semiconductor material, for each semiconductor channel material layer 170, can be formed utilizing an epitaxial growth or deposition process. The middle sacrificial layer (not shown) can be a different epitaxial growth layer, which is different than sacrificial semiconductor layer or semiconductor channel layer 170 (e.g, SiGe with a higher Ge %, such as, for example, greater than 55%).

Semiconductor material stack (sacrificial semiconductor material layer, semiconductor channel material layer 170) can be formed by sequential epitaxial growth of alternating layers of the first semiconductor material and the second semiconductor material. Following epitaxial growth of the topmost layer of the semiconductor material stack (sacrificial semiconductor material layer, semiconductor channel material layer 170) a patterning process may be used to provide the semiconductor material stack (sacrificial semiconductor material layer, semiconductor channel material layer 170). Patterning may be achieved by lithography and etching as is well known to those skilled in the art.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface.

Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers 170, respectively, can be performed utilizing any well-known precursor gas or gas mixture. Carrier gases like hydrogen, nitrogen, helium and argon can be used.

The sacrificial semiconductor material layers that constitutes the semiconductor material stack may have a thickness from five nm to twelve nm, while the semiconductor channel material layers 170 that constitute the semiconductor material stack may have a thickness from six nm to twelve nm. Each sacrificial semiconductor material layer may have a thickness that is the same as, or different from, a thickness of each semiconductor channel material layer 170. In an embodiment, each sacrificial semiconductor material layer has an identical thickness. In an embodiment, each semiconductor channel material layer 170 has an identical thickness.

A sacrificial gate structure and dielectric spacer material layer may be formed. Each sacrificial gate structure is located on a first side and a second side of the semiconductor material stack (sacrificial semiconductor material layer, semiconductor channel material layer 170) and spans across a topmost surface of a portion of the semiconductor material stack (sacrificial semiconductor material layer, semiconductor channel material layer 170). Each sacrificial gate structure thus straddles over a portion of the semiconductor material stack (sacrificial semiconductor material layer, semiconductor channel material layer 170). The dielectric spacer material layer is present on sidewalls of each sacrificial gate structure; the dielectric spacer material layer thus also straddles over the semiconductor material stack (sacrificial semiconductor material layer, semiconductor channel material layer 170).

Each sacrificial gate structure may include a single sacrificial material portion or a stack of two or more sacrificial material portions (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high-κ material having a dielectric constant greater than silicon dioxide. In some embodiments, a multilayered dielectric structure comprising different dielectric materials, e.g., silicon dioxide, and a high-κ dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hardmask material such as, for example, silicon dioxide and/or silicon nitride. The sacrificial gate cap material can be formed by any suitable deposition process such as, for example, chemical vapor deposition (CVD) or plasma enhanced chemical vapor deposition (PECVD).

After providing the above mentioned sacrificial material stack (or any subset of the sacrificial materials), lithography and etching can be used to pattern the sacrificial material stack (or any subset of the sacrificial materials) and to provide the at least one sacrificial gate structure. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After providing the sacrificial gate structure, the exposed middle sacrificial layer (e.g., high Ge % SiGe layer) is selectively removed respective to semiconductor channel layer 170 and semiconductor sacrificial layers, followed by filling the cavities with middle dielectric isolation 180. After, the dielectric spacer material layer can be formed on exposed surfaces of each sacrificial gate structure. The dielectric spacer material layer can be formed by first providing a dielectric spacer material and then etching the dielectric spacer material. One example of MDI, and a dielectric spacer material 190 that may be employed in the present application is silicon nitride. In general, the MDI 180 and dielectric spacer material layer 190 comprises any dielectric spacer material, including, for example, a dielectric nitride, dielectric oxide, and/or dielectric oxynitride. More specifically, the dielectric spacer material layer may be, for example, SiBCN, SiBN, SiOCN, SiON, SiCO, or SiC. In one example, the dielectric spacer material is composed of a dielectric material such as $SiO_2$.

The dielectric spacer material that provides the dielectric spacer material layer may be provided by a deposition process including, for example, ALD, chemical vapor deposition (CVD), plasma enhanced chemical vapor deposition (PECVD), or physical vapor deposition (PVD). The etch used to provide the dielectric spacer material layer may comprise a dry etching process such as, for example, reactive ion etching.

Recesses may be formed within the semiconductor material stack, creating the formation of nanosheet stacks of alternating nanosheets of sacrificial semiconductor material layers and semiconductor channel material layers 170 that are under at least one sacrificial gate structure and dielectric spacer material layer.

The nanosheet stack is formed by removing physically exposed portions of the semiconductor material stack (sacrificial semiconductor material layer, semiconductor channel material layer 170) that are not protected by the least one sacrificial gate structure and the dielectric spacer material layer. In general, each recess may include the eventual location of bottom source/drain region 130, for the semiconductor device.

The removing of the portions of the semiconductor material stack (sacrificial semiconductor material layer, semiconductor channel material layer 170) not covered by the least one sacrificial gate structure and the dielectric spacer material layer can be performed utilizing an anisotropic etching process such as, for example, reactive ion etching (RIE). Portions of the semiconductor material stack (sacrificial semiconductor material layer, semiconductor channel material layer 170) remain beneath at least one sacrificial gate structure and the dielectric spacer material layer. The remaining portion of the semiconductor material stack that is present beneath the at least one sacrificial gate structure and the dielectric spacer material layer is referred to as a nanosheet stack.

Each nanosheet stack includes alternating nanosheets of remaining portions of each sacrificial semiconductor material layer and remaining portions of each semiconductor channel material layer 170. The nanosheet stack includes alternating nanosheets of remaining portions of each of sacrificial semiconductor material layer and semiconductor channel material layer 170. Each nanosheet (i.e., sacrificial semiconductor material layer or semiconductor channel material layer 170) that constitutes the nanosheet stack has a thickness as mentioned above for the individual sacrificial semiconductor material layers and semiconductor channel material layers 170, and a width from 30 nm to 200 nm. In some embodiments, the sidewalls of each sacrificial semiconductor material layer are vertically aligned to sidewalls of each semiconductor channel material layer 170, and the vertically aligned sidewalls of the nanosheet stack are vertically aligned to an outmost sidewall of dielectric spacer material layer.

The sacrificial semiconductor material layer is recessed and inner spacer 185 is formed. Each recessed sacrificial semiconductor material layer has a width that is less than the original width of each sacrificial semiconductor material layer. The recessing of each sacrificial semiconductor material layer provides a gap between each neighboring pair of semiconductor channel material layer 170 within a given nanosheet stack. The recessing of each sacrificial semiconductor material layer may be performed utilizing a lateral etching process that is selective in removing physically exposed end portions of each sacrificial semiconductor material layer relative to each semiconductor channel material layer 170.

The additional dielectric spacer material that is added can be compositionally the same as the dielectric spacer material layer mentioned above. In one example, the additional dielectric spacer material and the dielectric spacer material layer are both composed of silicon nitride. For clarity, the additional dielectric spacer material and the dielectric spacer material layer can now be referred to as inner spacer 185. The inner spacer 185 is formed by a conformal dielectric liner deposition followed by isotropic etching back the deposited liner.

Bottom source/drain region 130 is formed by epitaxial growth of a semiconductor material on physically exposed sidewalls of each semiconductor channel material layer 170 below MDI 180 (a projective liner (not shown) can be formed over top channels 170 above BDI during bottom S/D epi growth). The bottom source/drain region 130 has a bottommost surface that directly contacts a topmost surface of BOX 120.

Each bottom source/drain region 130 includes a semiconductor material and a dopant. The semiconductor material that provides each bottom source/drain region 130 can be selected from one of the semiconductor materials mentioned above for the semiconductor substrate 110. In some embodiments, the semiconductor material that provides each bottom source/drain region 130 may comprise a same semiconductor material as that which provides semiconductor channel material layer 170. In other embodiments, the semiconductor material that provides each bottom source/ drain region 130 may comprise a different semiconductor material than that which provides semiconductor channel material layer 170. For example, the semiconductor material that provides each bottom source/drain region 130 may comprise a silicon germanium alloy, while semiconductor channel material layer 170 may comprise silicon.

The dopant that is present in each bottom source/drain region 130 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in each bottom source/drain region 130 can be introduced into the precursor gas that provides each bottom source/drain region 130. In another embodiment, the dopant can be introduced into an intrinsic semiconductor layer by utilizing one of ion implantation or gas phase doping. In one example, each bottom source/drain region 130 comprises a silicon germanium alloy that is doped with a p-type dopant such as, for example, boron. As mentioned above, each bottom source/drain region 130 is formed by an epitaxial growth (or deposition) process, as is defined above.

ILD material 160 is formed above each bottom source/ drain region 130. ILD material 160 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 160. The use of a self-planarizing dielectric material as ILD material 160 may avoid the need to perform a subsequent planarizing step.

In one embodiment, ILD material 160 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 160, a planarization process or an etch back process follows the deposition of the dielectric material that provides ILD material 160, such that top channel layers 170 is revealed and bottom S/D epi 130 are covered by ILD.

Then, the top source/drain region 140 is formed by epitaxial growth of a semiconductor material on physically exposed sidewalls of each semiconductor channel material layer 170 of the top FET above MDI 180. In the depicted embodiment, the semiconductor material that provides the top source/drain region 140 grows laterally out from the sidewalls of each semiconductor channel material layer 170 of the top FET. The top source/drain region 140 has a bottommost surface that directly contacts a topmost surface of the ILD material 160 that is present atop the bottom source/drain region 130.

Each top source/drain region 140 includes a semiconductor material and a dopant. The semiconductor material that provides each top source/drain region 140 can be selected from one of the semiconductor materials mentioned above for the semiconductor substrate 110. In some embodiments, the semiconductor material that provides each top source/ drain region 140 may comprise a same semiconductor material as that which provides semiconductor channel material layer 170. In other embodiments, the semiconductor material that provides each top source/drain region 140 may comprise a different semiconductor material than that which provides semiconductor channel material layer 170. For example, the semiconductor material that provides each top source/drain region 140 may comprise a silicon germanium alloy, while semiconductor channel material layer 170 may comprise silicon.

The dopant that is present in each top source/drain region 140 can be either a p-type dopant or an n-type dopant. In one embodiment, the dopant that can be present in each top source/drain region 140 can be introduced into the precursor gas that provides each top source/drain region 140. In another embodiment, the dopant can be introduced into an intrinsic semiconductor layer by utilizing one of ion implantation or gas phase doping. In one example, each top source/drain region 140 comprises a silicon germanium alloy that is doped with a p-type dopant such as, for example, boron. As mentioned above, each top source/drain region 140 is formed by an epitaxial growth (or deposition) process, as is defined above.

Additional ILD material 160 is formed above each top source/drain region 140. ILD material 160 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 160. The use of a self-planarizing dielectric material as ILD material 160 may avoid the need to perform a subsequent planarizing step.

In one embodiment, ILD material 160 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 160, a planarization process or an etch back process follows the deposition of the dielectric material that provides ILD material 160. As is shown in FIGS. 1B-1C, ILD material 160 that is present atop each top source/drain region 140 has a topmost surface that is coplanar to a topmost surface of gate sidewall spacer 190.

Each sacrificial gate structure is removed to provide a gate cavity for both the top and bottom FETs.

Next, each semiconductor channel material nanosheet (i.e., semiconductor channel material layer 170) of both the top and bottoms FETs is suspended by selectively etching each recessed sacrificial semiconductor material nanosheet relative to each semiconductor channel material nanosheet (i.e., semiconductor channel material layer 170).

Functional gate structures are formed in each gate cavity. For the bottom FET, the functional gate structure surrounds a physically exposed surface of each semiconductor channel material nanosheet (i.e., semiconductor channel material layer 170). For the top FET the functional gate structure surrounds a physically exposed surface of each semiconductor channel material nanosheet (i.e., semiconductor channel material layer 170). By "functional gate structure" it is meant a permanent gate structure used to control output current (i.e., flow of carriers in the channel) of a semiconducting device through electrical or magnetic fields. Collectively, both gate structures are referred to as replacement gate 195 in the Figures.

While not depicted, in some embodiments, a gate dielectric portion may be present that includes a gate dielectric material. Such a gate dielectric portion may be an oxide, nitride, and/or oxynitride. In one example, the gate dielectric portion can be a high-κ material having a dielectric constant greater than silicon dioxide. Example high-κ dielectrics include, but are not limited to, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-κ gate dielectric, can be formed and used as the gate dielectric portion.

The gate dielectric material used in providing a gate dielectric portion can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing a gate dielectric portion can have a thickness in a range from 1 nm to 10 nm. Other thicknesses that are lesser than, or greater than, the aforementioned thickness range can also be employed for the gate dielectric material that may provide a gate dielectric portion.

Replacement gate 195 includes a gate conductor material and a gate dielectric. The gate conductor material used in providing replacement gate 195 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride, TiAlC, TiC, TiAl), an elemental metal silicide (e.g., tungsten silicide, nickel silicide, and titanium silicide), or multilayered combinations thereof. In one embodiment, replacement gate 195 may comprise an nFET gate metal. In another embodiment, replacement gate 195 may comprise a pFET gate metal. When multiple gate cavities are formed, it is possible to form a nFET in a first set of the gate cavities and wrapping around some of the semiconductor channel material nanosheet (i.e., semiconductor channel material layer 170) and a pFET in a second set of the gate cavities and wrapping around some of the semiconductor channel material nanosheet (i.e., semiconductor channel material layer 170).

The gate conductor material used in providing replacement gate 195 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing replacement gate 195 can have a thickness from 5 nm to 200 nm. Other thicknesses that are lesser than, or greater than, the aforementioned thickness range can also be employed for the gate conductor material used in providing replacement gate 195.

A functional gate structure (replacement gate 195) can be formed by providing a functional gate material stack of the gate dielectric material and the gate conductor material. A planarization process may follow the formation of the functional gate material stack.

Gate cuts 155 may be patterned by conventional lithography and etch processes to isolate the gate regions at cell boundaries. Each gate cut 150 is filled with a dielectric material such as, for example, SiN or a combination of SiN and SiO2.

Figure 2A:
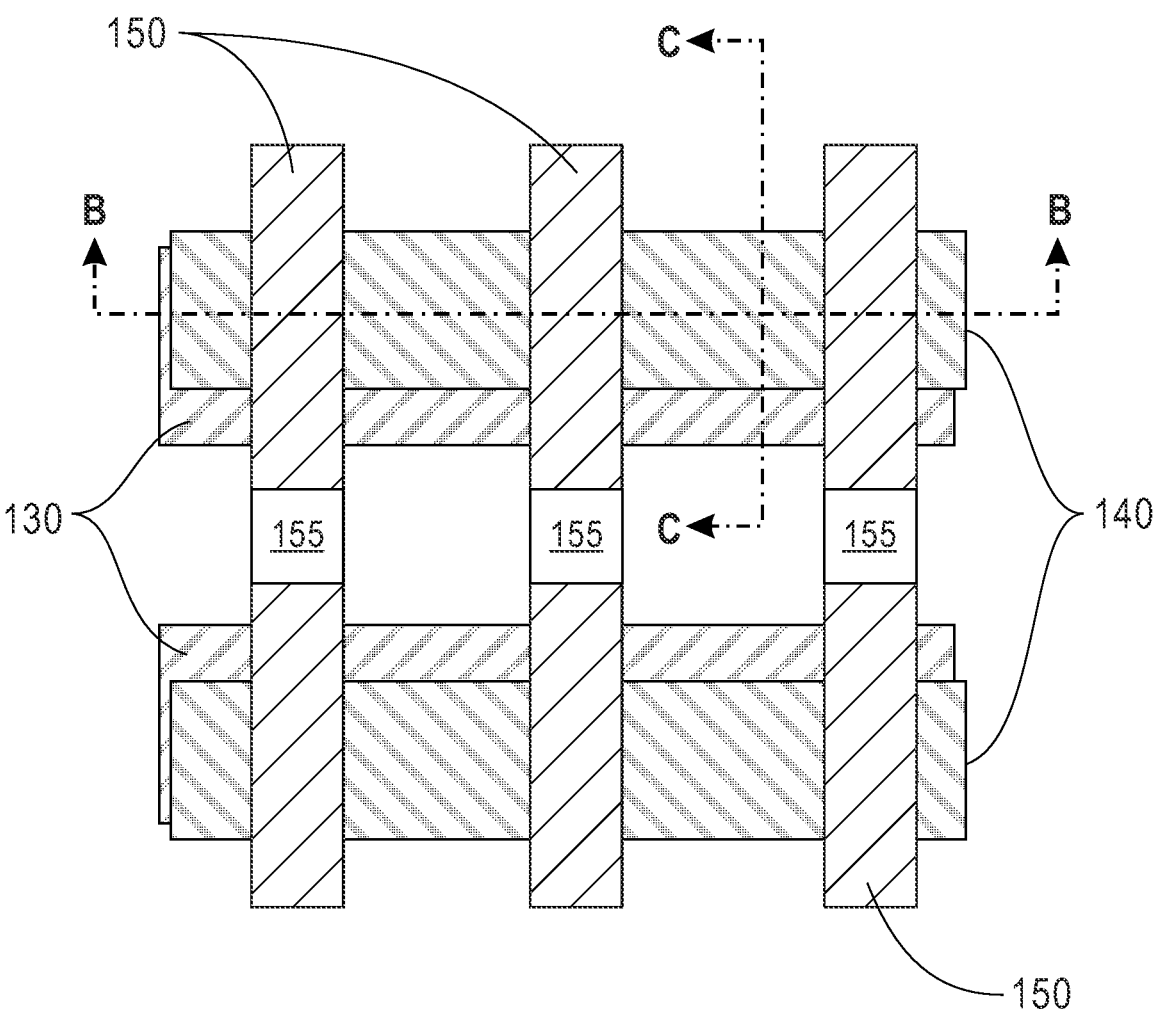
FIG. 2A depicts a top-down view.
Figures 2B, 2C:
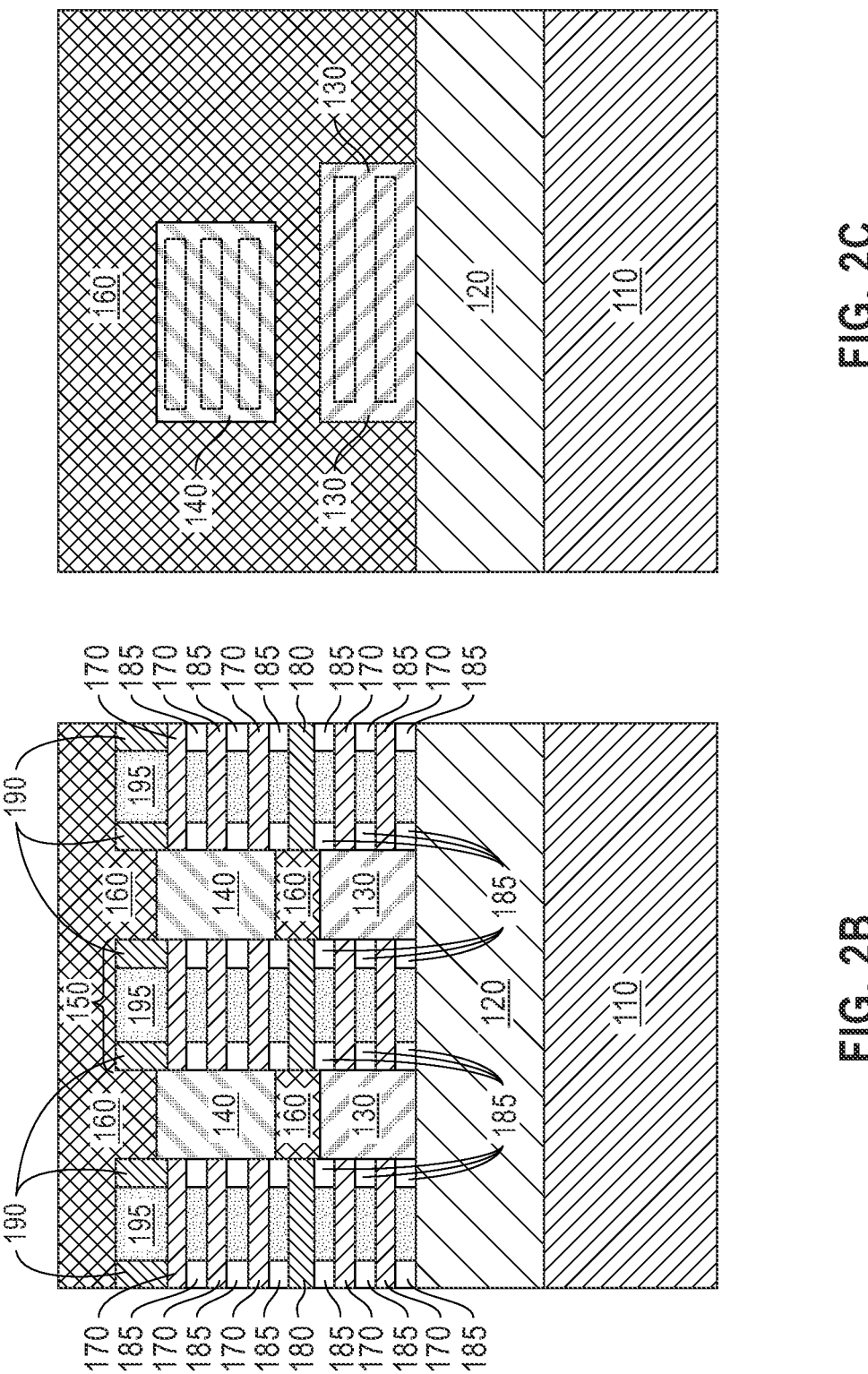
FIG. 2B depicts a cross-sectional view, along section line B of FIG. 2A.
FIG. 2C depicts a cross-sectional view, along section line C of FIG. 2A, of a process of forming middle of line (MOL) interlayer dielectric (ILD) material, in accordance with an embodiment of the invention.

FIG. 2A depicts a top-down view of fabrication steps, in accordance with an embodiment of the present invention. FIG. 2B depicts a cross-sectional view along section line B of FIG. 2A and FIG. 2C depicts a cross-sectional view along section line C of FIG. 7A, in accordance with an embodiment of the present invention. FIGS. 2A-2C depict the formation of MOL additional ILD material 160.

Additional ILD material is formed above each replacement gate 195, gate sidewall spacer 190, and already present ILD material 160. For sake of simplicity, the additional ILD material and the already present ILD material 160 are hereinafter referred to as ILD material 160.

ILD material 160 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 160. The use of a self-planarizing dielectric material as ILD material 160 may avoid the need to perform a subsequent planarizing step.

In one embodiment, ILD material 160 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 160, a planarization process or an etch back process follows the deposition of the dielectric material that provides ILD material 160.

Figure 3A:
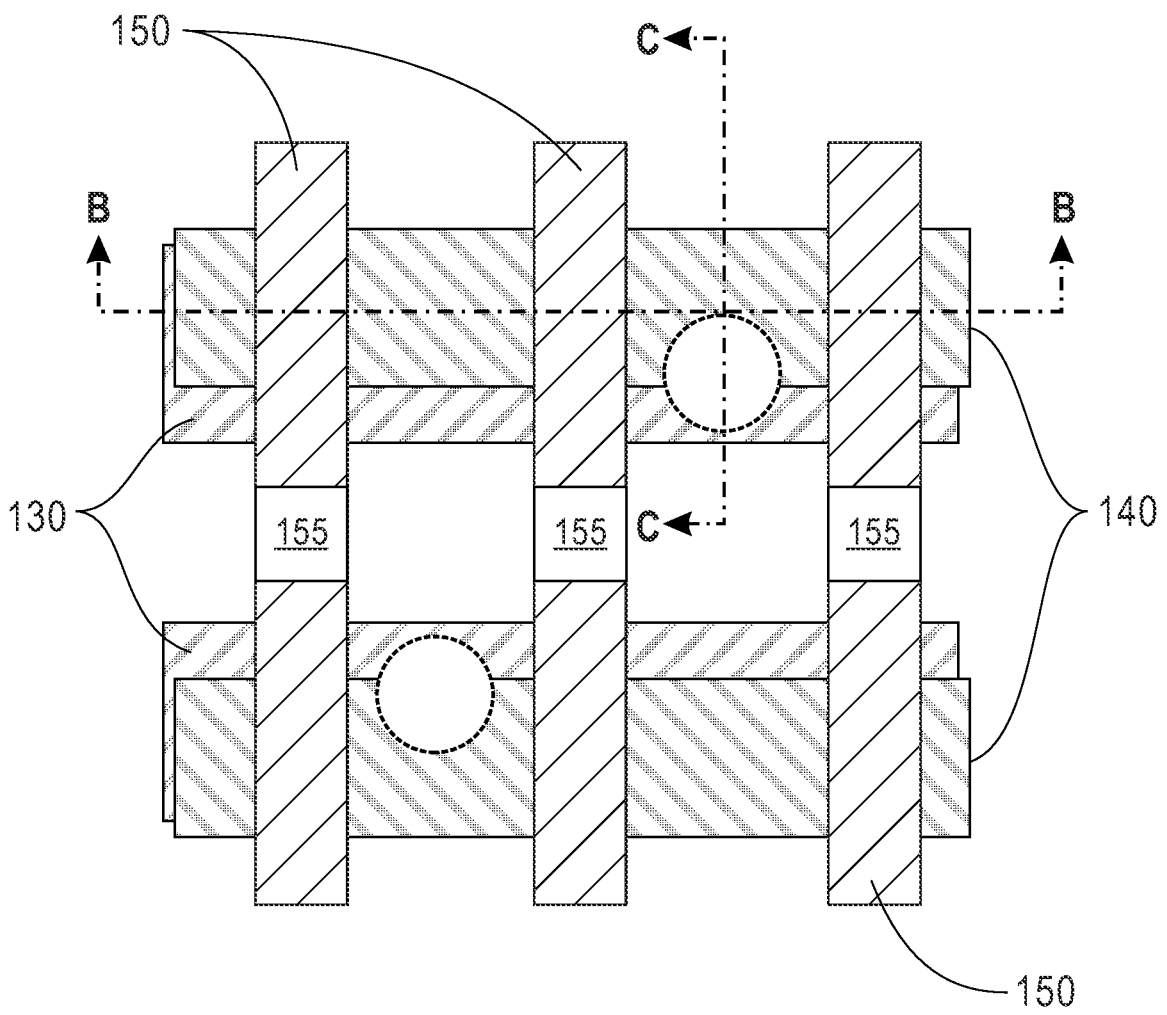
FIG. 3A depicts a top-down view.
Figures 3B, 3C:
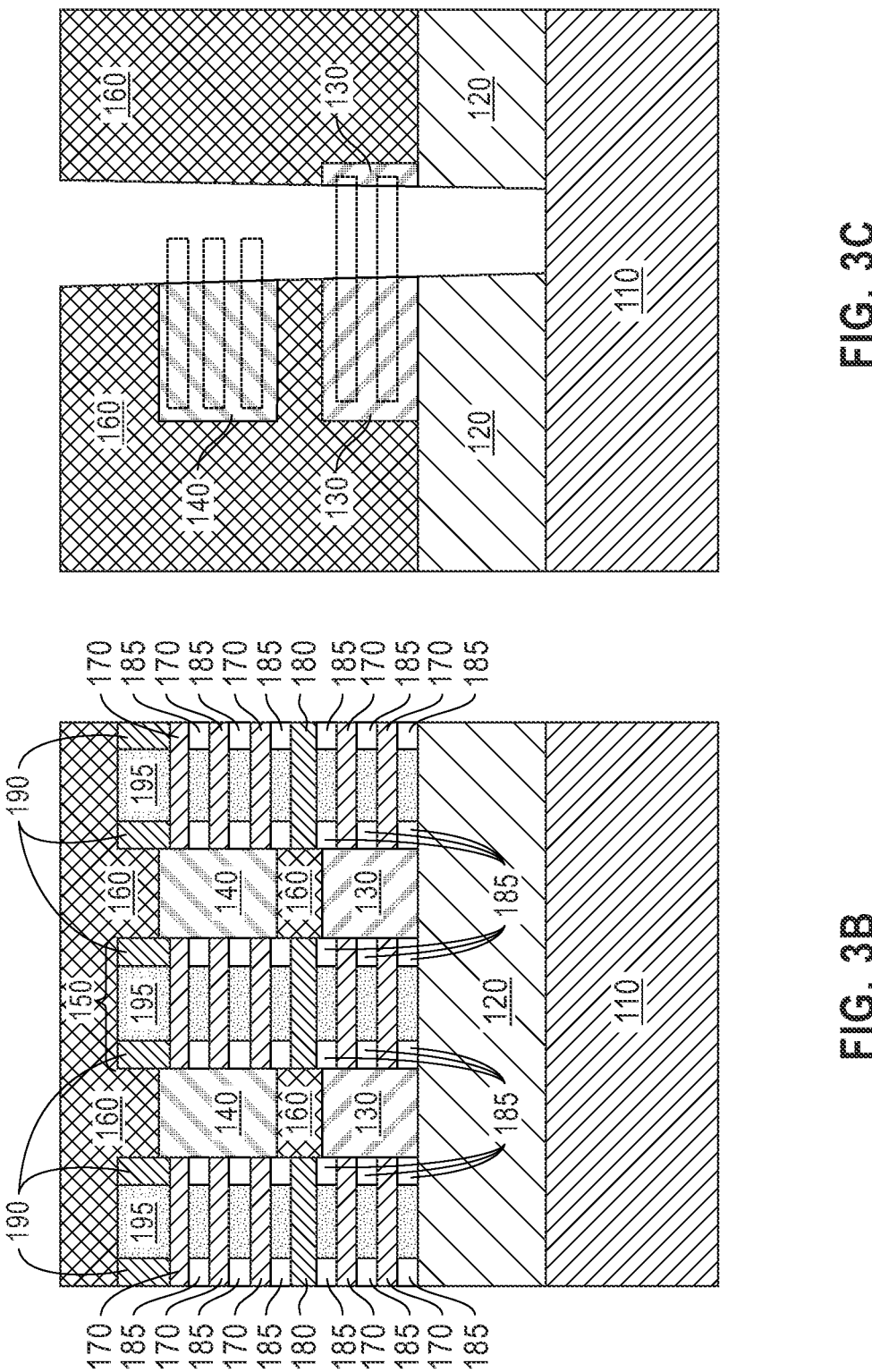
FIG. 3B depicts a cross-sectional view, along section line B of FIG. 3A.
FIG. 3C depicts a cross-sectional view, along section line C of FIG. 3A, of a process for forming reverse body bias voltage (VBPR) contact trenches, in accordance with an embodiment of the present invention.

FIG. 3A depicts a top-down view of fabrication steps, in accordance with an embodiment of the present invention. FIG. 3B depicts a cross-sectional view along section line B of FIG. 3A and FIG. 3C depicts a cross-sectional view along section line C of FIG. 3A, in accordance with an embodiment of the present invention. FIGS. 3A-3C depicts the formation of VBPR contact trenches.

Trenches may be formed by an etching process, such as reactive-ion etching (RIE), laser ablation, or any etch process which can be used to selectively remove a portion of material such as ILD material 160, top source/drain region 140, bottom source/drain region 130, and BOX 120. A hardmask (not shown) may be patterned using photoresist to expose areas where trenches are desired and the hardmask may be utilized during the etching process in the creation of the trenches. The etching process only removes portions of the device not protected by the hardmask and the etching process stops at semiconductor substrate 110.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

Figure 4A:
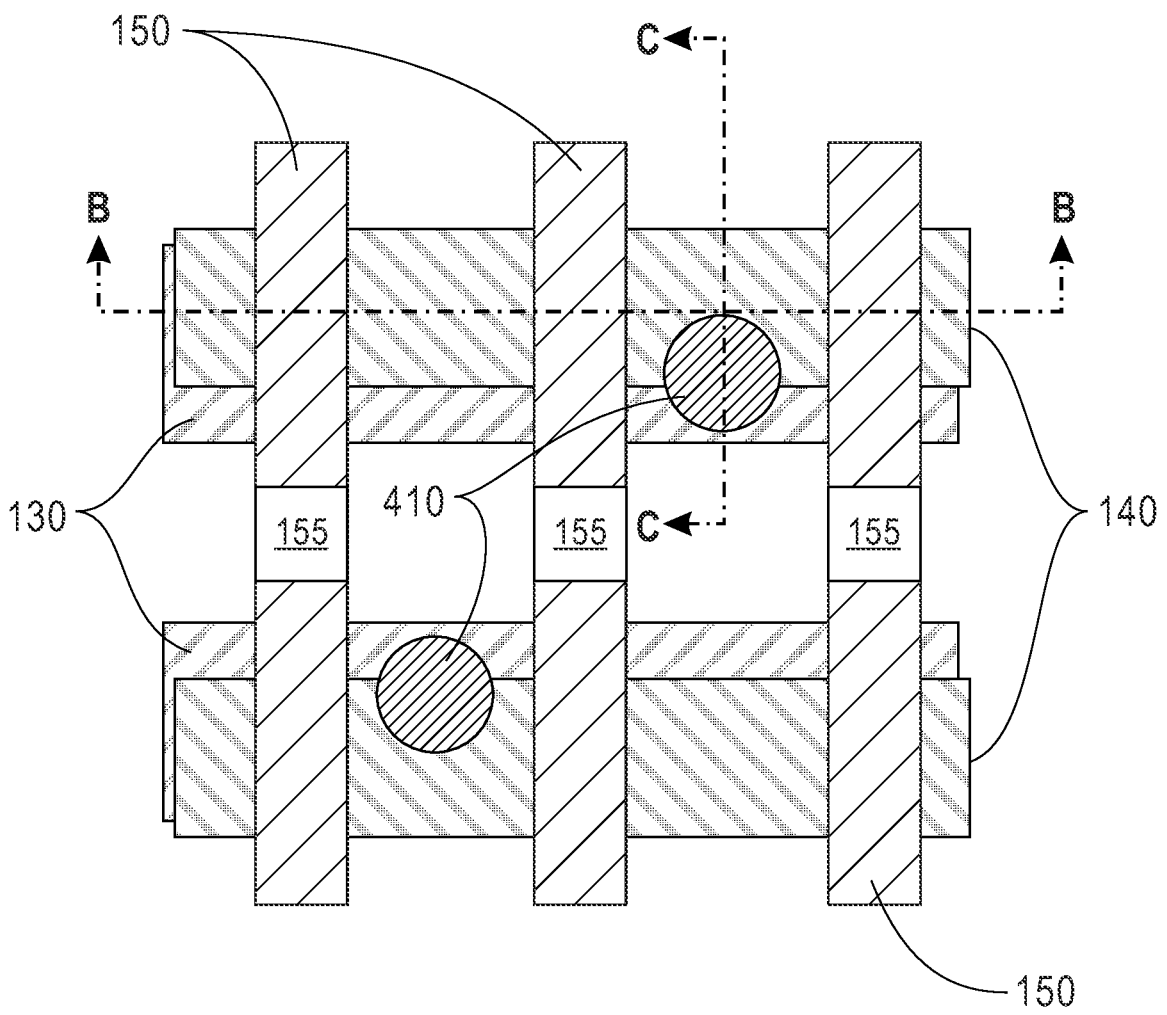
FIG. 4A depicts a top-down view.
Figures 4B, 4C:
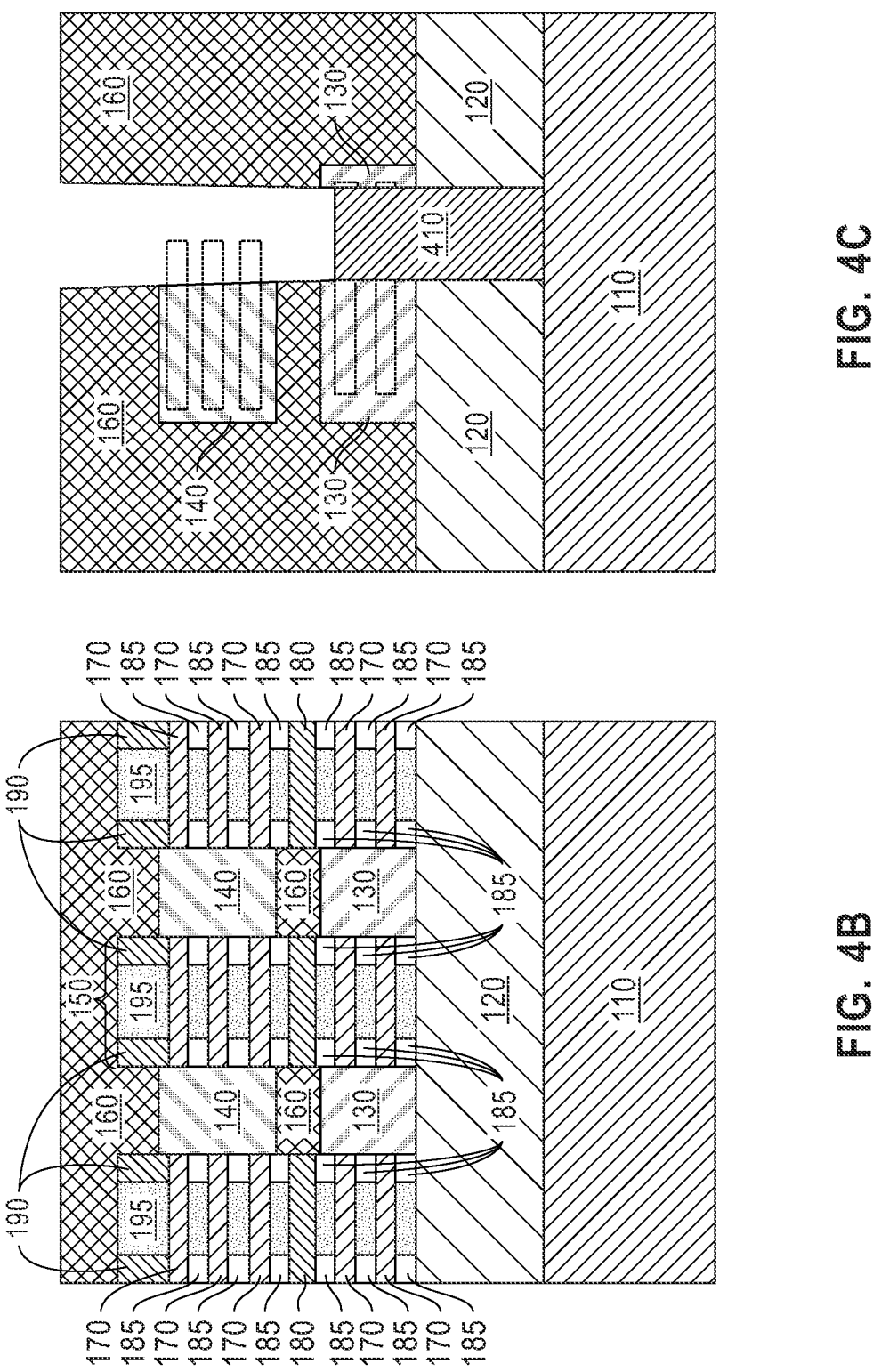
FIG. 4B depicts a cross-sectional view, along section line B of FIG. 4A.
FIG. 4C depicts a cross-sectional view, along section line C of FIG. 4A, of a process of forming recessed VBPR contacts, in accordance with an embodiment of the present invention.

FIG. 4A depicts a top-down view of fabrication steps, in accordance with an embodiment of the present invention. FIG. 4B depicts a cross-sectional view along section line B of FIG. 4A and FIG. 4C depicts a cross-sectional view along section line C of FIG. 4A, in accordance with an embodiment of the present invention. FIGS. 4A-4C depict the formation of recessed VBPR contacts 410 (also referred to as buried VBPR).

In general, VBPR contacts 410 make contact with the bottom source/drain region 130 and pass through BOX 120, making contact with a top surface of semiconductor substrate 110.

VBPR contacts 410 may each be formed by metal deposition. The metal layers comprise a silicide liner, such as, for example, Ti, Ni, or NiPt, followed by adhesion metal liner, such as, for example, TiN, and a conductive metal fill, such as, for example, Co, Ru, W, or Cu.

Each VBPR contact 410 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. CMP and/or patterning and etching processes may be used to remove unwanted portions of VBPR contact 410 to planarize and recess the layer(s) that comprise VBPR contacts 410 such that a top surface of the VBPR contacts 410 makes contact with the bottom source/drain region 130, but does not make contact with the top source/drain region 140.

Figure 5A:
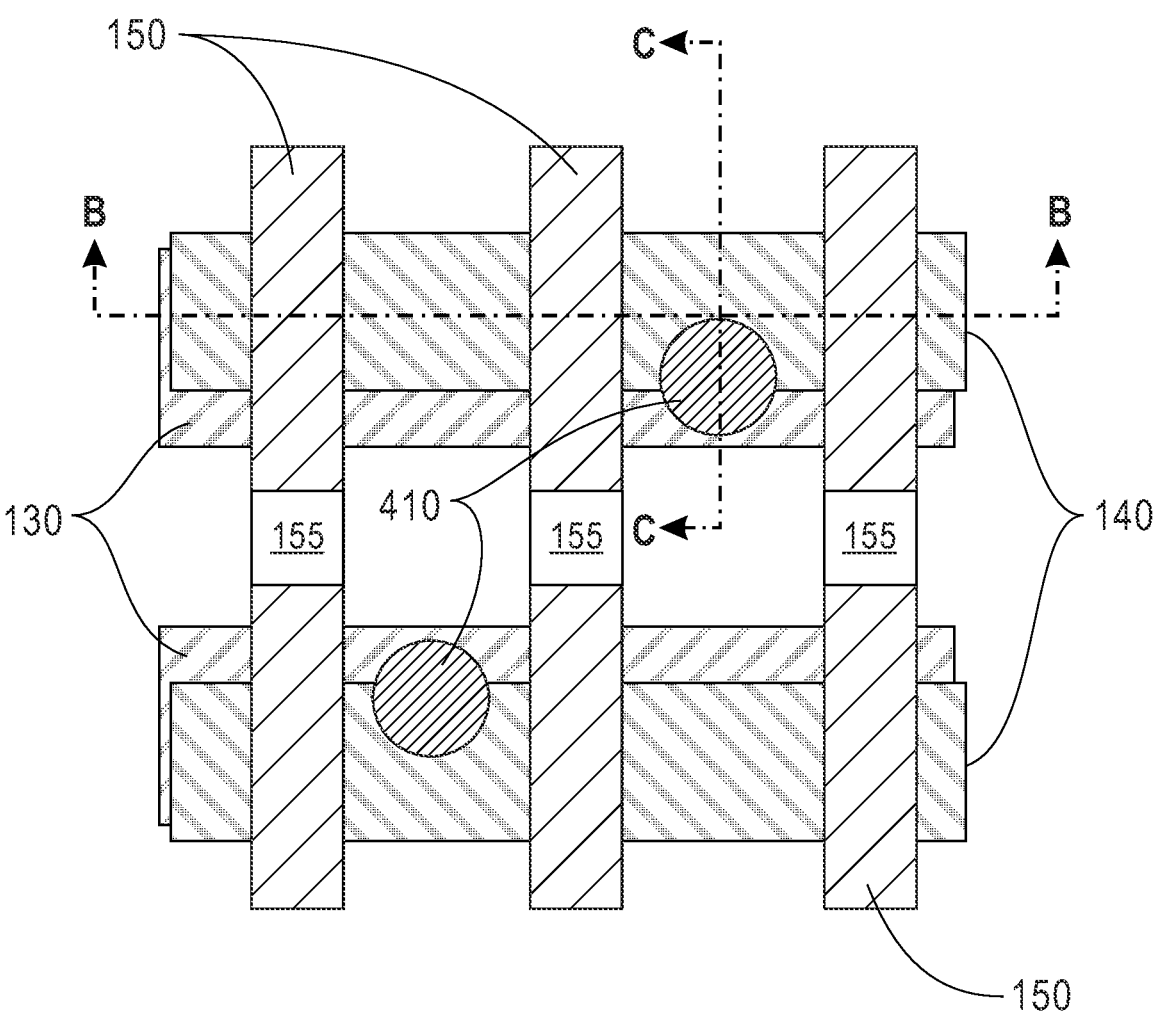
FIG. 5A depicts a top-down view.
Figures 5B, 5C:
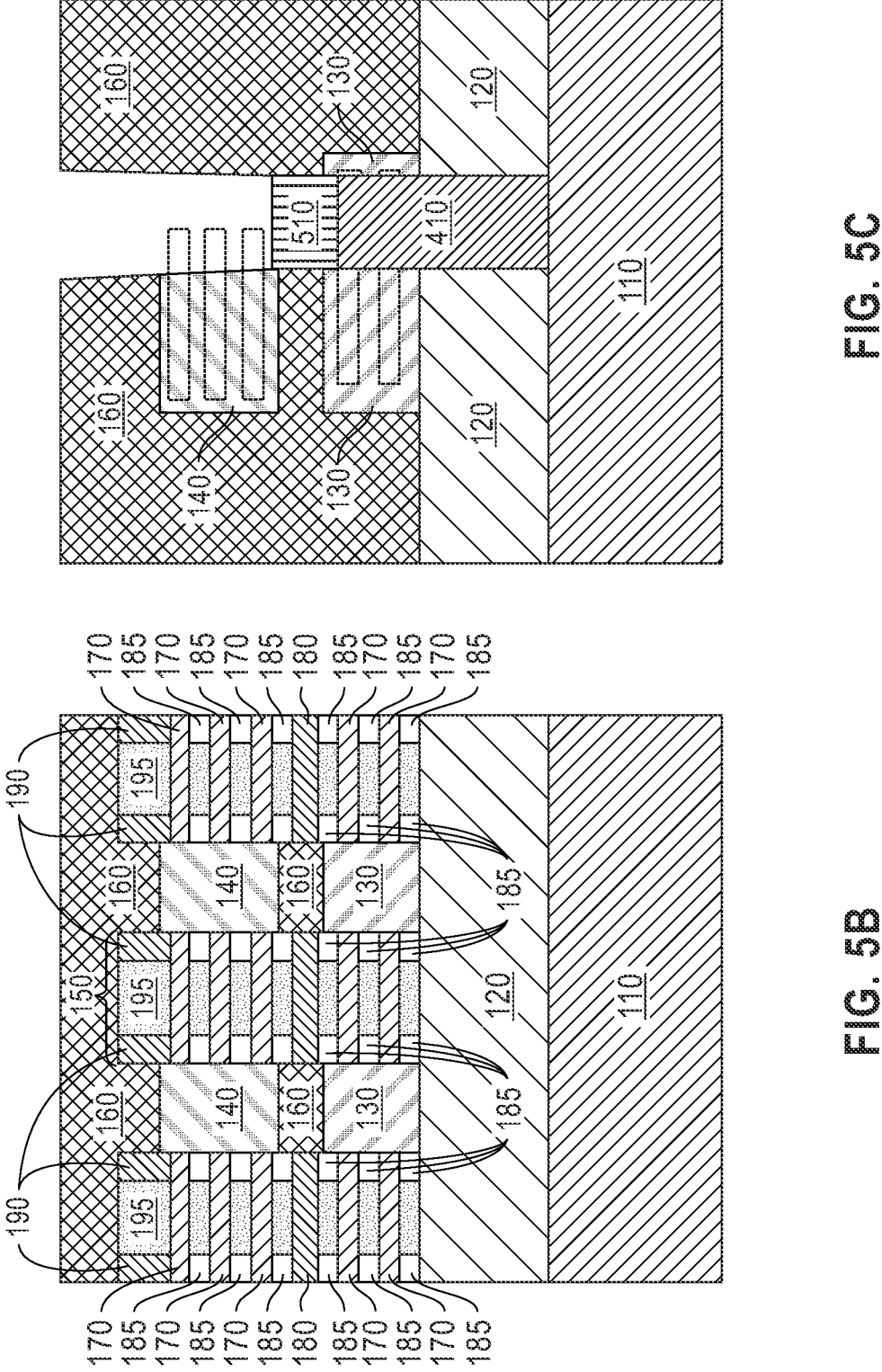
FIG. 5B depicts a cross-sectional view, along section line B of FIG. 5A.
FIG. 5C depicts a cross-sectional view, along section line C of FIG. 5A, of a process of forming a VBPR dielectric cap, in accordance with an embodiment of the present invention.

FIG. 5A depicts a top-down view of fabrication steps, in accordance with an embodiment of the present invention. FIG. 5B depicts a cross-sectional view along section line B of FIG. 5A and FIG. 5C depicts a cross-sectional view along section line C of FIG. 5A, in accordance with an embodiment of the present invention. FIGS. 5A-5C depict the formation of VBPR dielectric cap 510.

VBPR dielectric cap 510 is formed over each VBPR contact 410. VBPR dielectric cap 510 can be any suitable dielectric material such as, for example, SiN, SiCN(H), TEOS, SiOx, or other oxide materials. The dielectric material that provides VBPR dielectric cap 510 may be provided by a deposition process including, for example, ALD, chemical vapor deposition (CVD), plasma enhanced chemical vapor deposition (PECVD), physical vapor deposition (PVD) or other deposition processes. The etch used to provide the recess dielectric material layer may comprise a dry etching process such as, for example, reactive ion etching. In general, VBPR dielectric cap 510 isolates VBPR contacts 410 from upper source/drain region 140.

Figure 6A:
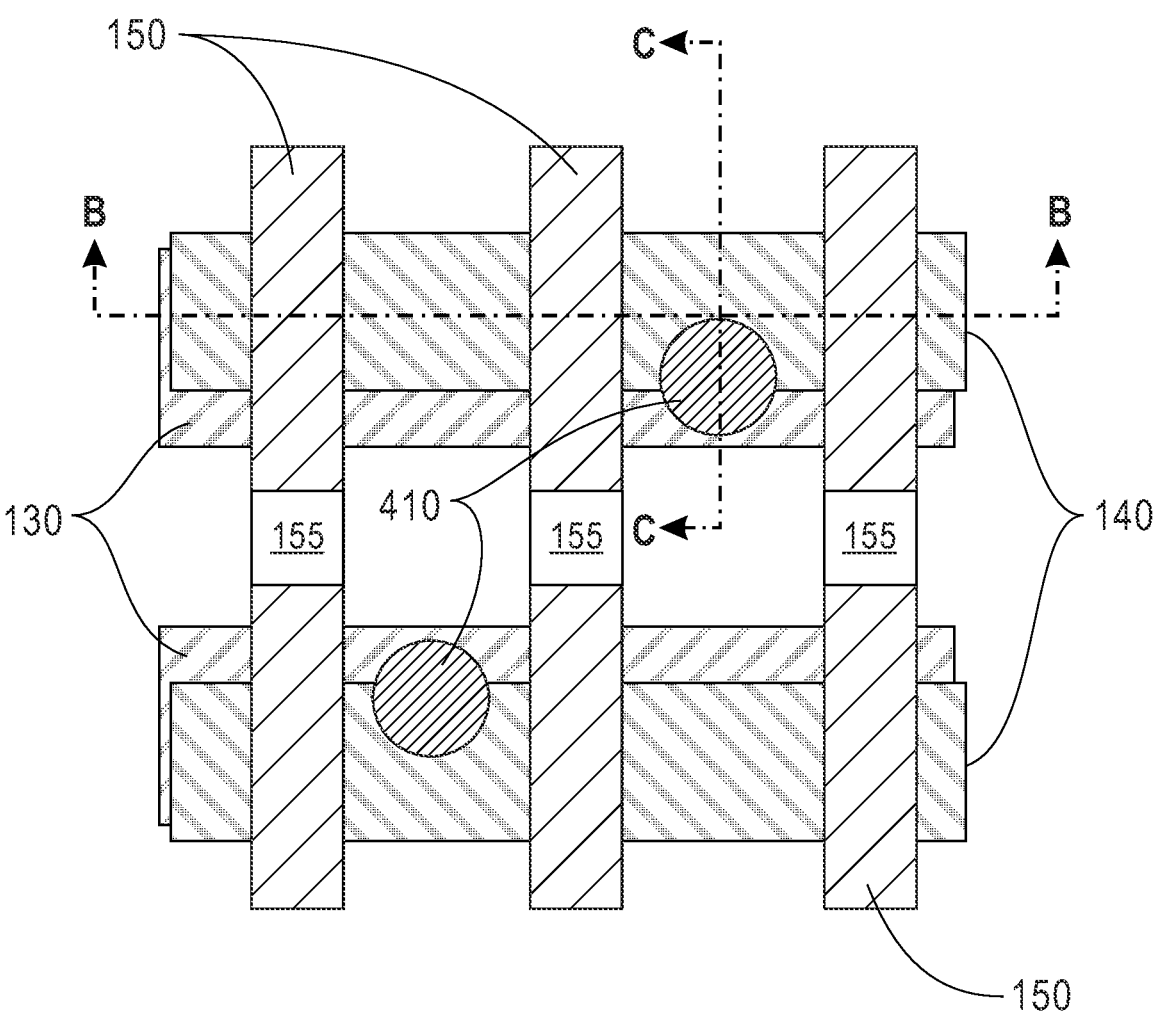
FIG. 6A depicts a top-down view.
Figures 6B, 6C:
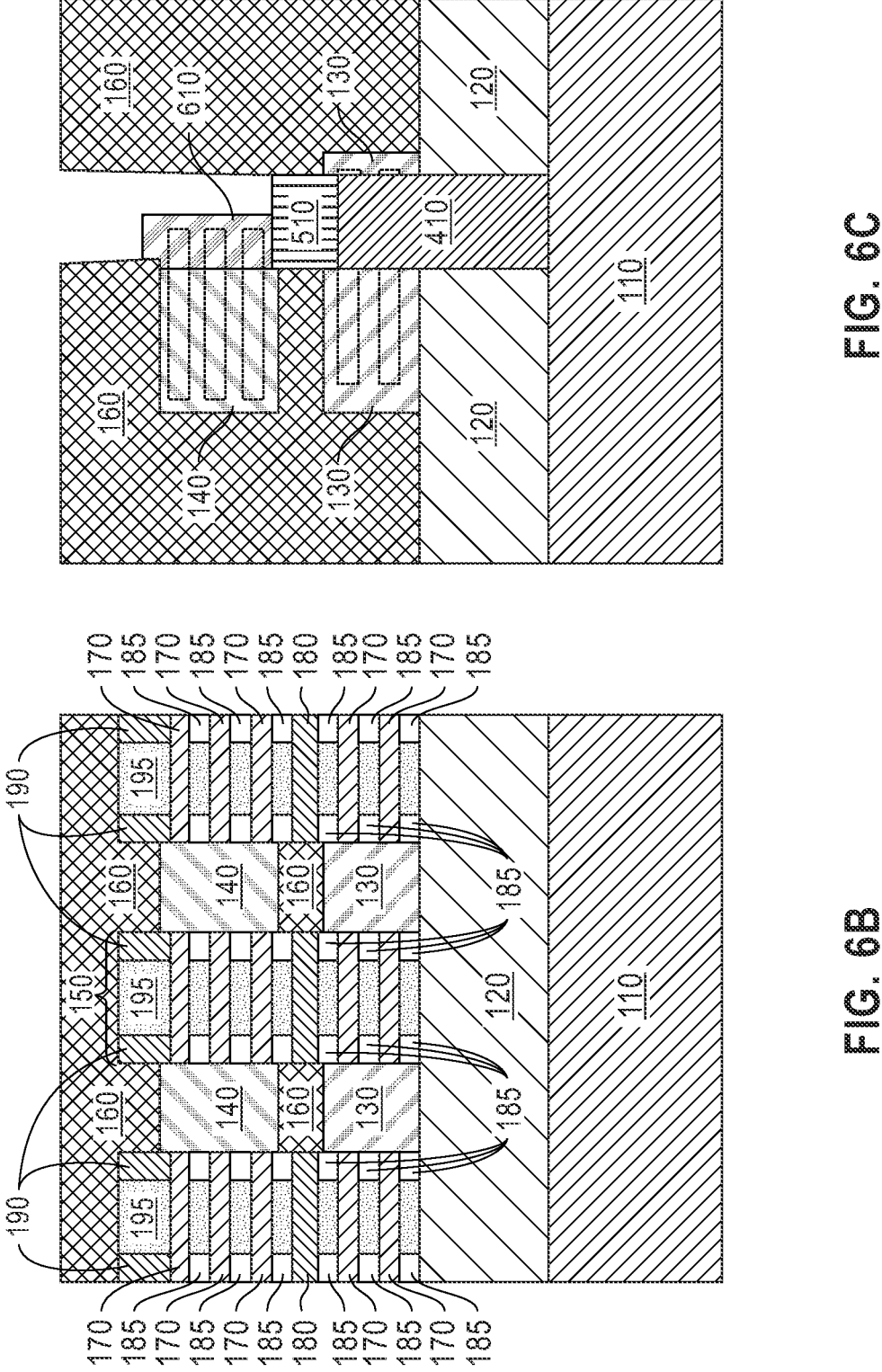
FIG. 6B depicts a cross-sectional view, along section line B of FIG. 6A.
FIG. 6C depicts a cross-sectional view, along section line C of FIG. 6A, of a process of forming additional top source/drain material, in accordance with an embodiment of the present invention.

FIG. 6A depicts a top-down view of fabrication steps, in accordance with an embodiment of the present invention. FIG. 6B depicts a cross-sectional view along section line B of FIG. 6A and FIG. 6C depicts a cross-sectional view along section line C of FIG. 6A, in accordance with an embodiment of the present invention. FIGS. 6A-6C depict the formation of additional top source/drain region material 610, to recover portions of top source/drain region 140 that were lost in the formation of the trench (see FIG. 3).

Top source/drain region material 610 is formed by epitaxial growth of a semiconductor material on physically exposed sidewalls of top source/drain region 140. In the depicted embodiment, the semiconductor material that provides the top source/drain region material 610 grows laterally out from the sidewalls of each top source/drain region 140. The top source/drain region material 610 has a bottommost surface that directly contacts a topmost surface of VBPR dielectric cap 510.

Each top source/drain region material 610 includes a semiconductor material and a dopant. The semiconductor material that provides each top source/drain region material 610 can be selected from the semiconductor material mentioned above for top source/drain region 140. In some embodiments, the semiconductor material that provides each top source/drain region material 610 may comprise a same semiconductor material as that which provides top source/drain region 140.

The dopant that is present in each top source/drain region material 610 can be either a p-type dopant or an n-type dopant. The type of dopant will be selected based on the type of dopant used in the formation of top source/drain region 140. In one embodiment, the dopant that can be present in the each top source/drain region material 610 can be introduced into the precursor gas that provides each top source/drain region material 610. In another embodiment, the dopant can be introduced into an intrinsic semiconductor layer by utilizing one of ion implantation or gas phase doping. In one example, each top source/drain region material 610 comprises a silicon germanium alloy that is doped with a p-type dopant such as, for example, boron. As mentioned above, each top source/drain region material 610 is formed by an epitaxial growth (or deposition) process, as is defined above.

Figure 7A:
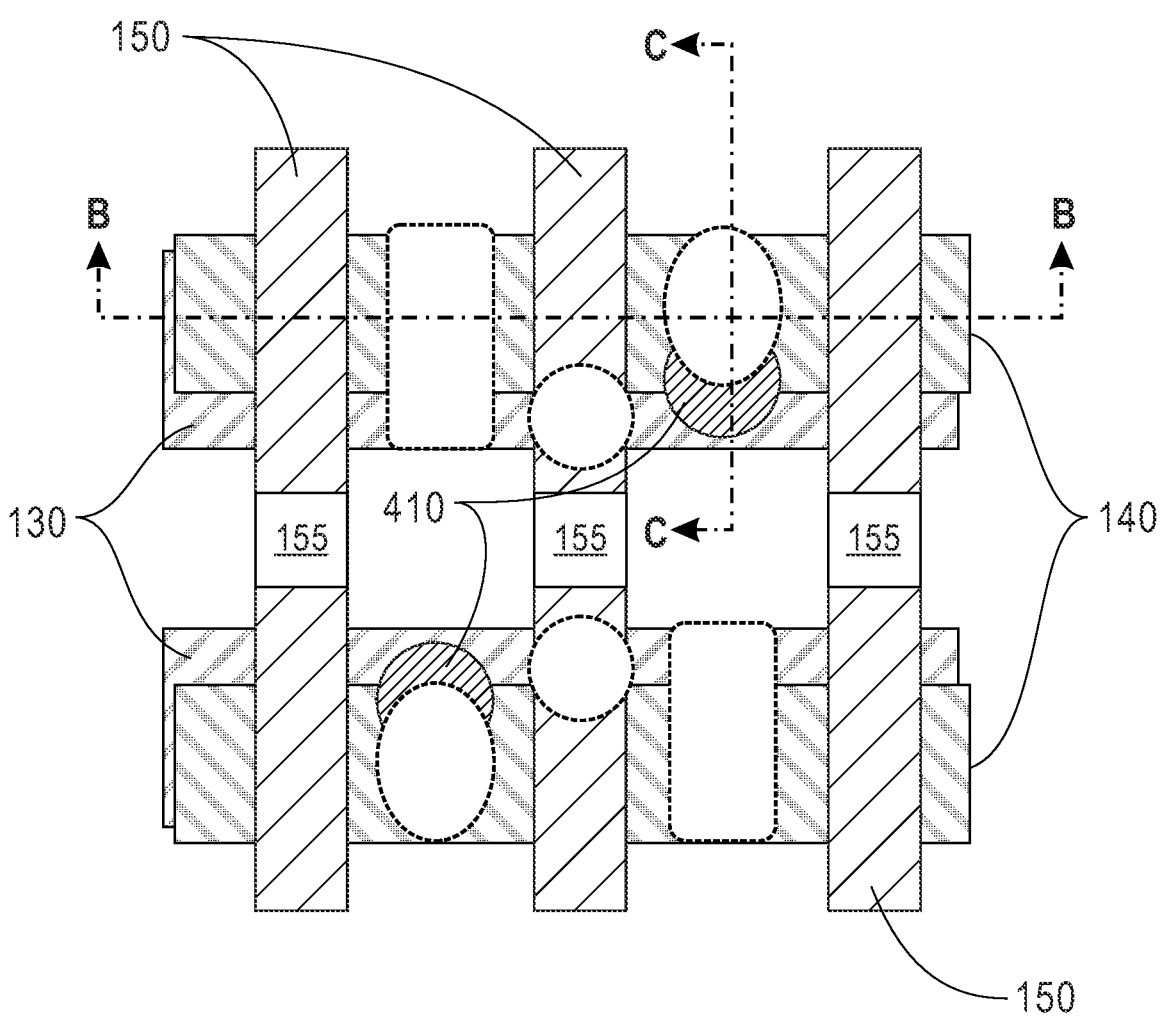
FIG. 7A depicts a top-down view.
Figures 7B, 7C:
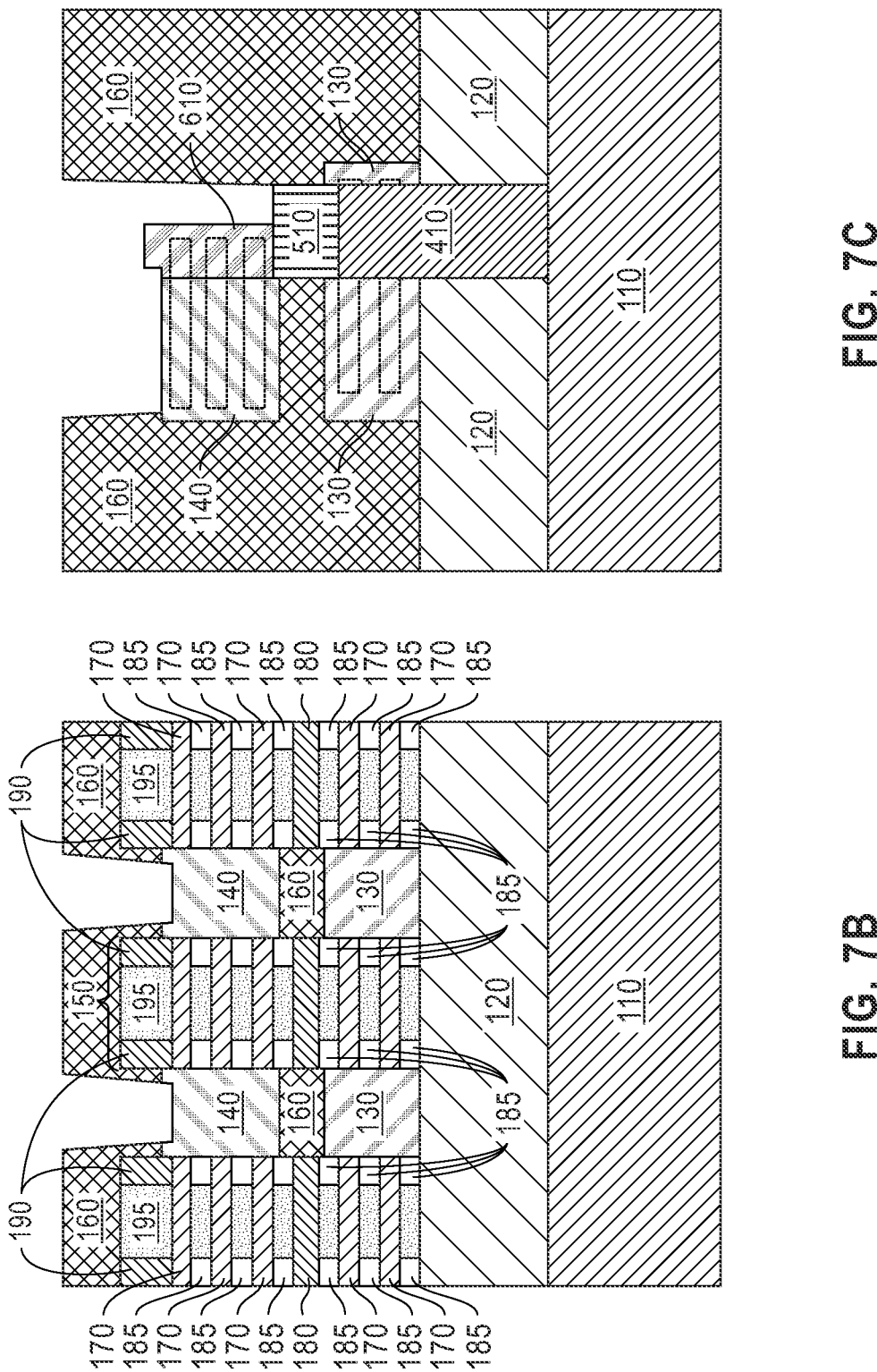
FIG. 7B depicts a cross-sectional view, along section line B of FIG. 7A.
FIG. 7C depicts a cross-sectional view, along section line C of FIG. 7A, of a process of forming MOL contact trenches, in accordance with an embodiment of the present invention.

FIG. 7A depicts a top-down view of fabrication steps, in accordance with an embodiment of the present invention. FIG. 7B depicts a cross-sectional view along section line B of FIG. 7A and FIG. 7C depicts a cross-sectional view along section line C of FIG. 7A, in accordance with an embodiment of the present invention. FIGS. 7A-7C depict the formation of MOL contact trenches.

One or more trenches may be formed by lithography and an etching process, such as reactive-ion etching (RIE), laser ablation, or any etch process which can be used to selectively remove a portion of material such as ILD material

160. A hardmask (not shown) may be patterned using photoresist to expose areas of the device where trenches are desired and the hardmask may be utilized during the etching process in the creation of the trenches. The etching process only removes portions of the device not protected by the hardmask and the etching process stops at top source/drain region 140 and/or top source/drain region material 610.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

Figure 8A:
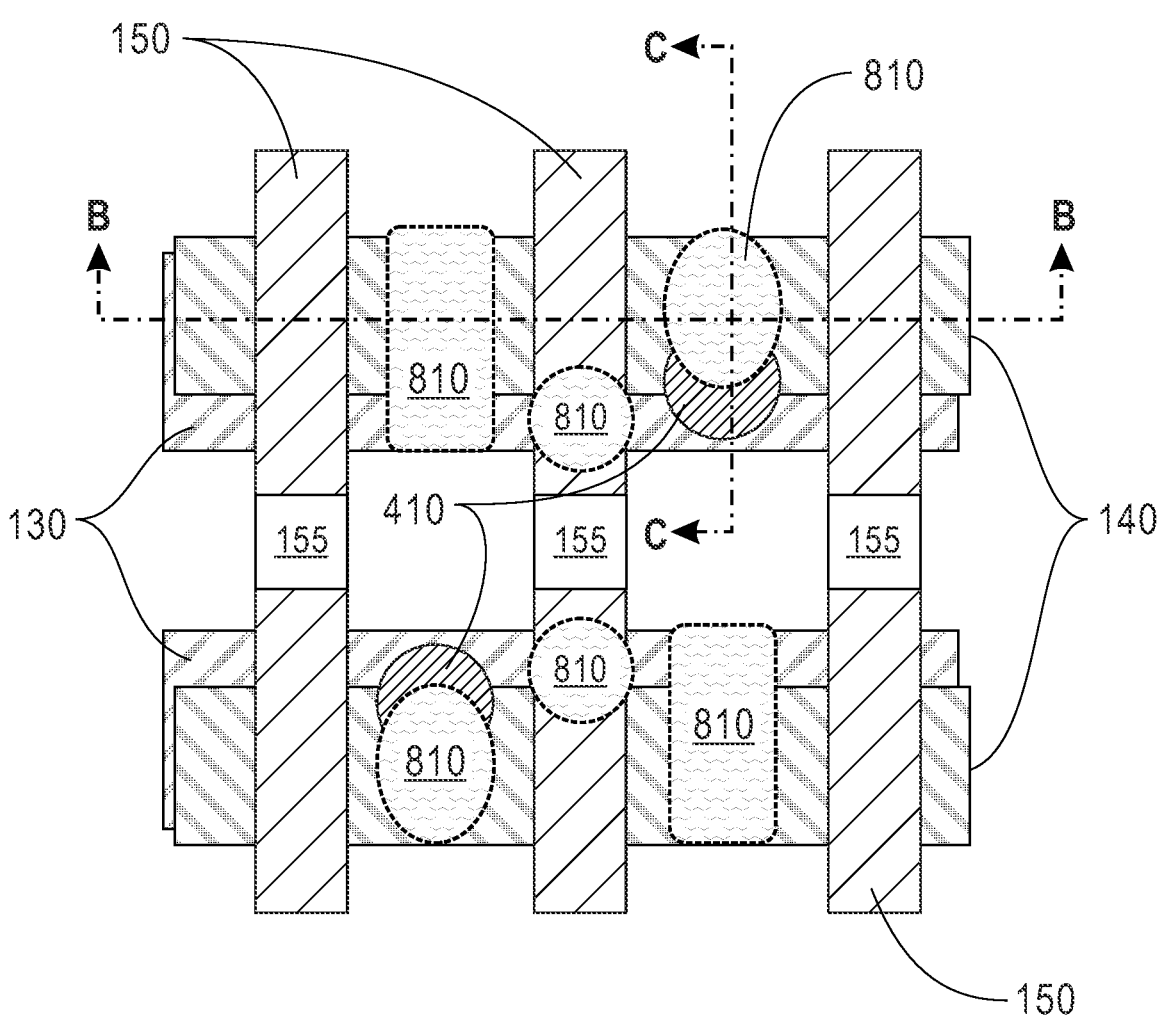
FIG. 8A depicts a top-down view.
Figures 8B, 8C:
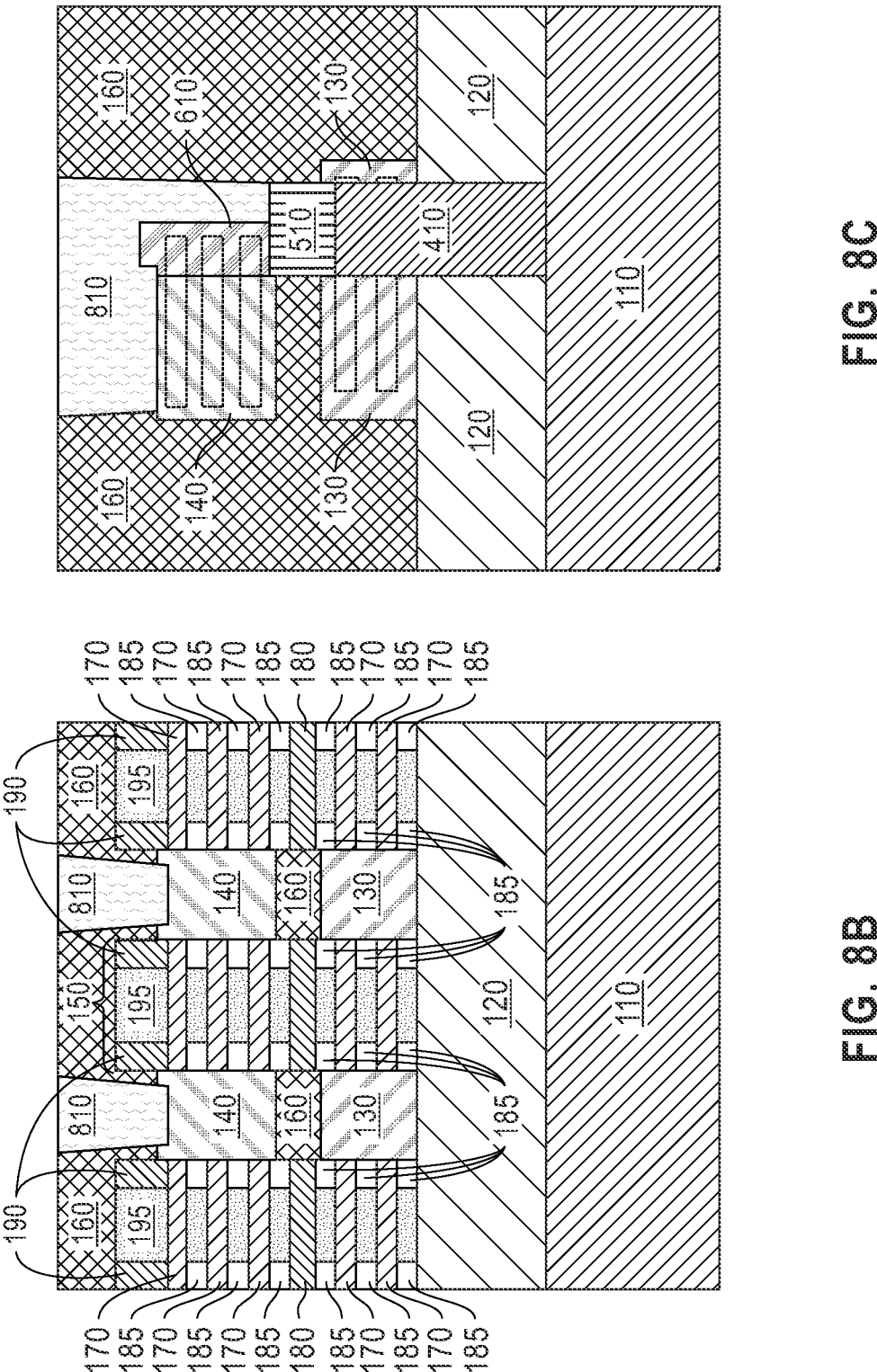
FIG. 8B depicts a cross-sectional view, along section line B of FIG. 8A.
FIG. 8C depicts a cross-sectional view, along section line C of FIG. 8A, of a process of forming top source/drain contacts, in accordance with an embodiment of the present invention.

FIG. 8A depicts a top-down view of fabrication steps, in accordance with an embodiment of the present invention. FIG. 8B depicts a cross-sectional view along section line B of FIG. 8A and FIG. 8C depicts a cross-sectional view along section line C of FIG. 8A, in accordance with an embodiment of the present invention. FIGS. 8A-8C depict the formation of top source/drain contacts 810.

In general, top source/drain contacts 810 make contact with top source/drain region 140 and/or top source/drain region material 610, or both top and bottom source/drain region where there's no presence of dielectric cap 510.

Top source/drain contacts 810 may be formed by metal deposition and planarization. The metal layers comprise a silicide liner, such as, for example, Ti, Ni, or NiPt, followed by adhesion metal liner, such as, for example, TiN, and a conductive metal fill, such as, for example, Co, Ru, W, or Cu.

Each top source/drain contacts 810 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

Figure 9A:
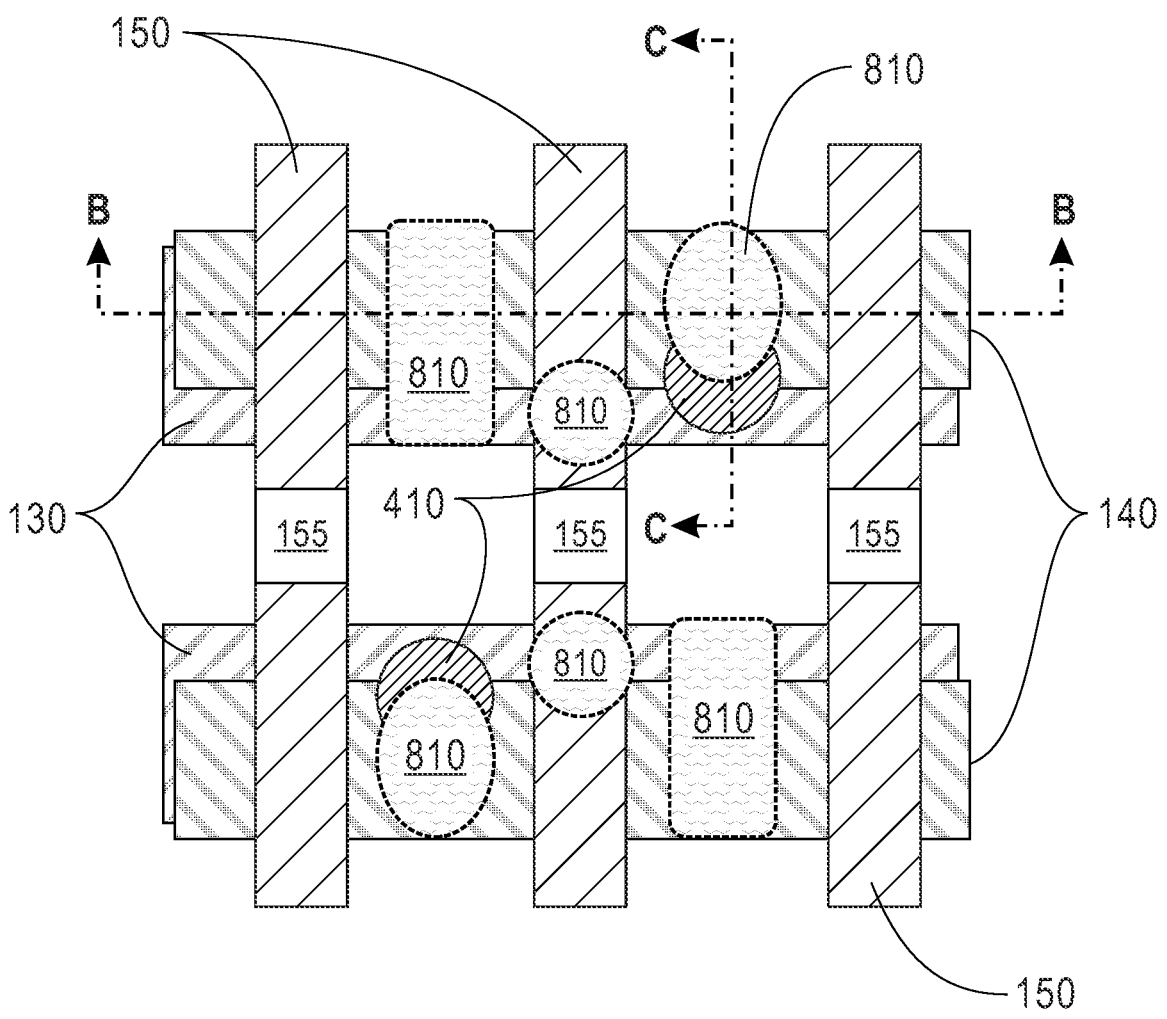
FIG. 9A depicts a top-down view.
Figures 9B, 9C:
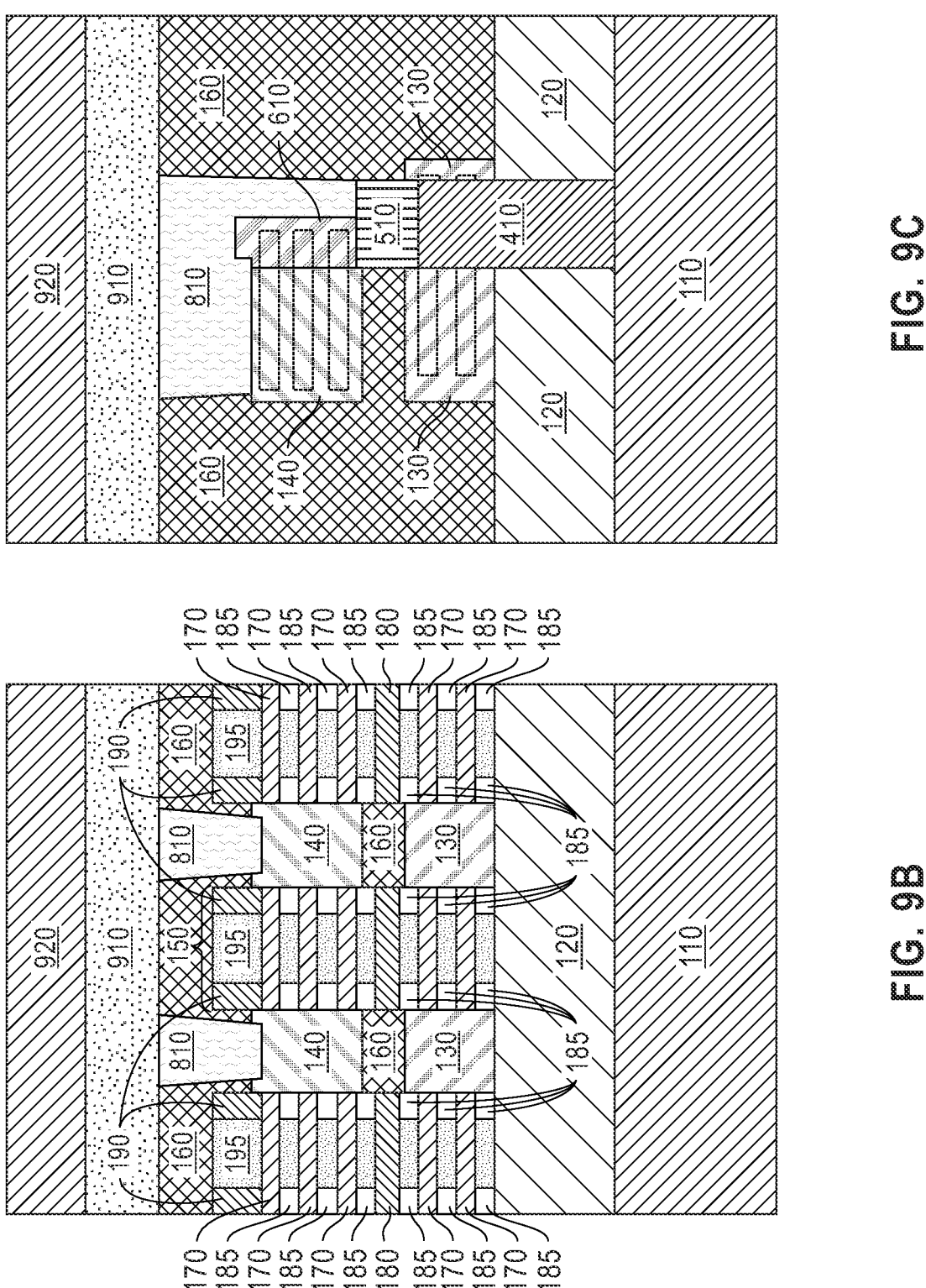
FIG. 9B depicts a cross-sectional view, along section line B of FIG. 9A.
FIG. 9C depicts a cross-sectional view, along section line C of FIG. 9A, of a process of forming back end of line (BEOL) interconnects, in accordance with an embodiment of the present invention.

FIG. 9A depicts a top-down view of fabrication steps, in accordance with an embodiment of the present invention. FIG. 9B depicts a cross-sectional view along section line B of FIG. 9A and FIG. 9C depicts a cross-sectional view along section line C of FIG. 9A, in accordance with an embodiment of the present invention. FIGS. 9A-9C depict the formation of BEOL interconnect 910 and the bonding of the device to carrier wafer 920.

BEOL interconnect 910 is depicted as a simple layer, rather than showing the specific interconnects. BEOL interconnect 910 may be formed according to processes known in the art such as, for example, patterning and dual damascene.

Carrier wafer 920 is a wafer that is bonded with a top surface of BEOL interconnect 910. Carrier wafer 920 may be, for example, a silicon wafer. Such bonding can be accomplished using fusion bonding (for example silicon oxide to silicon oxide) or by means of intermediate-layer bonding (for example using adhesives). A variety of bonding means may be used such as, for example, pressure bonding, for press-bonding the device to the carrier wafer 920 or a heat bonding approach for utilizing heat to bond the device to carrier wafer 920.

Figure 10A:
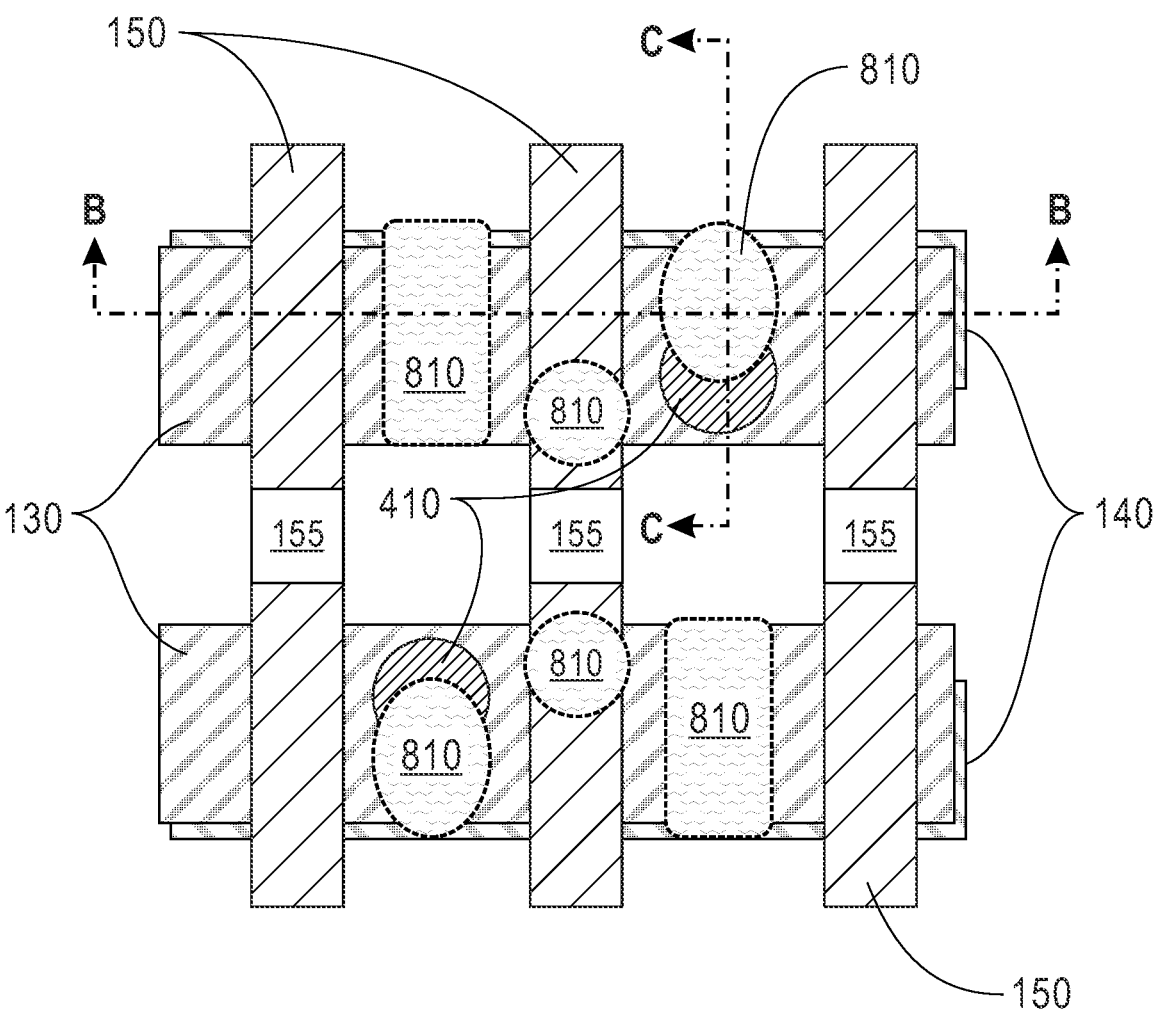
FIG. 10A depicts a top-down view.
Figures 10B, 10C:
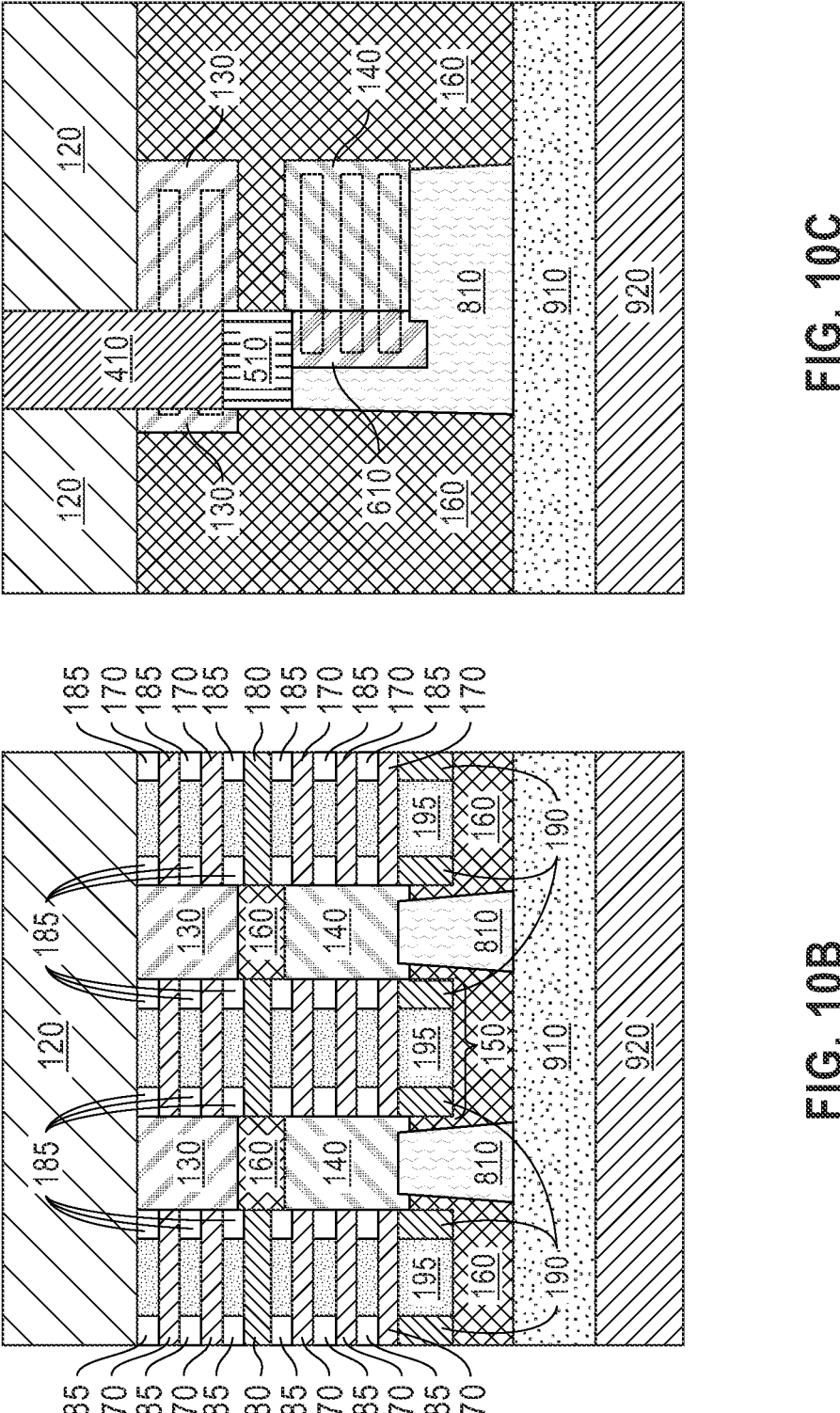
FIG. 10B depicts a cross-sectional view, along section line B of FIG. 10A.
FIG. 10C depicts a cross-sectional view, along section line C of FIG. 10A, of a process of flipping the device and removing the semiconductor substrate, in accordance with an embodiment of the present invention.

FIG. 10A depicts a top-down view of fabrication steps, in accordance with an embodiment of the present invention. FIG. 10B depicts a cross-sectional view along section line B of FIG. 10A and FIG. 10C depicts a cross-sectional view along section line C of FIG. 10A, in accordance with an embodiment of the present invention. FIGS. 10A-10C depicts the flipping of the device and removal of semiconductor substrate 110.

The wafer containing device is flipped such that a top surface of the wafer faces downwards and the carrier wafer 920 acts as a bottom surface of the flipped device.

A combination of processes such as wafer grinding, CMP, and/or wet/dry etch processes may be used to remove semiconductor substrate 110.

Figure 11A:
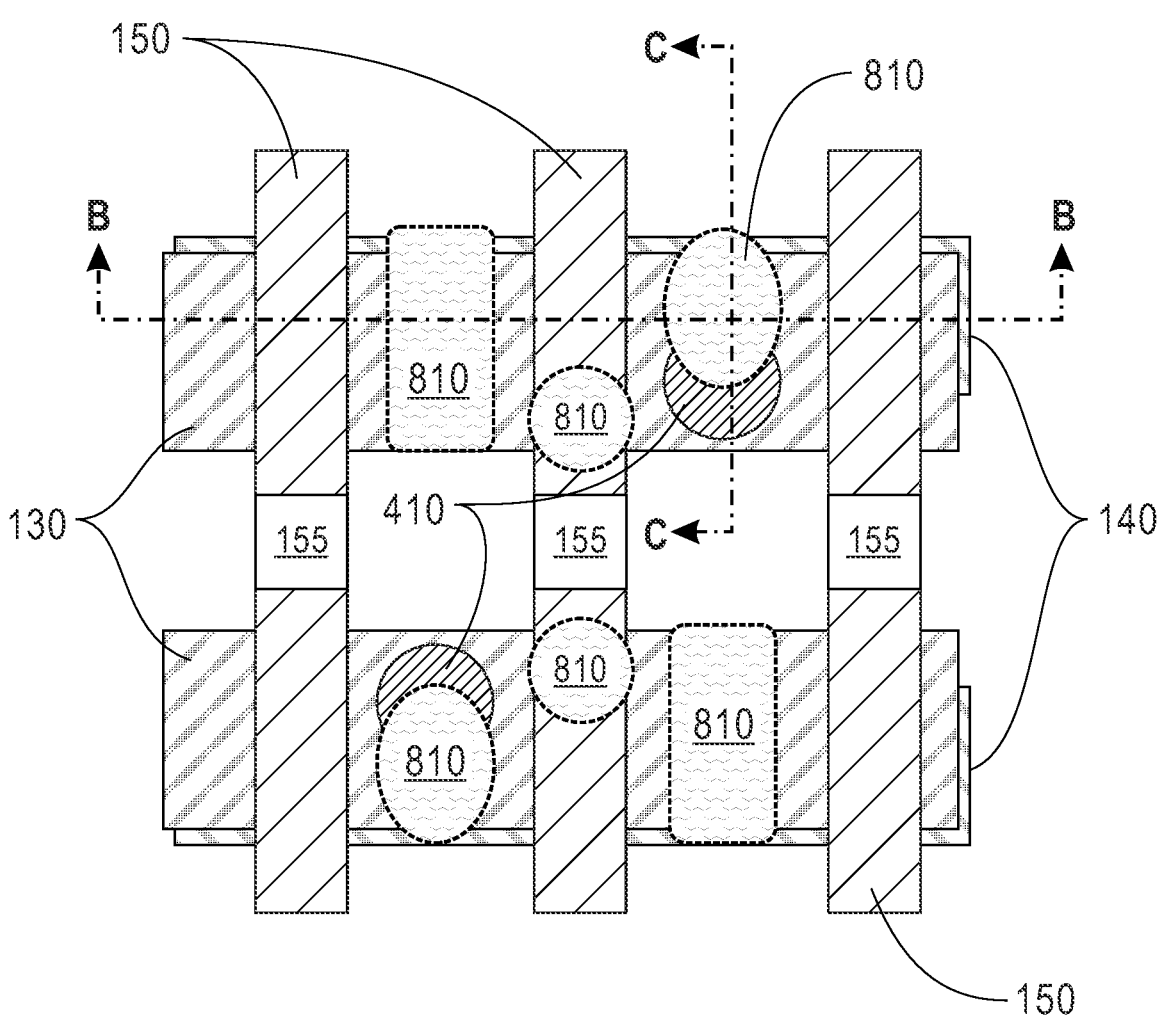
FIG. 11A depicts a top-down view.
Figure 11C:
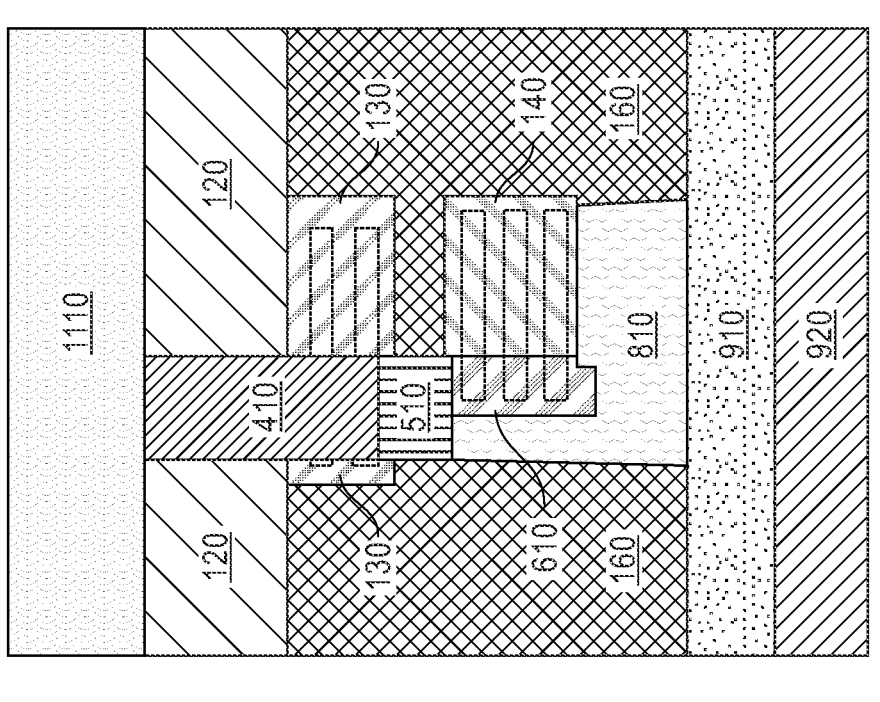
FIG. 11C depicts a cross-sectional view, along section line C of FIG. 11A, of a process of forming a backside ILD layer, in accordance with an embodiment of the present invention.
Figure 11B:
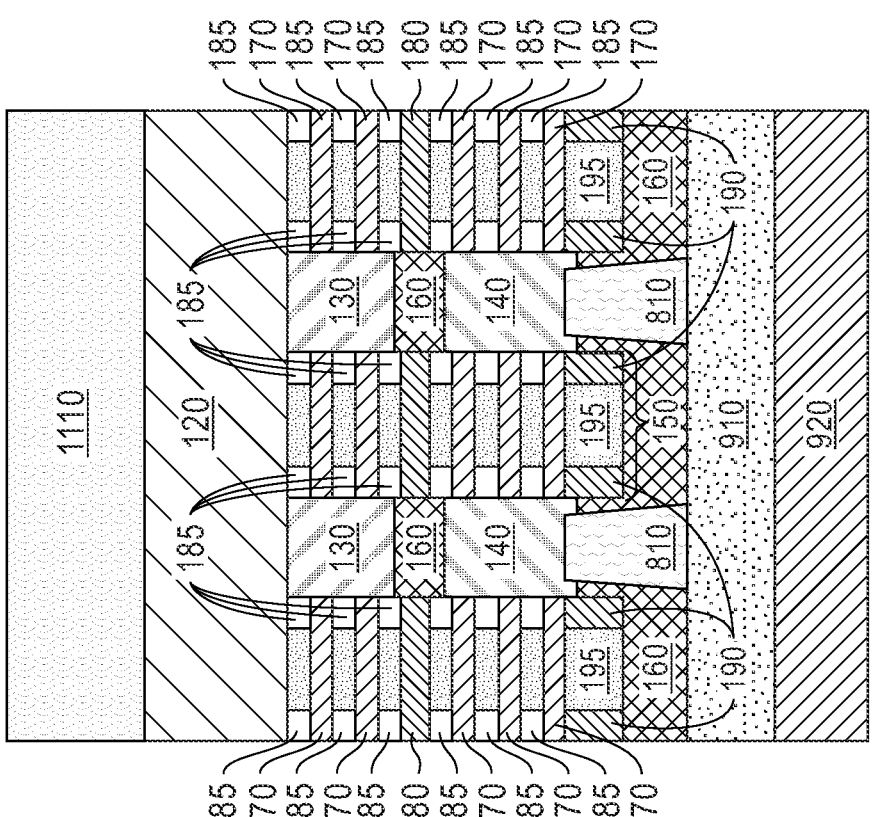
FIG. 11B depicts a cross-sectional view, along section line B of FIG. 11A.

FIG. 11A depicts a top-down view of fabrication steps, in accordance with an embodiment of the present invention. FIG. 11B depicts a cross-sectional view along section line B of FIG. 11A and FIG. 11C depicts a cross-sectional view along section line C of FIG. 11A, in accordance with an embodiment of the present invention. FIGS. 11A-11C depict the formation of backside ILD 1110.

Backside ILD 1110 material is formed above BOX 120 and VBPR contact 410.

Backside ILD 1110 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as backside ILD 1110. The use of a self-planarizing dielectric material as backside ILD 1110 may avoid the need to perform a subsequent planarizing step.

In one embodiment, backside ILD 1110 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as backside ILD 1110, a planarization process or an etch back process follows the deposition of the dielectric material that provides backside ILD 1110.

Figure 12A:
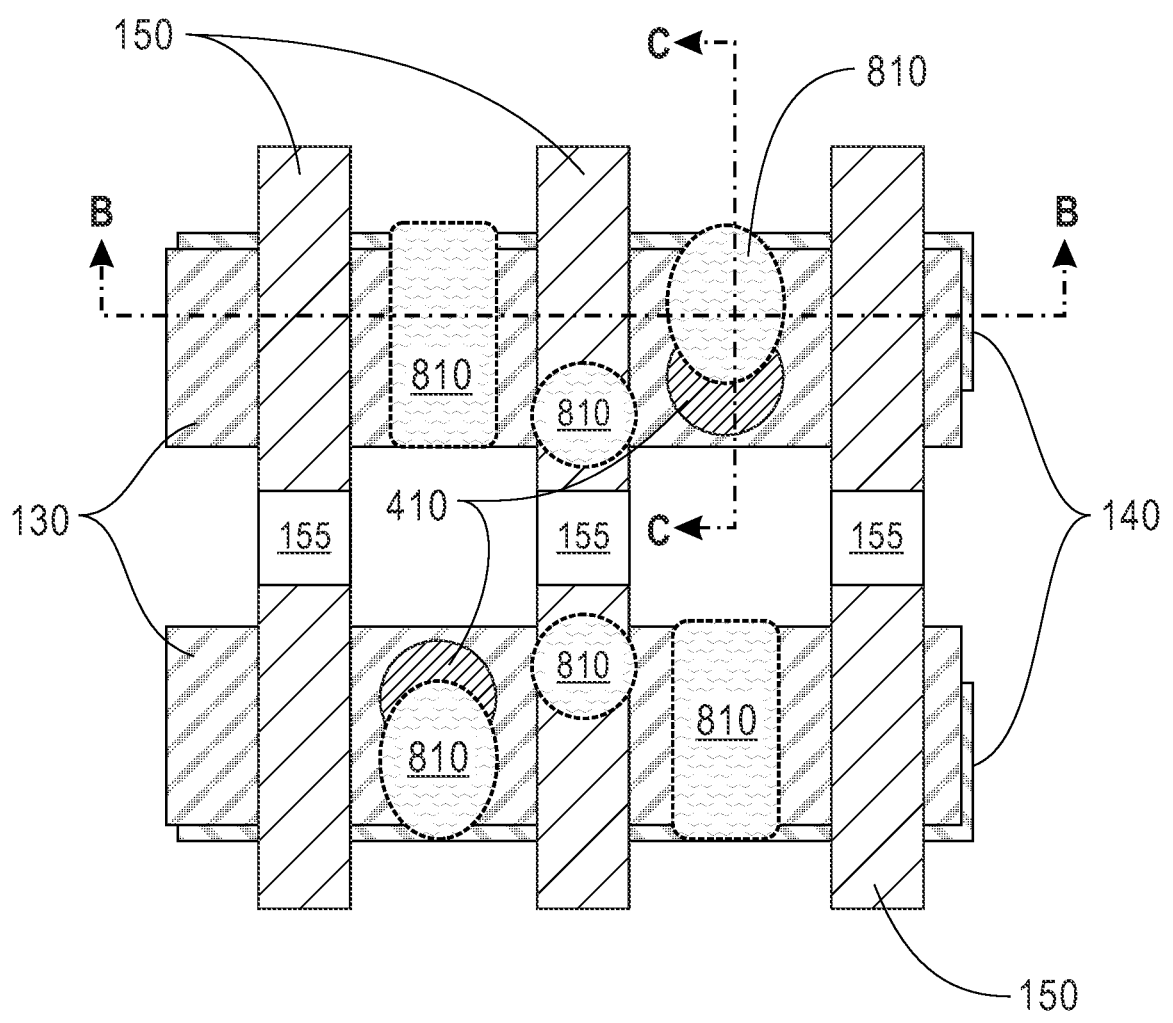
FIG. 12A depicts a top-down view.
Figure 12C:
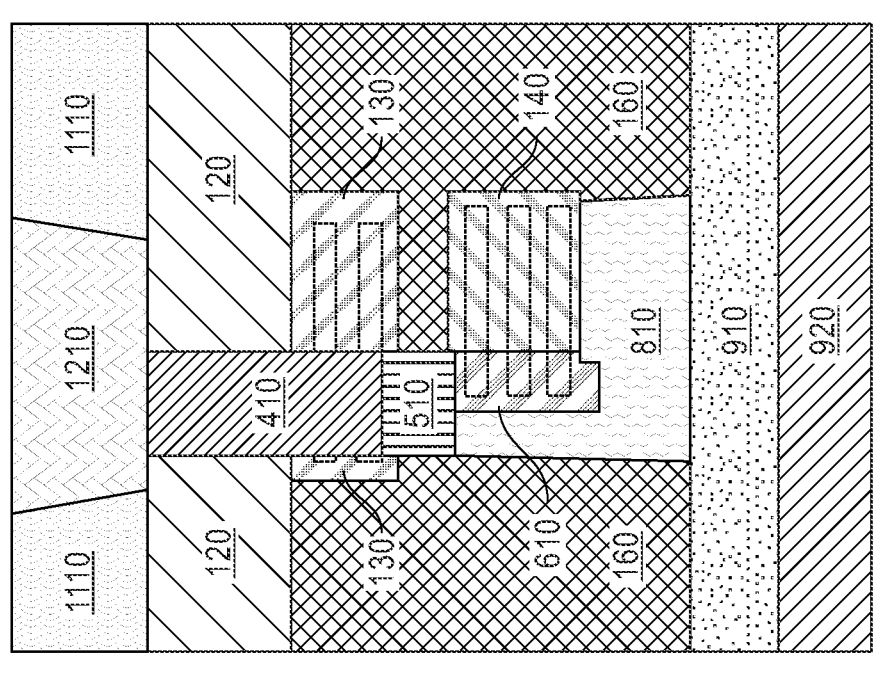
FIG. 12C depicts a cross-sectional view, along section line C of FIG. 12A, of a process of forming a backside power rail, in accordance with an embodiment of the present invention.
Figure 12B:
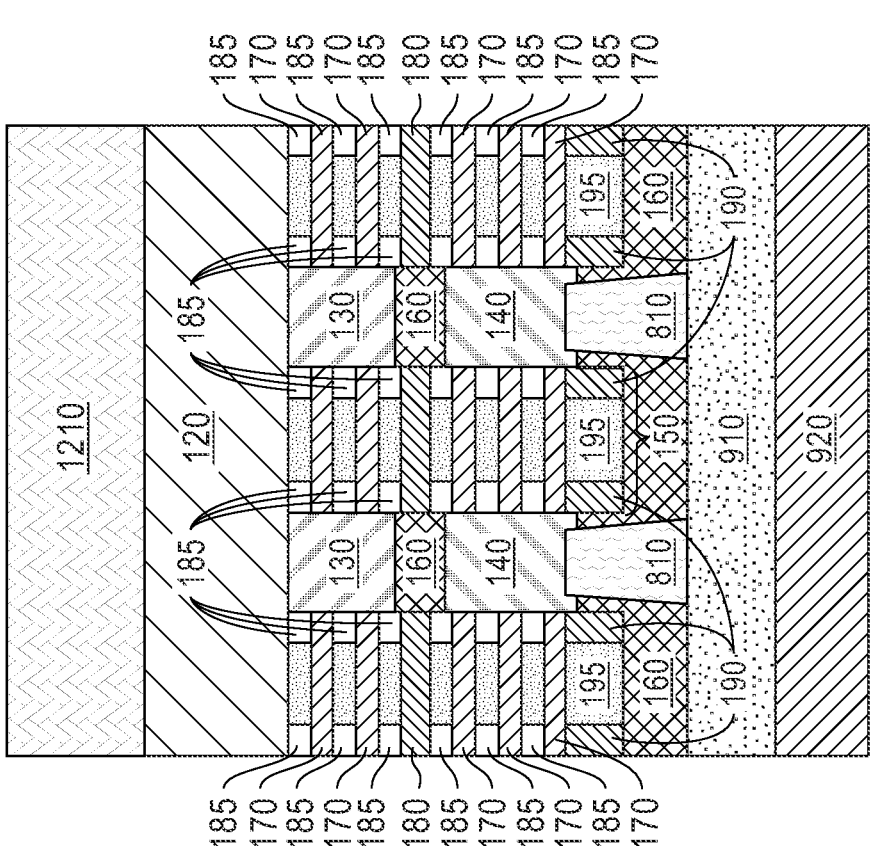
FIG. 12B depicts a cross-sectional view, along section line B of FIG. 12A.

FIG. 12A depicts a top-down view of fabrication steps, in accordance with an embodiment of the present invention. FIG. 12B depicts a cross-sectional view along section line B of FIG. 12A and FIG. 12C depicts a cross-sectional view along section line C of FIG. 12A, in accordance with an embodiment of the present invention. FIGS. 12A-12C depict the formation of backside power rail (BPR) 1210.

One or more trenches may be formed by an etching process, such as reactive-ion etching (RIE), laser ablation, or any etch process which can be used to remove a portion of material such as backside ILD 1110. A hardmask (not shown) may be patterned using photoresist to expose areas of backside ILD 1110 where trenches are desired and the hardmask may be utilized during the etching process in the creation of the trenches. The etching process only removes portions of backside ILD 1110 not protected by the hardmask and the etching process stops at BOX 120 and VBPR contact 410.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

Backside power rail 1210 may be formed by, for example, depositing (e.g., by PVD), a metal layer (e.g., a thin adhesion TiN layer followed by bulk Cu, Co, or Ru fill) on exposed surfaces of VBPR contact 410 and BOX 120. Any deposition process may be used for the formation of the metal layer including, for example, chemical vapor deposition (CVD), plasma enhanced chemical vapor deposition (PECVD), physical vapor deposition (PVD), plating, sputtering, or atomic layer deposition. In other embodiments, co-evaporation techniques may be utilized to form backside power rail 1210. Co-evaporation consists of the simultaneous deposition of metal and silicon under high vacuum conditions. In co-evaporation, possible heating techniques used include electron beam, rf induction, with a laser, or by resistive heating. In yet other embodiments, known sputter deposition or chemical vapor deposition techniques may be utilized to form the silicide layer.

In some embodiments, backside power rail 1210 is deposited such that backside power rail 1210 surrounds the silicide layer and fills the remaining area of the trench. Backside power rail 1210 may be in direct contact with the silicide layer, VBPR contact 410, and backside ILD 1110.

Backside power rail 1210 can be formed utilizing a deposition process including, for example, plating, chemical vapor deposition (CVD), plasma enhanced chemical vapor deposition (PECVD), physical vapor deposition (PVD), sputtering, atomic layer deposition (ALD) or other like deposition processes.

Backside power rail 1210 can include a conductive material including, for example, Cu, Co, Ru, W with a thing adhesion liner such as, for example, TiN.

Figure 13A:
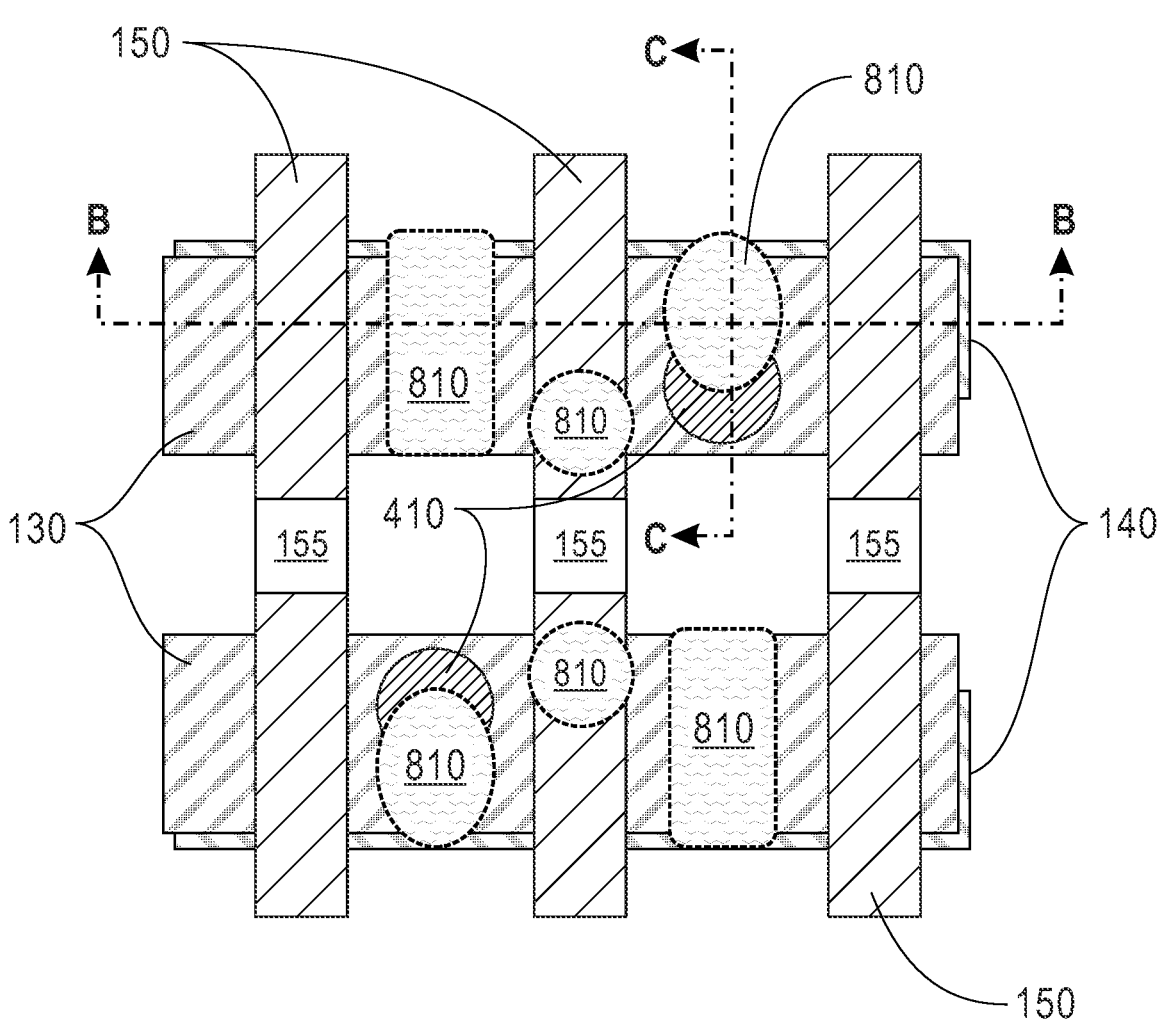
FIG. 13A depicts a top-down view.
Figures 13B, 13C:
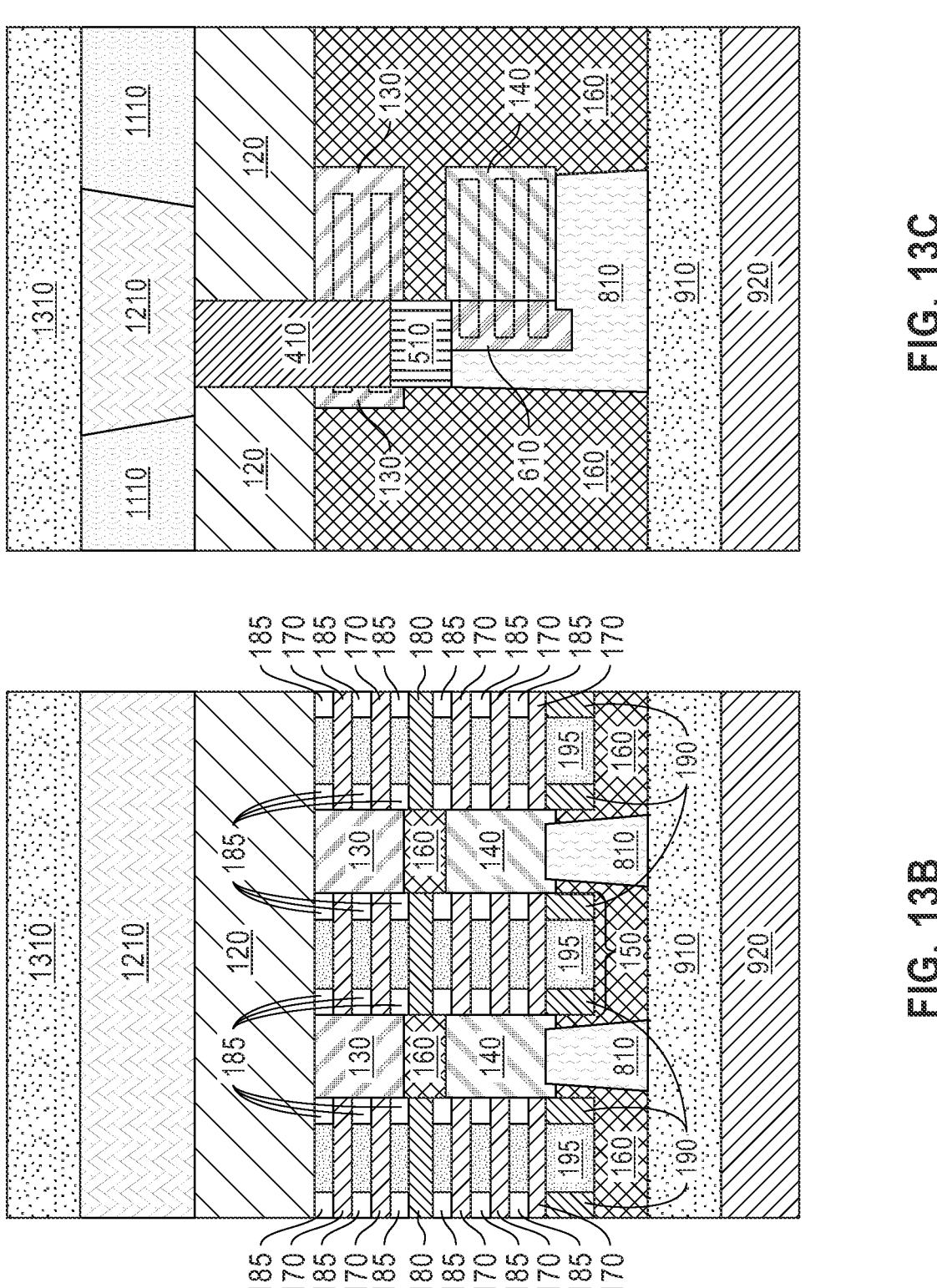
FIG. 13B depicts a cross-sectional view, along section line B of FIG. 13A.
FIG. 13C depicts a cross-sectional view, along section line C of FIG. 13A, of a process of forming a backside power delivery network (BSPDN), in accordance with an embodiment of the present invention.

FIG. 13A depicts a top-down view of fabrication steps, in accordance with an embodiment of the present invention. FIG. 13B depicts a cross-sectional view along section line B of FIG. 13A and FIG. 13C depicts a cross-sectional view along section line C of FIG. 13A, in accordance with an embodiment of the present invention. FIGS. 13A-13C depicts the formation of backside power delivery network (BSPDN) 1310.

BSPDN 1310 comprises a backside power delivery network that is depicted as a simplified layer. BSPDN 1310 may be formed according to processes known in the art.

Subsequent to the formation of BSPDN 1310, the wafer may be released from carrier wafer 920 and flipped over (not depicted) such that BSPDN 1310 is on the bottom of the wafer and operates as a backside power delivery network. Alternatively, the carrier wafer 920 is kept, and through-silicon vias (TSVs) can be formed from backside of the wafer to BEOL interconnect at frontside.

The resulting semiconductor structure includes a top FET over a bottom FET where a bottom source/drain contact (VBPR contact 410) etches through the bottom source/drain region 130 and interconnects at a backside of the device to backside power rail 1210. A top source/drain contact 810 connects the top source/drain region 140 to BEOL interconnect 910. A bottom source/drain contact cap (VBPR dielectric cap 510) separates the bottom source/drain contact (VBPR contact 410) from the top source/drain contact 810. In some embodiments, both the bottom source/drain contact (VBPR contact 410) and the top source/drain contact 810 each, at least, partially overlaps the footprint of both the bottom and top active regions of the device.

FIGS. 14A-14C through 23A-23C depict embodiments of the present invention formed according to a different fabrication process.

Figure 14A:
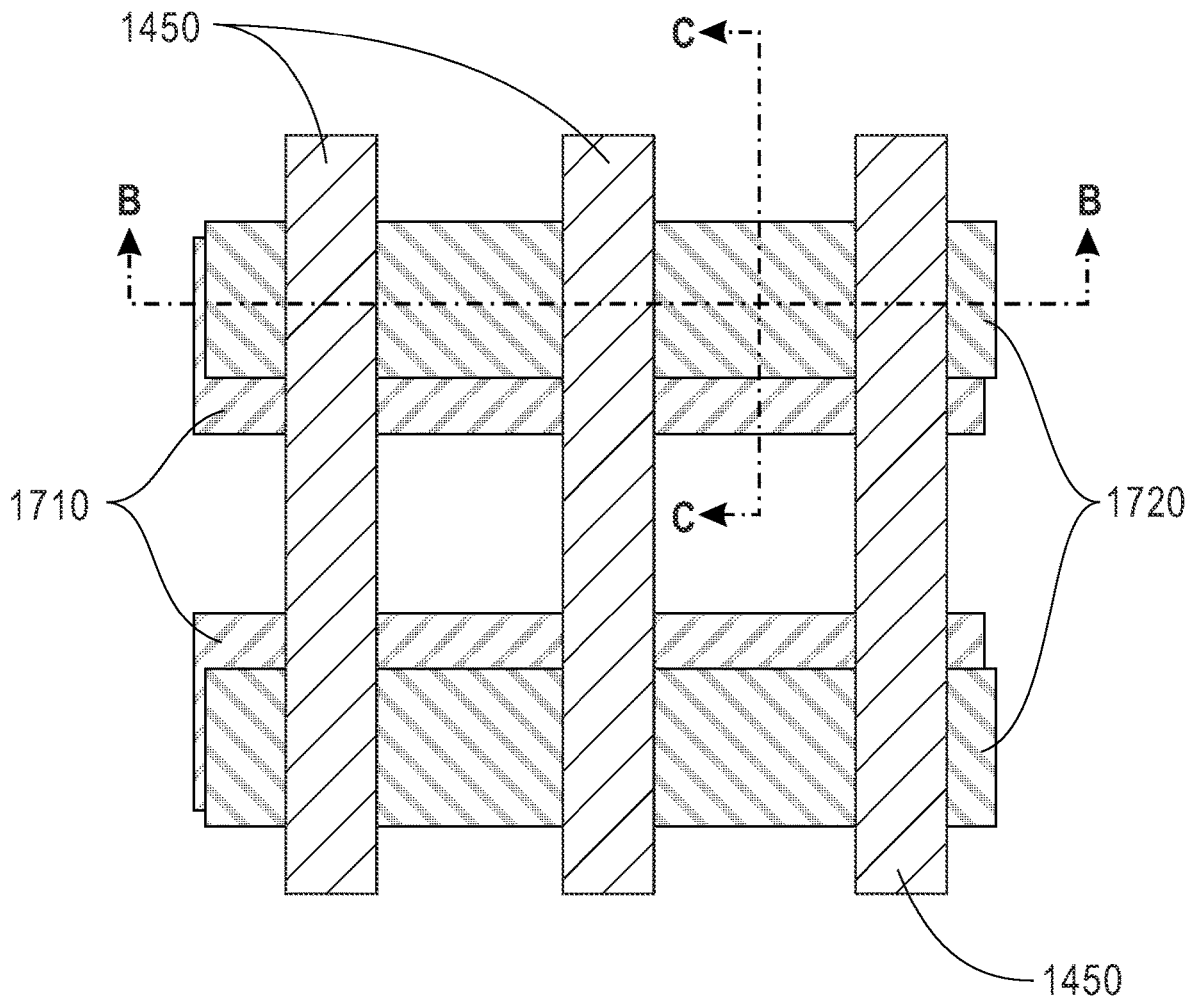
FIG. 14A depicts a top-down view.
Figures 14B, 14C:
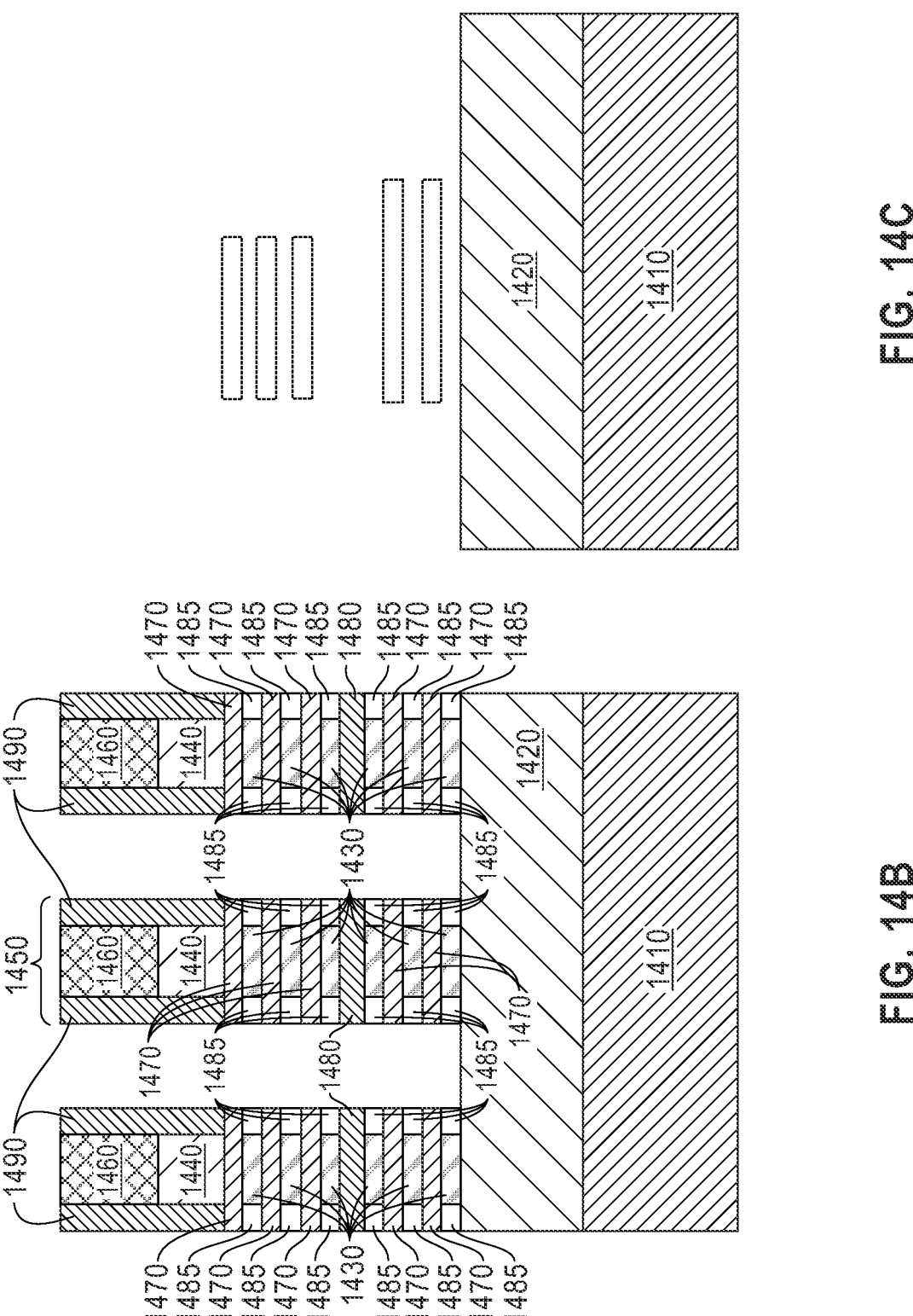
FIG. 14B depicts a cross-sectional view, along section line B of FIG. 14A.
FIG. 14C depicts a cross-sectional view, along section line C of FIG. 14A, of an intermediate step of forming a stacked FET FEOL formation, in accordance with an embodiment of the present invention.

FIG. 14A depicts a top-down view of a device at an early stage in the method of forming the device, FIG. 14B depicts a cross-sectional view along section line B of FIGS. 14A and FIG. 14C depicts a cross-sectional view along section line C of FIG. 14A, in accordance with an embodiment of the present invention. More particularly, FIGS. 14A-14C depict an intermediate step of forming a stacked FET FEOL formation.

The semiconductor structure of FIGS. 14A-14C includes a semiconductor substrate upon which embodiments of the invention can be fabricated. FIG. 14A generally shows the location of the gates 1450, bottom active device area (RX) 1710 and top RX 1720 of each stacked field-effect transistor (FET) structure.

The semiconductor substrate 1410, BOX 1420, semiconductor material stack (sacrificial semiconductor material layer 1430, semiconductor channel material layer 1470), inner spacers 1485, and MDI 1480, sacrificial gate dielectric portion 1440, hardmask 1460, and gate sidewall spacer 1490 may all be formed in a manner similar layers are described as being formed in reference to FIGS. 1A-C. The nanosheets shown in FIG. 14C is not real nanosheets in CC cross-section, it's a projection effect to illustrate where the channels are if current flows into the page.

Figure 15A:
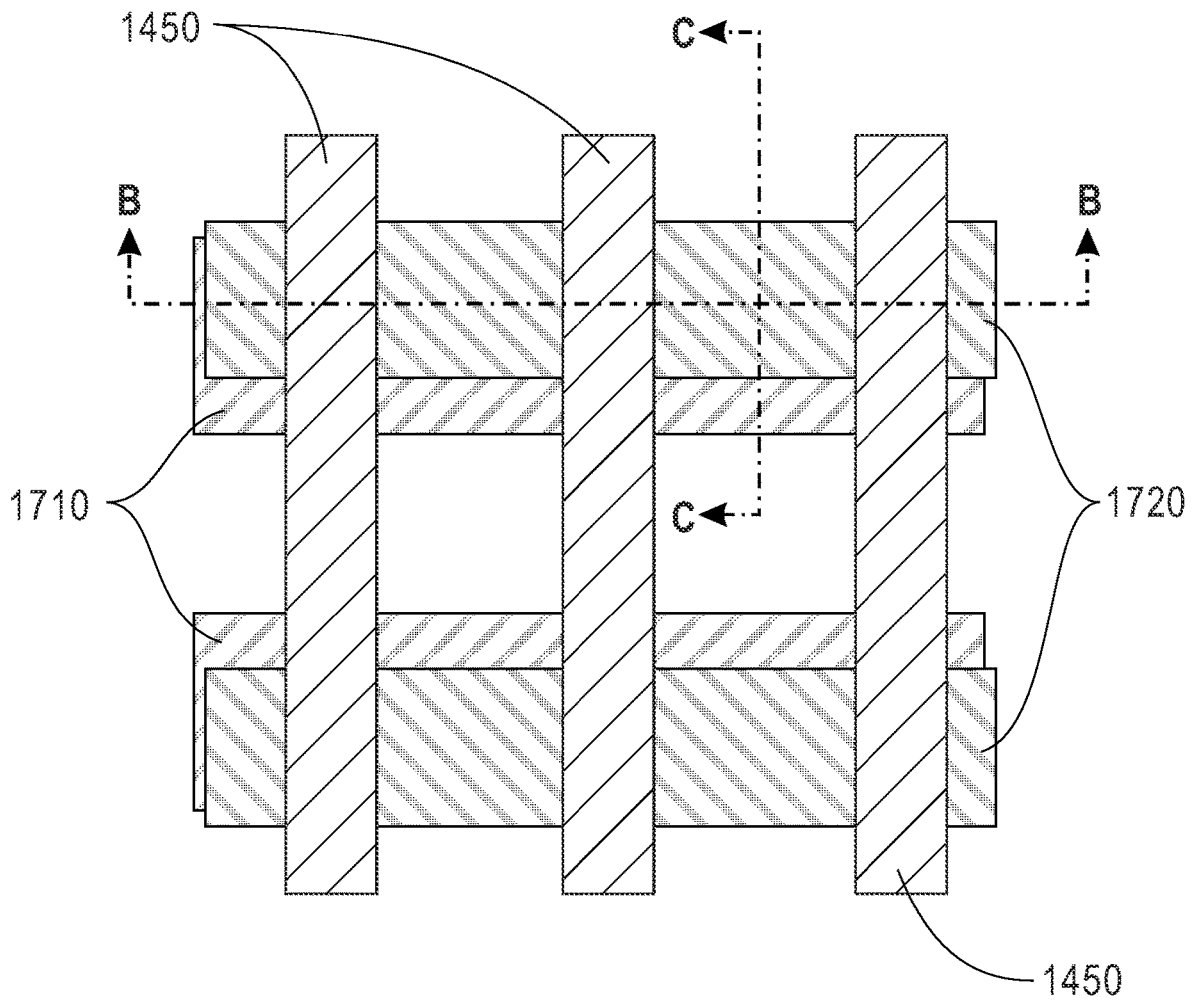
FIG. 15A depicts a top-down view.
Figures 15B, 15C:
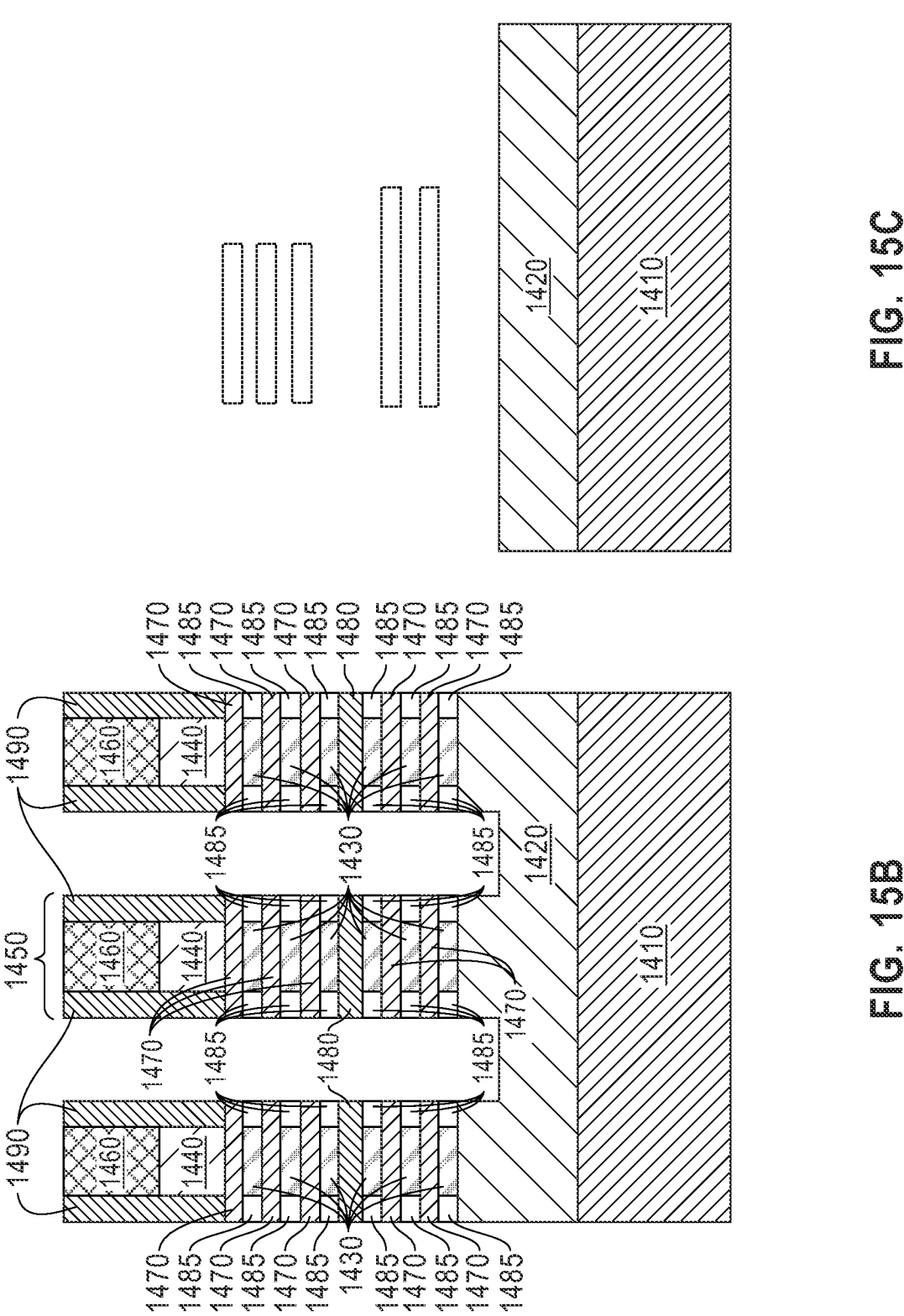
FIG. 15B depicts a cross-sectional view, along section line B of FIG. 15A.
FIG. 15C depicts a cross-sectional view, along section line C of FIG. 15A, of a process of recessing portions of a buried oxide layer (BOX), in accordance with an embodiment of the present invention.

FIG. 15A depicts a top-down view of fabrication steps, in accordance with an embodiment of the present invention. FIG. 15B depicts a cross-sectional view along section line B of FIG. 15A and FIG. 15C depicts a cross-sectional view along section line C of FIG. 15A, in accordance with an embodiment of the present invention. FIGS. 15A-15C depict the recessing of portions of BOX 1420 not protected by hardmask 1460 or gate sidewall spacer 1490.

Portions of BOX 1420 that are not protected by hardmask 1460 or gate sidewall spacer 1490 may be removed by an etching process, such as RIE, laser ablation, or any etch process which can be used to selectively remove a portion of material such as BOX 1420. Hardmask 1460 and gate sidewall spacer 1490 may be utilized during the etching process to protect areas of the device. The etching process only removes the portions of BOX 1420 not protected by hardmask 1460 or gate sidewall spacer 1490 and the etching process stops before reaching a bottom surface of BOX 1420.

Figure 16A:
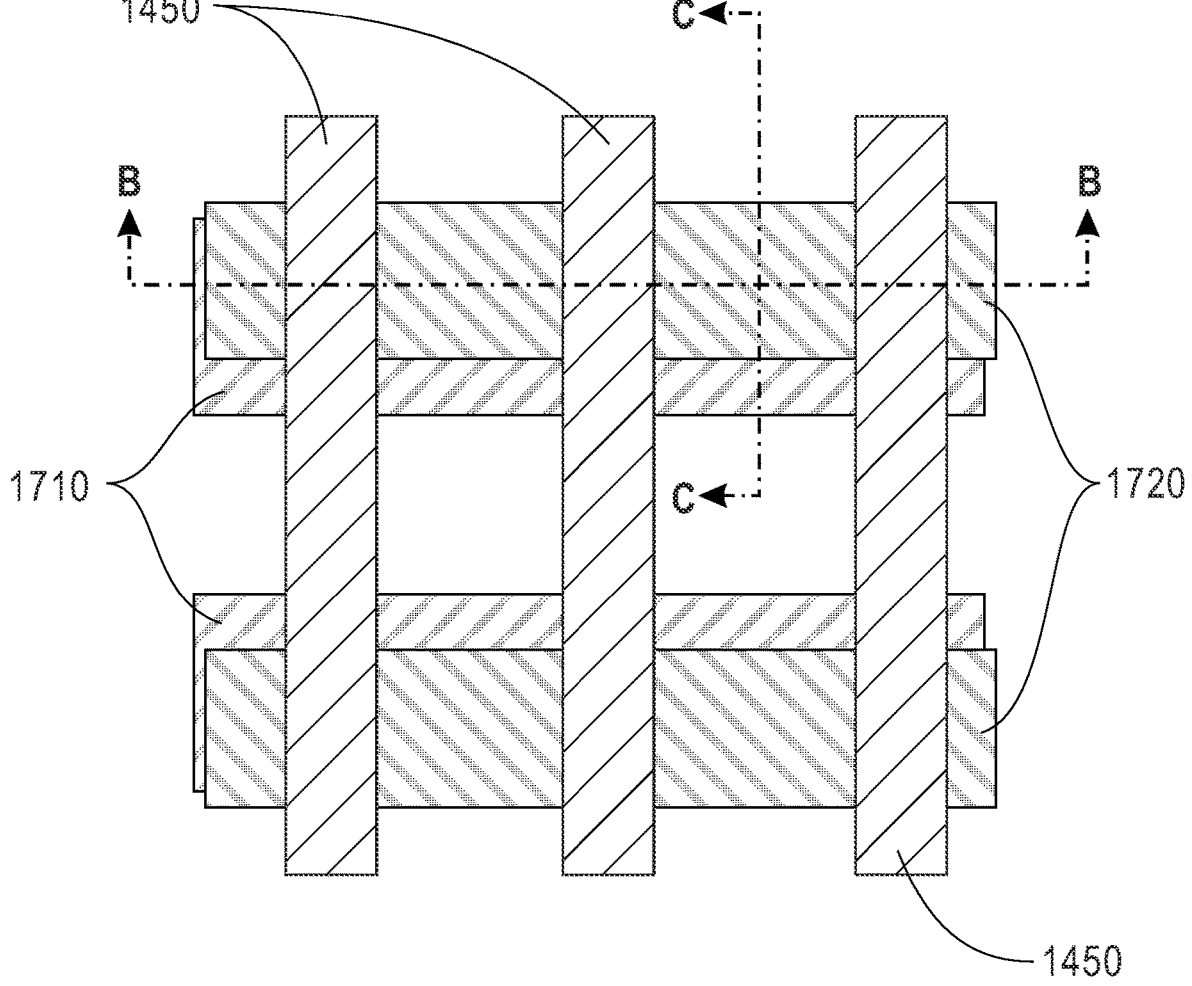
FIG. 16A depicts a top-down view.
Figures 16B, 16C:
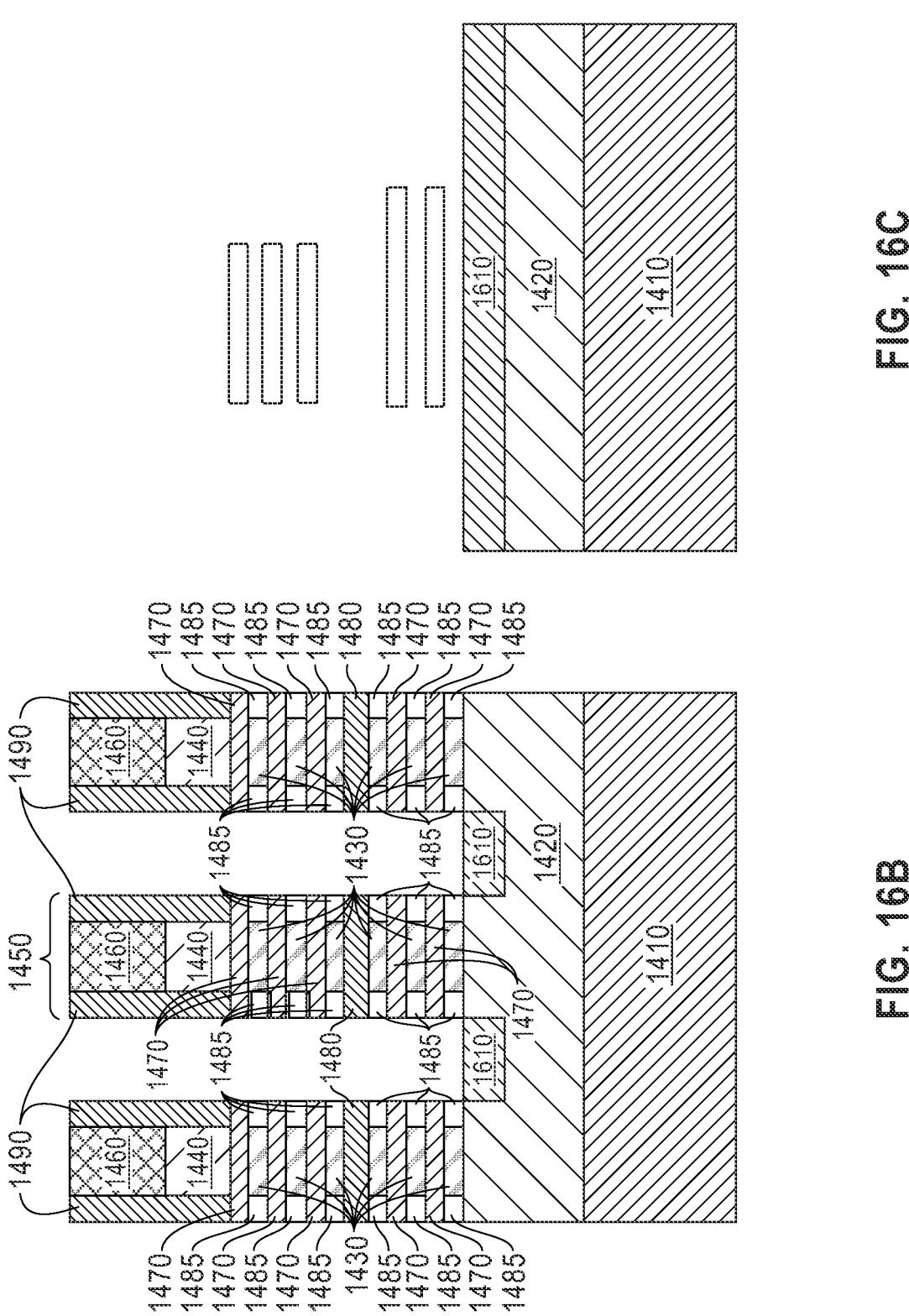
FIG. 16B depicts a cross-sectional view, along section line B of FIG. 16A.
FIG. 16C depicts a cross-sectional view, along section line C of FIG. 16A, of a process of forming a bottom dielectric layer, in accordance with an embodiment of the present invention.

FIG. 16A depicts a top-down view of fabrication steps, in accordance with an embodiment of the present invention. FIG. 16B depicts a cross-sectional view along section line B of FIG. 16A and FIG. 16C depicts a cross-sectional view along section line C of FIG. 16A, in accordance with an embodiment of the present invention. FIGS. 16A-16C depict the formation of bottom dielectric 1610.

Bottom dielectric 1610 can be any suitable dielectric material such as, for example, SiN, SiCN(H), TEOS, SiOx, or other oxide materials. The dielectric material that provides bottom dielectric 1610 may be provided by a deposition process including, for example, ALD, chemical vapor deposition (CVD), plasma enhanced chemical vapor deposition (PECVD), physical vapor deposition (PVD) or other deposition processes.

Figure 17A:
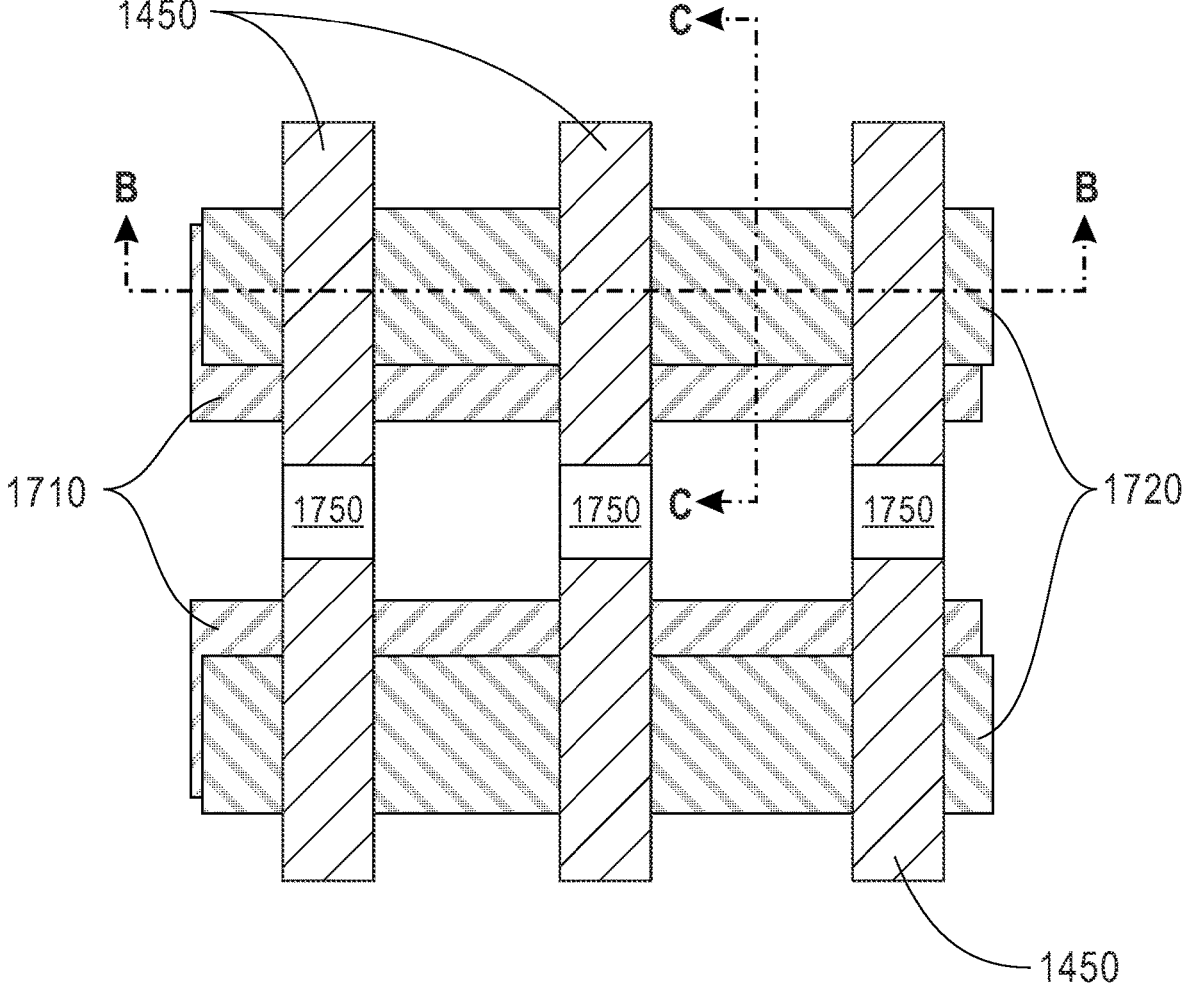
FIG. 17A depicts a top-down view.
Figures 17B, 17C:
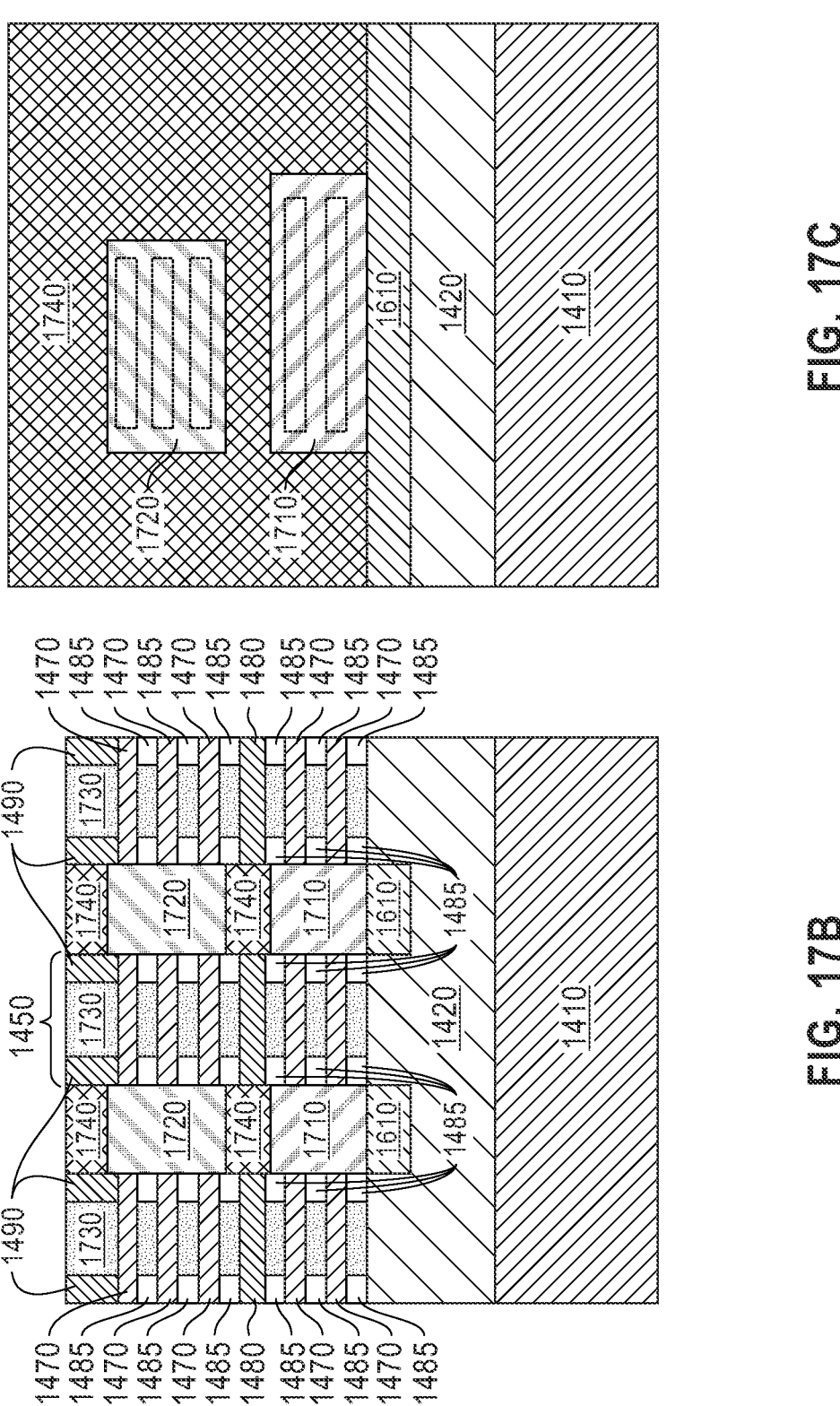
FIG. 17B depicts a cross-sectional view, along section line B of FIG. 17A.
FIG. 17C depicts a cross-sectional view, along section line C of FIG. 17A, of a process of forming a gate conductor, bottom source/drain region, top source/drain region, and ILD, in accordance with an embodiment of the present invention.

FIG. 17A depicts a top-down view of fabrication steps, in accordance with an embodiment of the present invention. FIG. 17B depicts a cross-sectional view along section line B of FIG. 17A and FIG. 17C depicts a cross-sectional view along section line C of FIG. 17A, in accordance with an embodiment of the present invention. FIGS. 17A-17C depict the formation of replacement gate 1730, bottom source/drain region 1710, top source/drain region 1720, ILD material 1740, and gate cuts 1750.

Bottom source/drain region 1710 is formed by epitaxial growth of a semiconductor material on physically exposed sidewalls of each semiconductor channel material layer 1470. In the depicted embodiment, the semiconductor material that provides the bottom source/drain region 1710 grows laterally out from the sidewalls of each semiconductor channel material layer 1470. The bottom source/drain region 1710 has a bottommost surface that directly contacts a topmost surface of bottom dielectric 1610.

Each bottom source/drain region 1710 includes a semiconductor material and a dopant. The semiconductor material that provides each bottom source/drain region 1710 can be selected from one of the semiconductor materials mentioned above for the semiconductor substrate 110. In some embodiments, the semiconductor material that provides each bottom source/drain region 1710 may comprise a same semiconductor material as that which provides semiconductor channel material layer 1470. In other embodiments, the semiconductor material that provides each bottom source/drain region 1710 may comprise a different semiconductor material than that which provides semiconductor channel material layer 1470. For example, the semiconductor material that provides each bottom source/drain region 1710 may comprise a silicon germanium alloy, while semiconductor channel material layer 1470 may comprise silicon.

The dopant that is present in each bottom source/drain region 1710 can be either a p-type dopant or an n-type dopant. In one embodiment, the dopant that can be present in each bottom source/drain region 1710 can be introduced into the precursor gas that provides each bottom source/drain region 1710. In another embodiment, the dopant can be introduced into an intrinsic semiconductor layer by utilizing one of ion implantation or gas phase doping. In one example, each bottom source/drain region 1710 comprises a silicon germanium alloy that is doped with a p-type dopant such as, for example, boron. As mentioned above, each bottom source/drain region 1710 is formed by an epitaxial growth (or deposition) process, as is defined above.

ILD material 1740 is formed above each bottom source/drain region 1710. ILD material 1740 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 1740. The use of a self-planarizing dielectric material as ILD material 1740 may avoid the need to perform a subsequent planarizing step.

In one embodiment, ILD material 1740 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 1740, a planarization process or an etch back process follows the deposition of the dielectric material that provides ILD material 1740. As is shown in FIGS. 17B-17C, ILD material 1740 that is present atop each bottom source/drain region 1710 has a topmost surface that is lower than a bottommost surface of semiconductor channel material layer 1470 of the top FET.

Top source/drain region 1720 is formed by epitaxial growth of a semiconductor material on physically exposed sidewalls of each semiconductor channel material layer 1470 of the top FET. In the depicted embodiment, the semiconductor material that provides the top source/drain region 1720 grows laterally out from the sidewalls of each semiconductor channel material layer 1470 of the top FET. The top source/drain region 1720 has a bottommost surface that directly contacts a topmost surface of the ILD material 1740 that is present atop the bottom source/drain region 1710.

Each top source/drain region 1720 includes a semiconductor material and a dopant. The semiconductor material that provides each top source/drain region 1720 can be selected from one of the semiconductor materials mentioned above for the semiconductor substrate 110. In some embodiments, the semiconductor material that provides each top source/drain region 1720 may comprise a same semiconductor material as that which provides semiconductor channel material layer 1470. In other embodiments, the semiconductor material that provides each top source/drain region 1720 may comprise a different semiconductor material than that which provides semiconductor channel material layer 1470. For example, the semiconductor material that provides each top source/drain region 1720 may comprise a silicon germanium alloy, while semiconductor channel material layer 1470 may comprise silicon.

The dopant that is present in each top source/drain region 1720 can be either a p-type dopant or an n-type dopant. In one embodiment, the dopant that can be present in each top source/drain region 1720 can be introduced into the precursor gas that provides each top source/drain region 1720. In another embodiment, the dopant can be introduced into an intrinsic semiconductor layer by utilizing one of ion implantation or gas phase doping. In one example, each top source/drain region 1720 comprises a silicon germanium alloy that is doped with a p-type dopant such as, for example, boron. As mentioned above, each top source/drain region 1720 is formed by an epitaxial growth (or deposition) process, as is defined above.

Additional ILD material 1740 is formed above each top source/drain region 1720. ILD material 1740 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 1740. The use of a self-planarizing dielectric material as ILD material 1740 may avoid the need to perform a subsequent planarizing step.

In one embodiment, ILD material 1740 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 1740, a planarization process or an etch back process follows the deposition of the dielectric material that provides ILD material 1740. As is shown in FIGS. 17B-17C, ILD material 1740 that is present atop each top source/drain region 140 has a topmost surface that is coplanar to a topmost surface of gate sidewall spacer 1490.

Each sacrificial gate structure is removed to provide a gate cavity for both the top and bottom FETs.

Next, each semiconductor channel material nanosheet (i.e., semiconductor channel material layer 1470) of both the top and bottoms FETs is suspended by selectively etching each recessed sacrificial semiconductor material layer 1430 relative to each semiconductor channel material nanosheet (i.e., semiconductor channel material layer 1470).

Functional gate structures are formed in each gate cavity. For the bottom FET, the functional gate structure surrounds a physically exposed surface of each semiconductor channel material nanosheet (i.e., semiconductor channel material layer 1470). For the top FET the functional gate structure surrounds a physically exposed surface of each semiconductor channel material nanosheet (i.e., semiconductor channel material layer 1470). By "functional gate structure" it is meant a permanent gate structure used to control output current (i.e., flow of carriers in the channel) of a semiconducting device through electrical or magnetic fields. Collectively, both gate structures are referred to as replacement gate 1730 in the Figures.

While not depicted, in some embodiments, a gate dielectric portion may be present that includes a gate dielectric material. Such a gate dielectric portion may be an oxide, nitride, and/or oxynitride. In one example, the gate dielectric portion can be a high-κ material having a dielectric constant greater than silicon dioxide. Example high-κ dielectrics include, but are not limited to, HfO2, ZrO2, La2O3, Al2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-κ gate dielectric, can be formed and used as the gate dielectric portion.

The gate dielectric material used in providing a gate dielectric portion can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing a gate dielectric portion can have a thickness in a range from 1 nm to 10 nm. Other thicknesses that are lesser than, or greater than, the aforementioned thickness range can also be employed for the gate dielectric material that may provide a gate dielectric portion.

Replacement gate 1730 includes a gate conductor material and a gate dielectric. The gate conductor material used in providing replacement gate 1730 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), or multilayered combinations thereof. In one embodiment, replacement gate 1730 may comprise an nFET gate metal. In another embodiment, replacement gate 1730 may comprise a pFET gate metal. When multiple gate cavities are formed, it is possible to form a nFET in a first set of the gate cavities and wrapping around some of the semiconductor channel material nanosheet (i.e., semiconductor channel material layer 1470) and a pFET in a second set of the gate cavities and wrapping around some of the semiconductor channel material nanosheet (i.e., semiconductor channel material layer 1470).

The gate conductor material used in providing replacement gate 1730 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing replacement gate 1730 can have a thickness from 5 nm to 200 nm. Other thicknesses that are lesser than, or greater than, the aforementioned thickness range can also be employed for the gate conductor material used in providing replacement gate 1730.

A functional gate structure (replacement gate 1730) can be formed by providing a functional gate material stack of the gate dielectric material and the gate conductor material. A planarization process may follow the formation of the functional gate material stack.

Gate cuts 1750 may be patterned by conventional lithography and etch processes to isolate the gate regions at cell boundaries. Each gate cut 1750 is filled with a dielectric material such as, for example, SiN or a combination of SiN and SiO2.

Figure 18A:
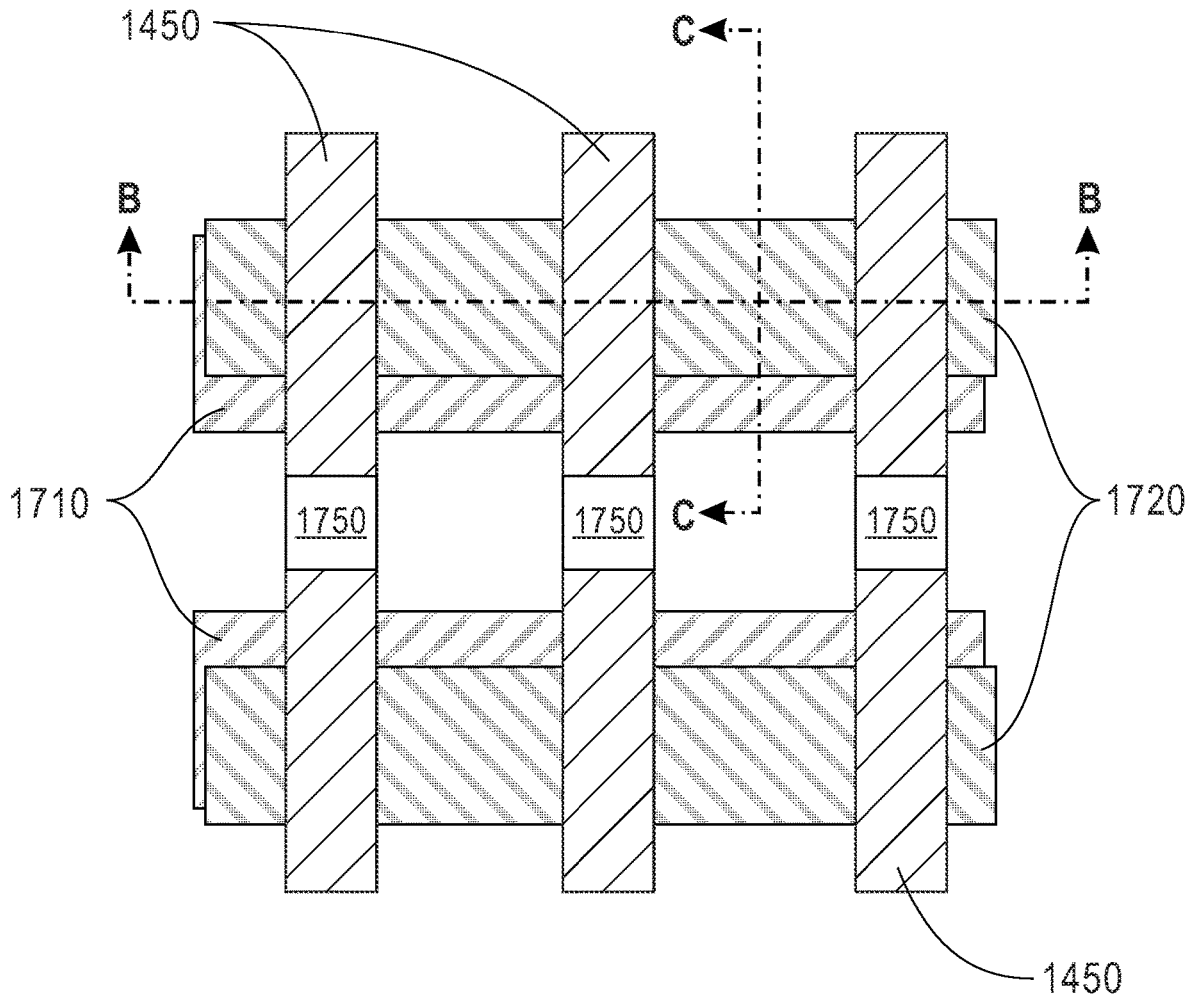
FIG. 18A depicts a top-down view.
Figures 18B, 18C:
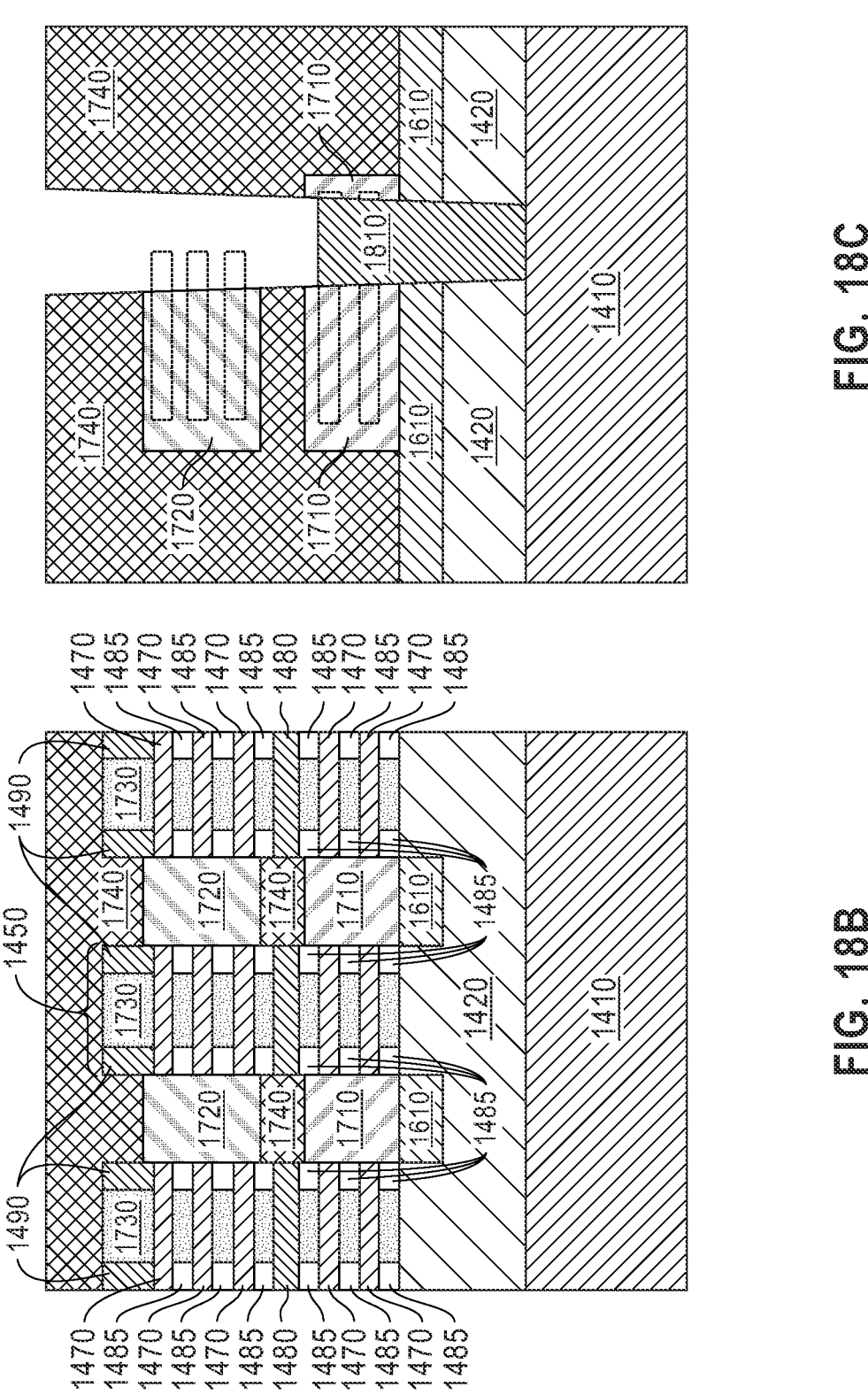
FIG. 18B depicts a cross-sectional view, along section line B of FIG. 18A.
FIG. 18C depicts a cross-sectional view, along section line C of FIG. 18A, of a process of forming VBPR contact trenches and forming a dummy VBPR contact, in accordance with an embodiment of the present invention.

FIG. 18A depicts a top-down view of fabrication steps, in accordance with an embodiment of the present invention. FIG. 18B depicts a cross-sectional view along section line B of FIG. 18A and FIG. 18C depicts a cross-sectional view along section line C of FIG. 18A, in accordance with an embodiment of the present invention. FIGS. 18A-18C depicts the formation of VBPR contact trenches and the formation of dummy VBPR contact 1810.

Trenches may be formed by an etching process, such as reactive-ion etching (RIE), laser ablation, or any etch process which can be used to selectively remove a portion of material such as ILD material 1740, top source/drain region 1720, bottom source/drain region 1710, bottom dielectric 1610, and BOX 1420. A hardmask (not shown) may be patterned using photoresist to expose areas where trenches are desired and the hardmask may be utilized during the etching process in the creation of the trenches. The etching process only removes portions of the device not protected by the hardmask and the etching process stops at semiconductor substrate 1410.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

In general, dummy VBPR contacts 1810 make contact with the bottom source/drain region 1710 and pass through bottom dielectric 1610 and BOX 1420, making contact with a top surface of semiconductor substrate 1410.

Each dummy VBPR contact 1810 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. CMP and/or patterning and etching processes may be used to remove unwanted portions of dummy VBPR contact 1810 to planarize and recess the layer(s) that comprise dummy VBPR contacts 1810 such that a top surface of the dummy VBPR contacts 1810 makes contact with the bottom source/drain region 1710, but does not make contact with the top source/drain region 1720. Dummy VBPR contacts 1810 may each be formed of, for example TiOx, AlOx, or a-Ge.

Figure 19A:
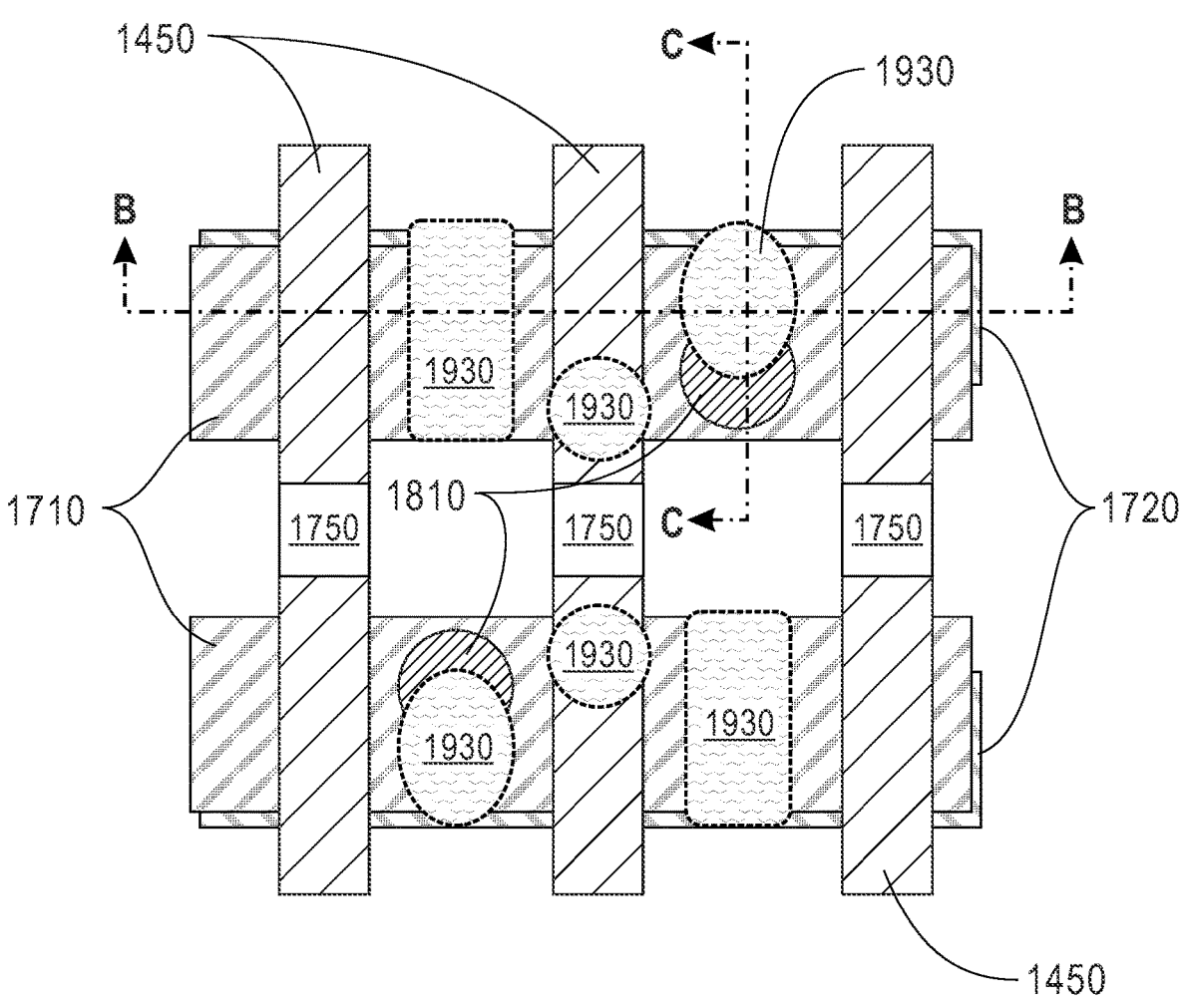
FIG. 19A depicts a top-down view.
Figures 19B, 19C:
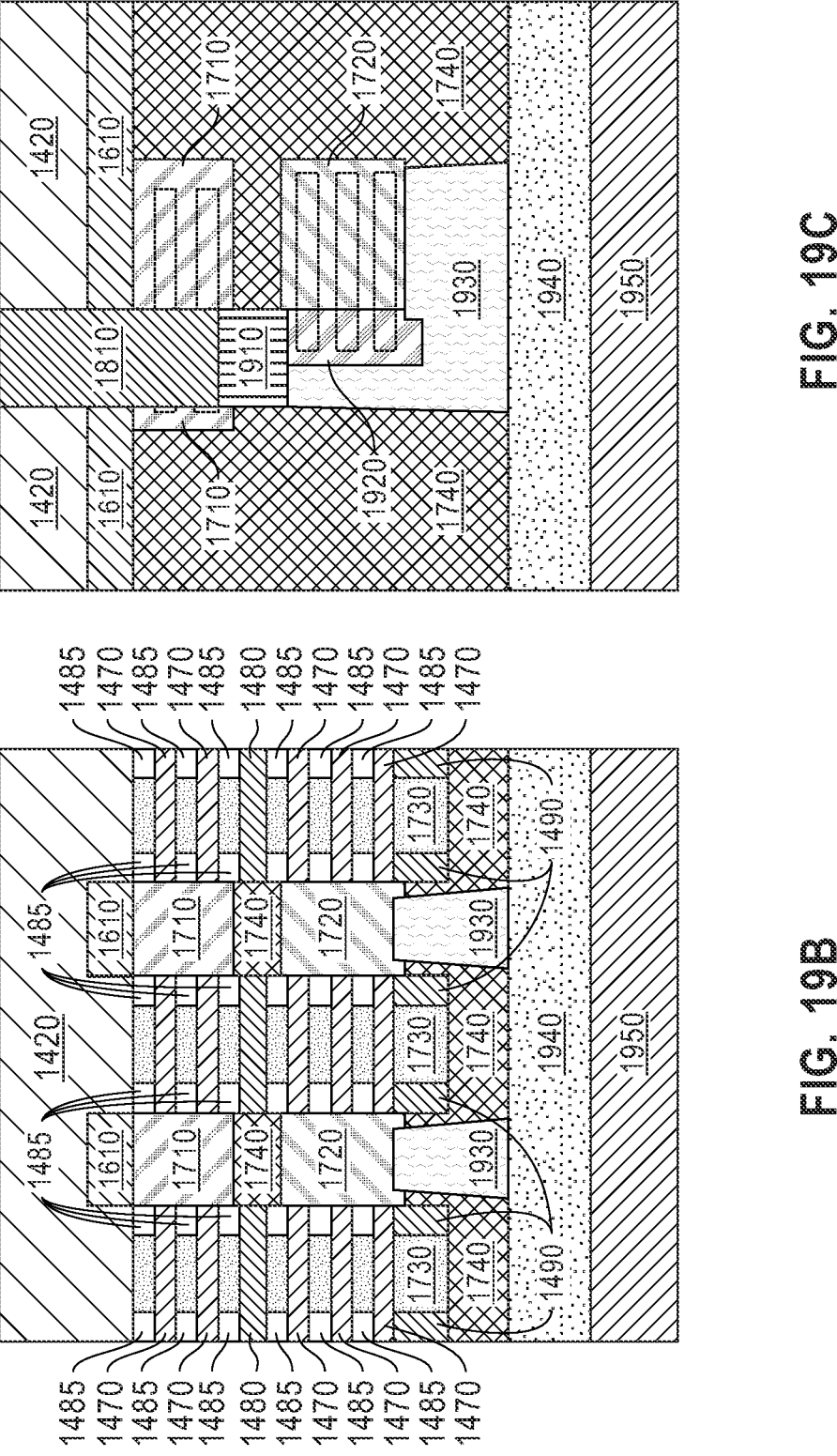
FIG. 19B depicts a cross-sectional view, along section line B of FIG. 19A.
FIG. 19C depicts a cross-sectional view, along section line C of FIG. 19A, of a process of flipping the device and removing the semiconductor substrate, in accordance with an embodiment of the present invention.

FIG. 19A depicts a top-down view of fabrication steps, in accordance with an embodiment of the present invention. FIG. 19B depicts a cross-sectional view along section line B of FIG. 19A and FIG. 19C depicts a cross-sectional view along section line C of FIG. 19A, in accordance with an embodiment of the present invention. FIGS. 19A-19C depicts the flipping of the device and removal of semiconductor substrate 1410 after fabrication steps (not shown) have been performed on the device that are similar to the fabrication steps described in FIGS. 5A-5C through FIGS. 9A-9C.

VBPR dielectric cap 1910, additional top source/drain region material 1920, top source/drain contacts 1930, BEOL interconnect 1940, and carrier wafer 1950 are formed in the manner previously described with respect to FIGS. 5A-5C through FIGS. 9A-9C.

The resulting wafer containing device is flipped such that a top surface of the wafer faces downwards and the carrier wafer 1950 acts as a bottom surface of the flipped device.

A combination of processes such as wafer grinding, CMP, wet and dry etch processes may be used to remove semiconductor substrate 1410.

Figure 20A:
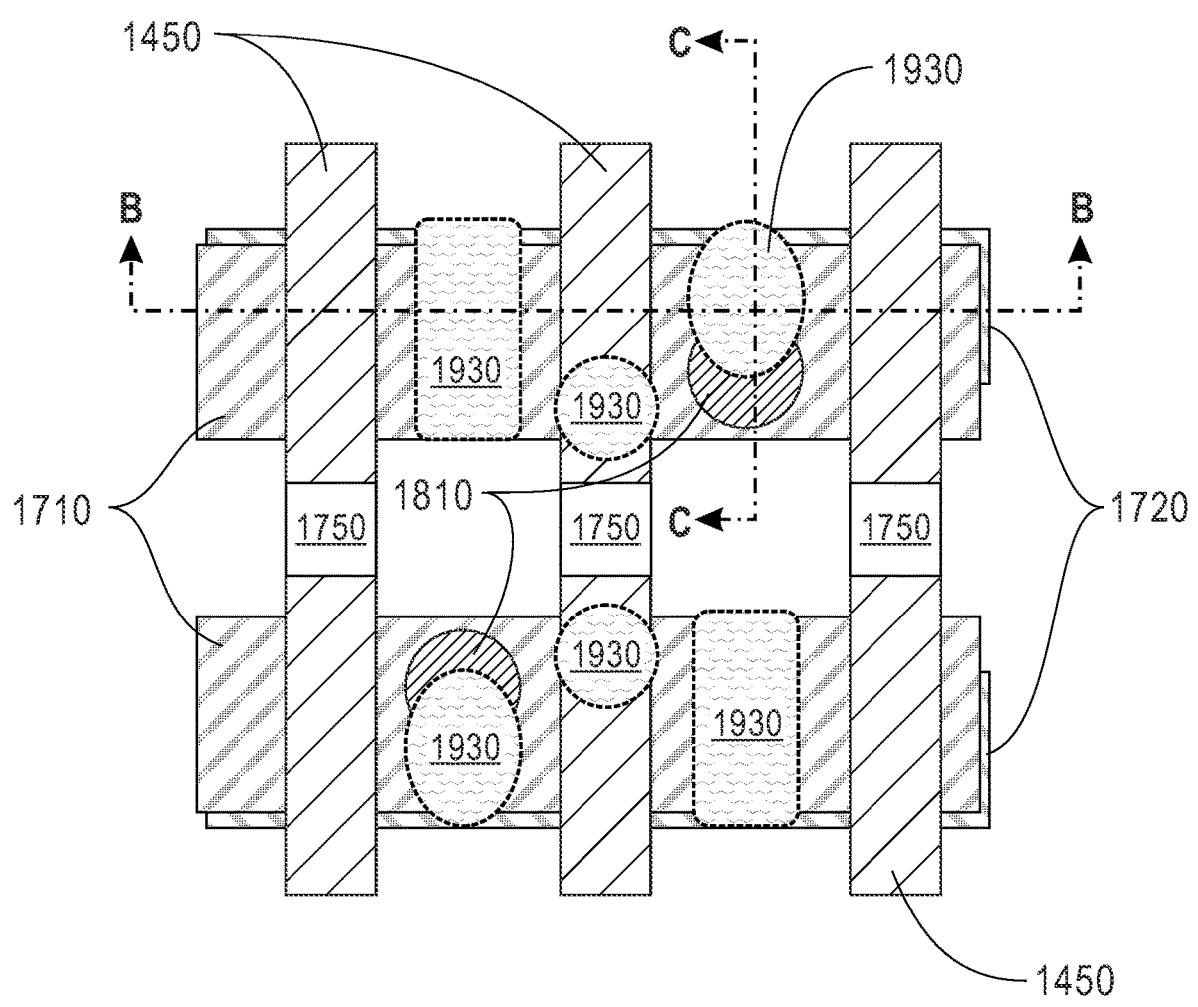
FIG. 20A depicts a top-down view.
Figures 20B, 20C:
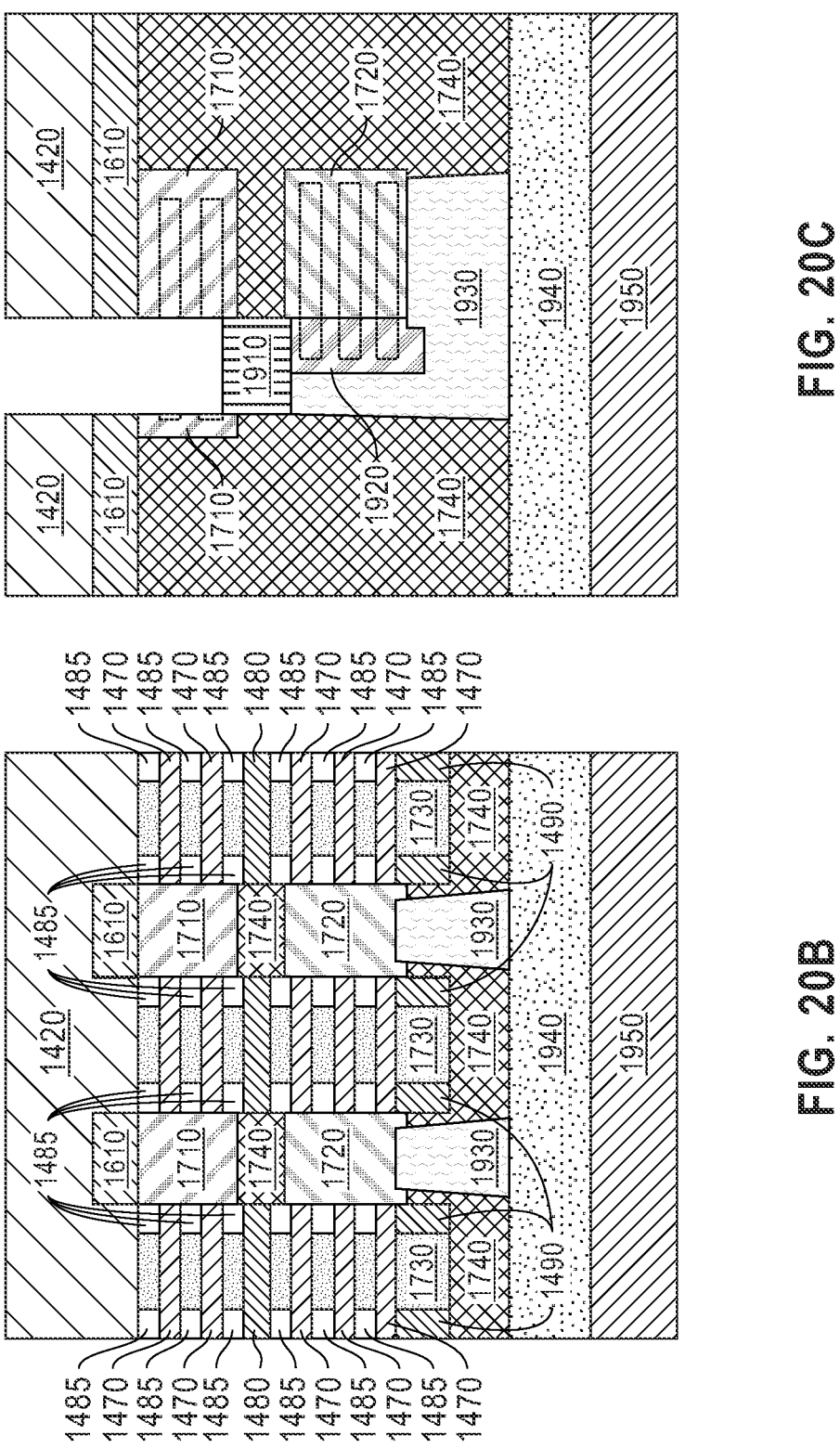
FIG. 20B depicts a cross-sectional view, along section line B of FIG. 20A.
FIG. 20C depicts a cross-sectional view, along section line C of FIG. 20A, of a process of removing the dummy VBPR contacts, in accordance with an embodiment of the present invention.

FIG. 20A depicts a top-down view of fabrication steps, in accordance with an embodiment of the present invention. FIG. 20B depicts a cross-sectional view along section line B of FIG. 20A and FIG. 20C depicts a cross-sectional view along section line C of FIG. 20A, in accordance with an embodiment of the present invention. FIGS. 20A-20C depicts the removal of dummy VBPR contacts 1810.

Dummy VBPR contacts 1810 may be removed by an etching process, such as RIE, laser ablation, or any etch process which can be used to selectively etch dummy VBPR contacts 1810 relative to BOX 1420, bottom dielectric 1610, and bottom source/drain region 1710. A hardmask (not shown) may be patterned using photoresist to expose dummy VBPR contacts 1810 and the hardmask may be utilized during the etching process to remove dummy VBPR contacts 1810. In such an embodiment, the etching process only removes portions of the device not protected by the hardmask and the etching process stops at VBPR dielectric cap 1910.

Figure 21A:
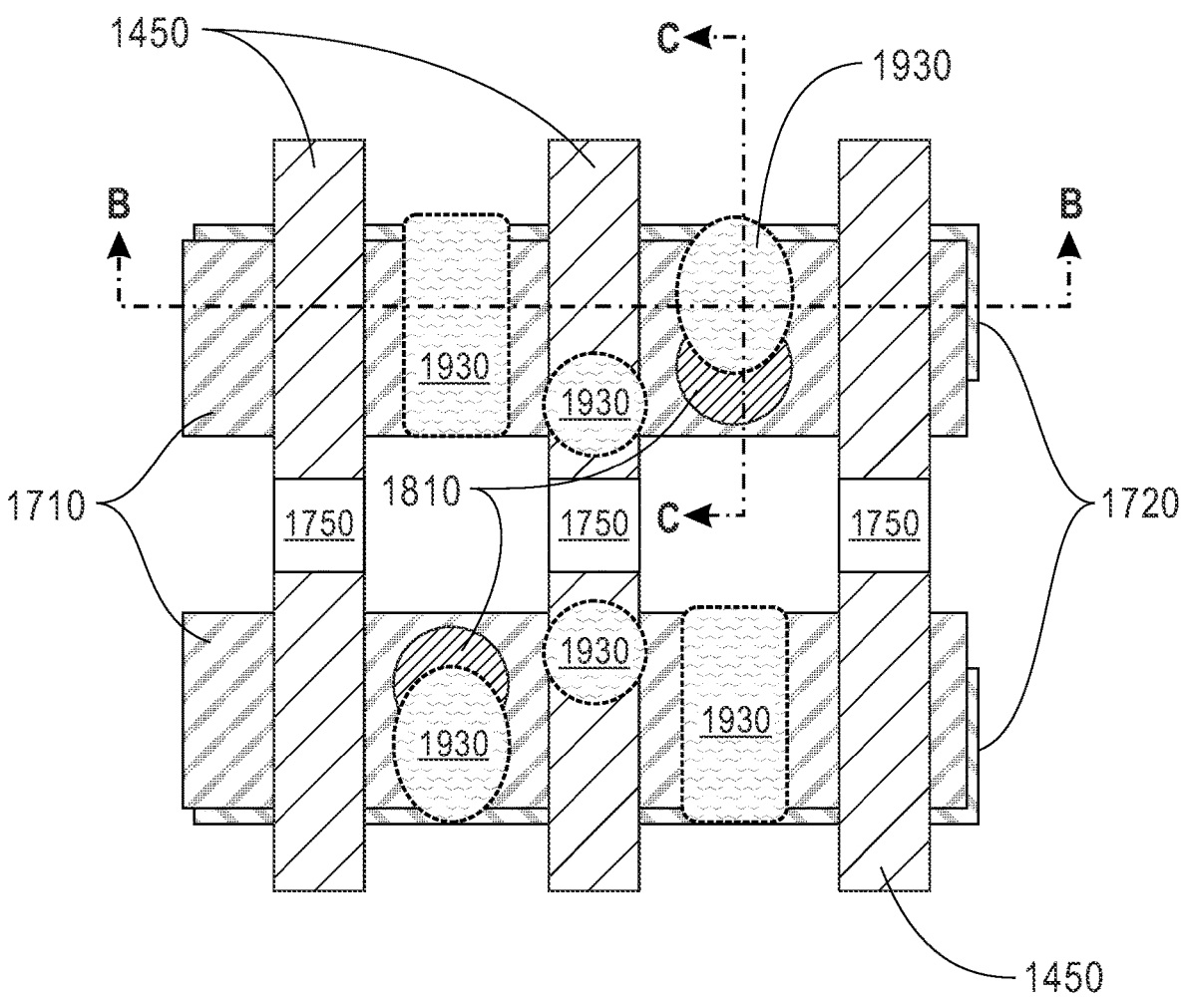
FIG. 21A depicts a top-down view.
Figures 21B, 21C:
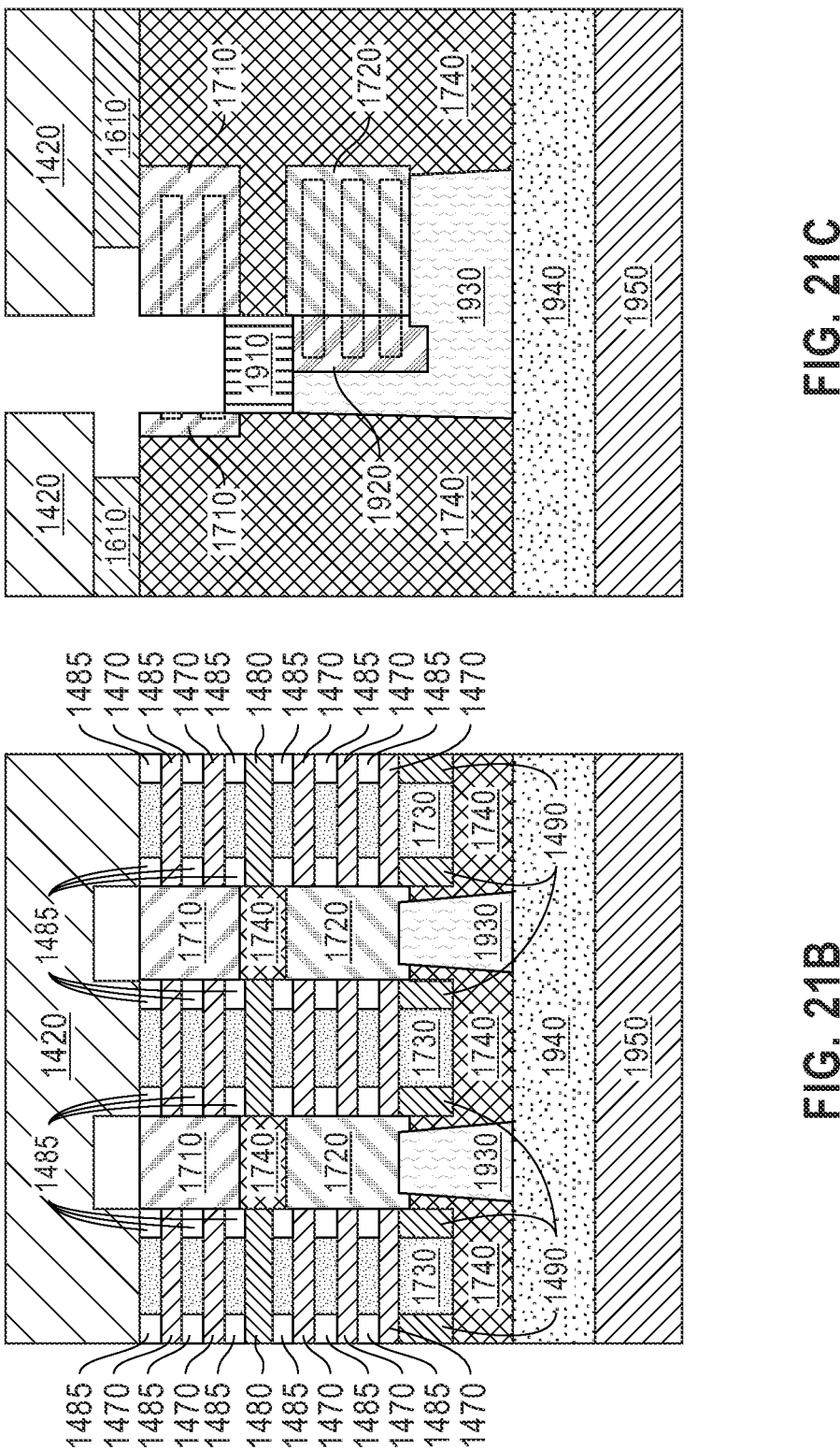
FIG. 21B depicts a cross-sectional view, along section line B of FIG. 21A.
FIG. 21C depicts a cross-sectional view, along section line C of FIG. 21A, of a process of selectively removing portions of the bottom dielectric layer, in accordance with an embodiment of the present invention.

FIG. 21A depicts a top-down view of fabrication steps, in accordance with an embodiment of the present invention. FIG. 21B depicts a cross-sectional view along section line B of FIG. 21A and FIG. 21C depicts a cross-sectional view along section line C of FIG. 21A, in accordance with an embodiment of the present invention. FIGS. 21A-21C depicts the selective removal of portions of bottom dielectric 1610.

Portions of bottom dielectric 1610 may be removed by an etching process, such as RIE, wet etch, or any etch process which can be used to selectively etch bottom dielectric 1610 relative to BOX 1420, bottom source/drain region 1710, and ILD material 1740.

Figure 22A:
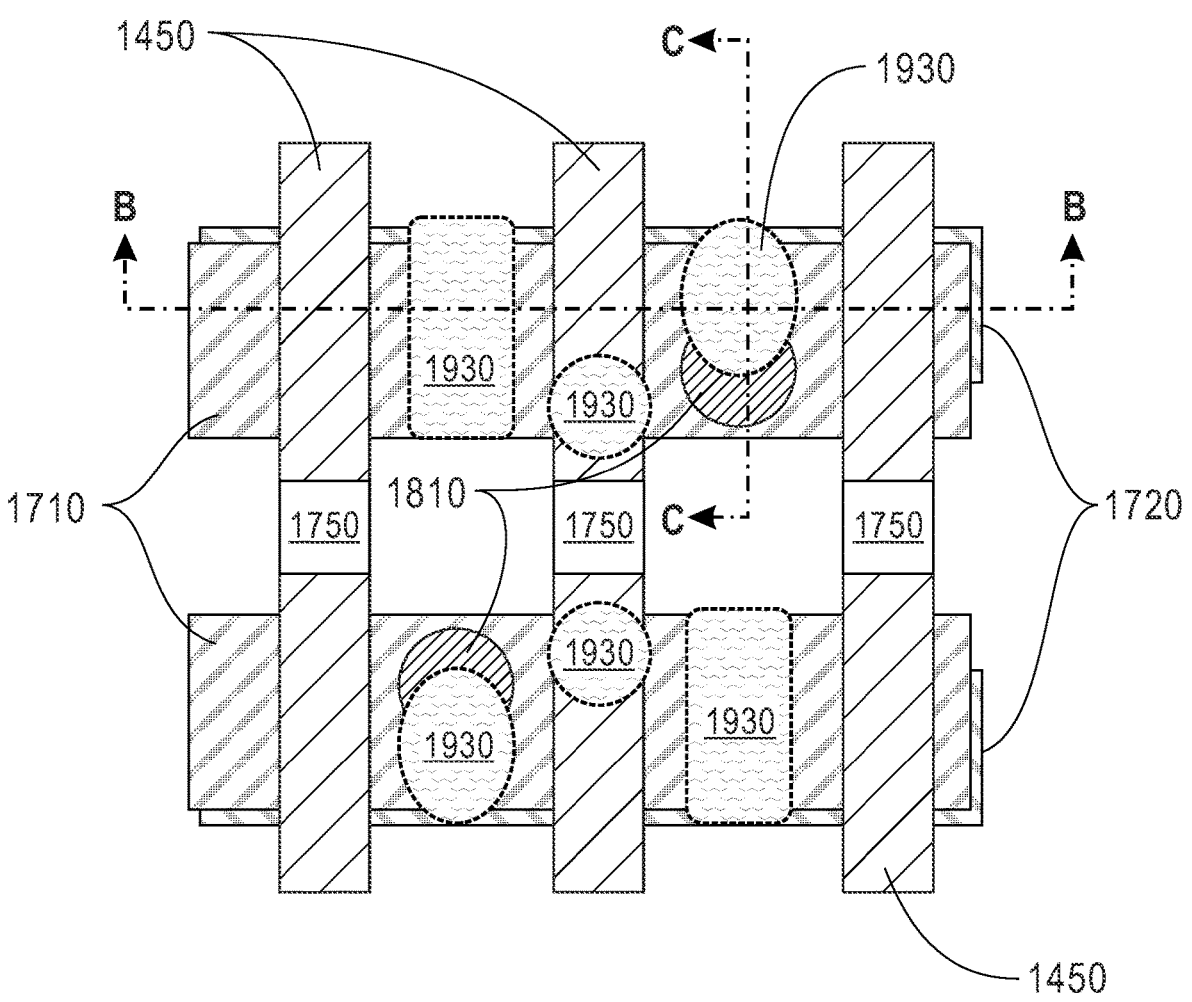
FIG. 22A depicts a top-down view.
Figures 22B, 22C:
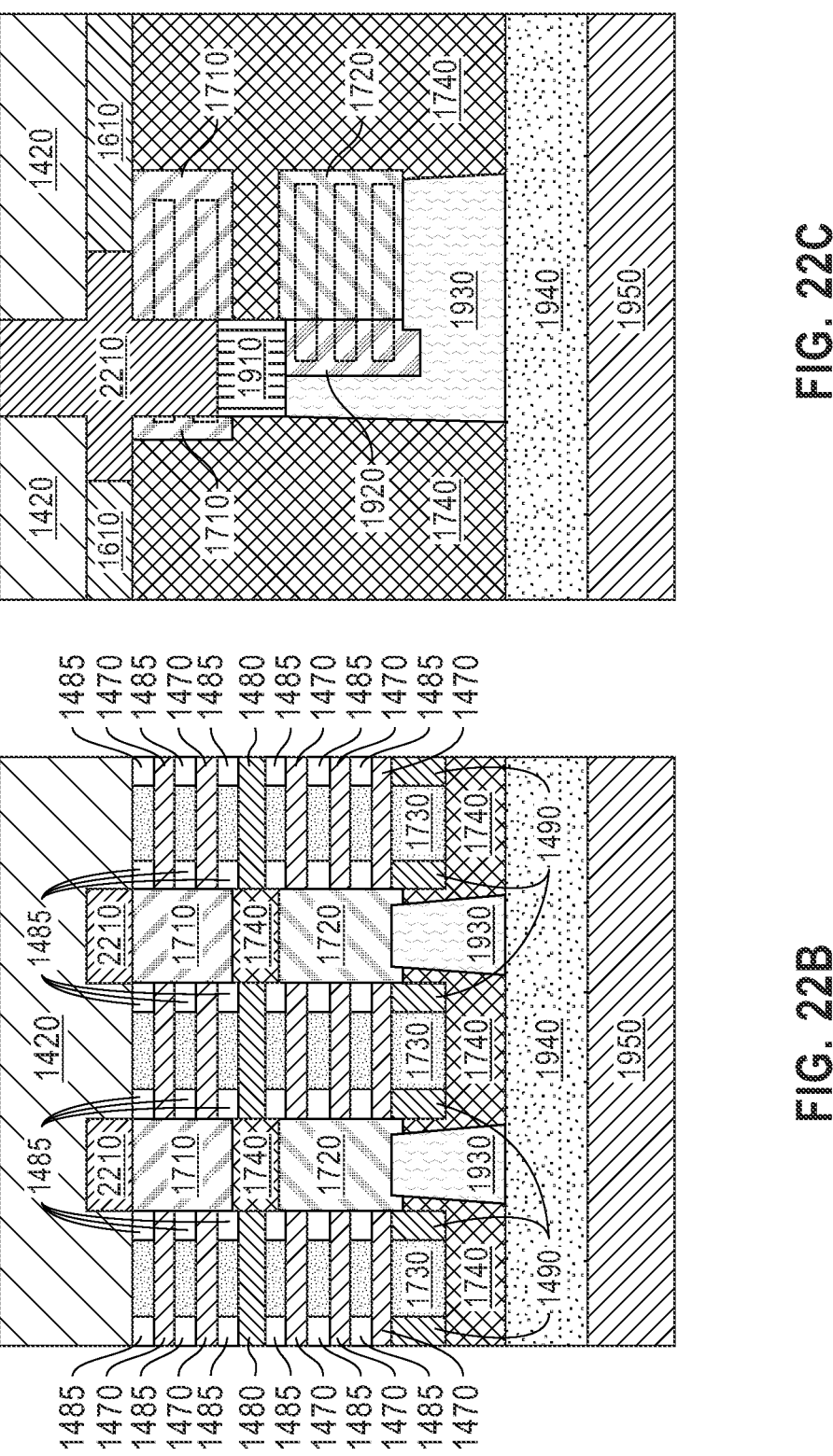
FIG. 22B depicts a cross-sectional view, along section line B of FIG. 22A.
FIG. 22C depicts a cross-sectional view, along section line C of FIG. 22A, of a process of forming a backside contact, in accordance with an embodiment of the present invention.

FIG. 22A depicts a top-down view of fabrication steps, in accordance with an embodiment of the present invention. FIG. 22B depicts a cross-sectional view along section line B of FIG. 22A and FIG. 22C depicts a cross-sectional view along section line C of FIG. 22A, in accordance with an embodiment of the present invention. FIGS. 22A-22C depict the formation of backside contact 2210.

In general, backside contact 2210 makes contact with bottom source/drain region 1710 and exhibits a crossbar shape where a horizontal portion of the crossbar shape that comprises backside contact 2210 is of a vertical thickness equal to that of bottom dielectric 1610. Further, the horizontal portion of the crossbar shape that comprises backside contact 2210 contacts a bottom surface (when the device is subsequently flipped upright) of bottom source/drain region 1710.

Backside contact 2210 may be formed by metal deposition and planarization. The metal layers comprise a silicide liner, such as, for example, Ti, Ni, or NiPt, followed by adhesion metal liner, such as, for example, TiN, and a conductive metal fill, such as, for example, Co, Ru, W, or Cu.

Each backside contact 2210 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

Figure 23A:
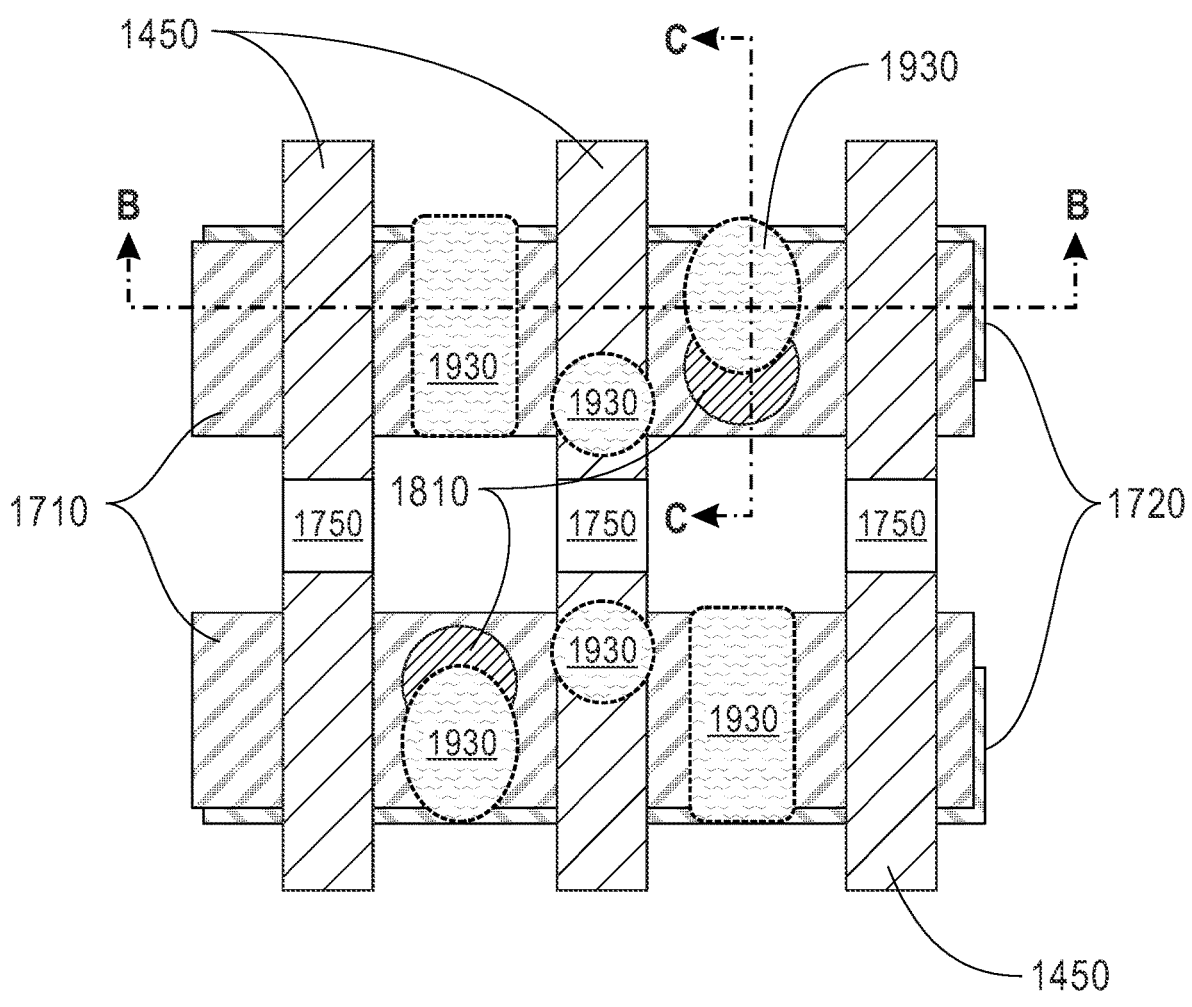
FIG. 23A depicts a top-down view.
Figures 23B, 23C:
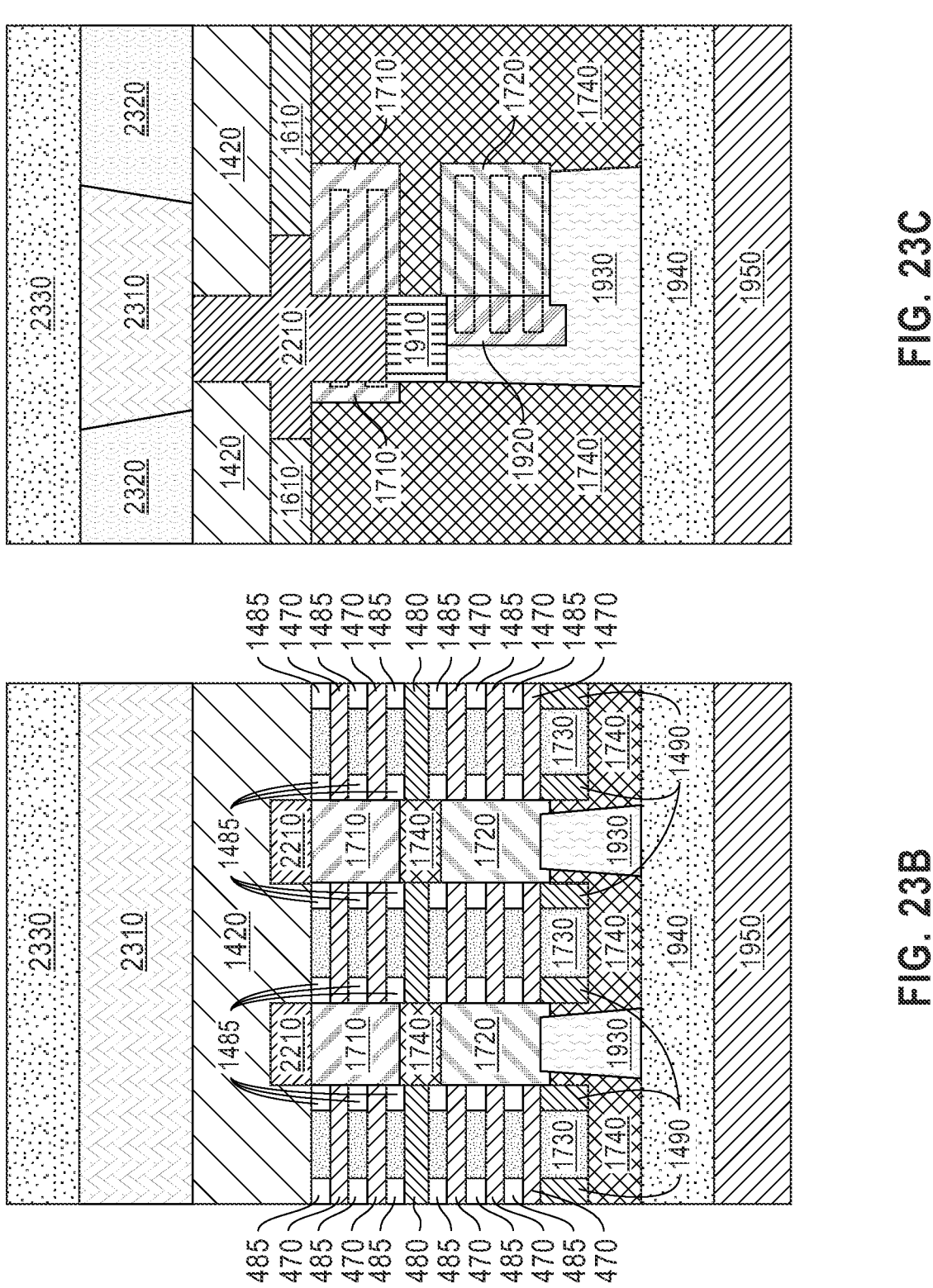
FIG. 23B depicts a cross-sectional view, along section line B of FIG. 23A.
FIG. 23C depicts a cross-sectional view, along section line C of FIG. 23A, of a process of forming a backside ILD layer, a backside power rail, and BSPDN, in accordance with an embodiment of the present invention.

FIG. 23A depicts a top-down view of fabrication steps, in accordance with an embodiment of the present invention. FIG. 23B depicts a cross-sectional view along section line B of FIG. 23A and FIG. 23C depicts a cross-sectional view along section line C of FIG. 23A, in accordance with an embodiment of the present invention. FIGS. 23A-23C depict the formation of backside ILD 2320, backside power rail 2310, and the formation of BSPDN 2330.

Backside ILD 2320 material is formed above BOX 1420 and backside contact 2210.

Backside ILD 2320 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as backside ILD 2320. The use of a self-planarizing dielectric material as backside ILD 2320 may avoid the need to perform a subsequent planarizing step.

In one embodiment, backside ILD 2320 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as backside ILD 2320, a planarization process or an etch back process follows the deposition of the dielectric material that provides backside ILD 2320.

One or more trenches may be formed by an etching process, such as reactive-ion etching (RIE), laser ablation, or any etch process which can be used to remove a portion of material such as backside ILD 2320. A hardmask (not shown) may be patterned using photoresist to expose areas of backside ILD 2320 where trenches are desired and the hardmask may be utilized during the etching process in the creation of the trenches. The etching process only removes portions of backside ILD 2320 not protected by the hardmask and the etching process stops at BOX 1420 and backside contact 2210.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown)

is removed. The process of removing the photoresist is similar to that of the process of removing the hardmask.

Backside power rail 2310 may be formed by, for example, depositing (e.g., by PVD), a metal layer (e.g., a thin adhesion TiN layer followed by bulk Cu, Co, or Ru fill) on exposed surfaces of backside contact 2210 and BOX 1420. Any deposition process may be used for the formation of the metal layer including, for example, chemical vapor deposition (CVD), plasma enhanced chemical vapor deposition (PECVD), physical vapor deposition (PVD), plating, sputtering, or atomic layer deposition. In other embodiments, co-evaporation techniques may be utilized to form backside power rail 2310. In yet other embodiments, known sputter deposition or chemical vapor deposition techniques may be utilized to form the silicide layer.

In some embodiments, backside power rail 2310 is deposited such that backside power rail 2310 surrounds the silicide layer and fills the remaining area of the trench. Backside power rail 2310 may be in direct contact with the silicide layer, backside contact 2210, and backside ILD 2320.

Backside power rail 2310 can include a conductive material including, for example, Cu, Co, Ru, W with a thin adhesion liner such as, for example, TiN.

Backside power rail 2310 can be formed utilizing a deposition process including, for example, plating, chemical vapor deposition (CVD), plasma enhanced chemical vapor deposition (PECVD), physical vapor deposition (PVD), sputtering, atomic layer deposition (ALD) or other like deposition processes.

BSPDN 2330 comprises a backside power delivery network that is depicted as a simplified layer. BSPDN 2330 may be formed according to processes known in the art.

Subsequent to the formation of BSPDN 2330, the wafer may be released from carrier wafer 1950 and flipped over (not depicted) such that BSPDN 2330 is on the bottom of the wafer and operates as a backside power delivery network. Alternatively, the carrier wafer 1950 is kept, and TSVs can be formed form backside of the wafer to BEOL interconnect at frontside.

The resulting semiconductor structure includes a top FET over a bottom FET where a bottom source/drain contact (backside contact 2210) etches through the bottom source/drain region 1710 and interconnects at a backside of the device to backside power rail 2310. A top source/drain contact 1930 connects the top source/drain region 1720 to BEOL interconnect 1940. A bottom source/drain contact cap (VBPR dielectric cap 1910) separates the bottom source/drain contact (backside contact 2210) from the top source/drain contact 1930. In some embodiments, both the bottom source/drain contact (backside contact 2210) and the top source/drain contact 1930 each, at least, partially overlaps the footprint of both the bottom and top active regions of the device. In some embodiments, the backside contact 2210 exhibits a crossbar shape. In some embodiments, a bottom dielectric 1610 exists under the bottom source/drain region 1710 and the horizontal portion of the crossbar shape that comprises backside contact 2210 is of a same vertical thickness as the bottom dielectric 1610.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a first field-effect transistor (FET) having a first source/drain;
   a second FET having a second source/drain, wherein the second FET is stacked above the first FET; and
   a contact region extending from above the second source/drain to beneath the first source/drain, wherein:
   the contact region comprises a top contact, a bottom contact, and a dielectric layer;
   the dielectric layer (i) separates the top contact from the bottom contact and (ii) physically contacts both the top contact and the bottom contact along a plane parallel to a sidewall of the bottom contact;
   the dielectric layer and the bottom contact collectively pass completely through the first source/drain; and
   the first source/drain fully surrounds a portion of the sidewall of the bottom contact.

2. The semiconductor structure of claim 1, wherein a bottom surface of the bottom contact contacts a backside power rail (BPR).

3. The semiconductor structure of claim 1, wherein the dielectric layer separates:
   the bottom contact from the second source/drain; and
   the top contact from the first source/drain.

4. The semiconductor structure of claim 1, wherein the top contact contacts a top surface of the second source/drain and a sidewall of the second source/drain.

5. The semiconductor structure of claim 1, further comprising a second dielectric layer beneath the first source/drain.

6. The semiconductor structure of claim 1, further comprising a buried oxide layer (BOX) beneath the first FET.

7. The semiconductor structure of claim 1, further comprising a top surface of the top contact contacting a back end of line (BEOL) interconnect.

8. A method of forming a semiconductor structure, the method comprising:

forming a first field-effect transistor (FET) having a first source/drain;

forming a second FET having a second source/drain, wherein the second FET is stacked above the first FET;

forming a trench extending from above the second source/drain to beneath the first source/drain, wherein the trench passes (i) completely through the first source/drain, such that a sidewall of the trench includes a fully surrounding portion of a sidewall of the first source/drain, and (ii) through portions of the second source/drain;

forming a bottom contact in the trench;

forming a dielectric layer in the trench, the dielectric layer on a top surface of the bottom contact; and forming a top contact in the trench, the top contact on a top surface of the dielectric layer, wherein the dielectric layer (i) separates the top contact from the bottom contact and (ii) physically contacts both the top contact and the bottom contact along a plane parallel to the sidewall of the first source/drain.

9. The method of claim 8, wherein the bottom contact contacts the fully surrounding portion of the sidewall of the first source/drain.

10. The method of claim 8, wherein the dielectric layer separates:

the bottom contact from the second source/drain; and the top contact from the first source/drain.

11. The method of claim 8, further comprising: prior to forming the top contact, forming additional material for the second source/drain by epitaxial growth of a semiconductor material on physically exposed sidewalls of the second source/drain.

12. The method of claim 8, further comprising:

prior to forming the top contact, a second trench exposing a top surface of the second source/drain, wherein forming the top contact further comprises, forming the top contact in the second trench.

13. The method of claim 8, wherein a top surface of the top contact contacts a back end of line (BEOL) interconnect.

14. The method of claim 13, further comprising:

bonding a top surface of the BEOL interconnect to a carrier wafer;

flipping the semiconductor structure; and forming a backside power rail (BPR), wherein the BPR contacts a bottom surface of the bottom contact.

15. The method of claim 8, wherein forming the first FET and the second FET comprises:

providing a bottom nanosheet stack and a top nanosheet stack separated by a spacer, each nanosheet stack comprising alternating nanosheets of a sacrificial semiconductor material nanosheet and a semiconductor channel material nanosheet, wherein a sacrificial gate structure straddles over the bottom nanosheet stack and the top nanosheet stack;

forming the first source/drain by epitaxial growth of a semiconductor material on physically exposed sidewalls of each semiconductor channel material nanosheet of the bottom nanosheet stack, wherein the first source/drain is present on a surface of the dielectric layer;

forming an interlayer dielectric layer on the first source/drain;

forming the second source/drain by epitaxial growth of a semiconductor material on physically exposed sidewalls of each semiconductor channel material nanosheet of the top nanosheet stack, wherein the second source/drain is present on the interlayer dielectric layer;

removing the sacrificial gate structure;

removing each sacrificial semiconductor material nanosheet of the top nanosheet stack and the bottom nanosheet stack to suspend each semiconductor channel material nanosheet of the top nanosheet stack and the bottom nanosheet stack; and forming a functional gate structure in regions occupied by the sacrificial gate structure and each sacrificial semiconductor material nanosheet, wherein the functional gate structure wraps around each suspended semiconductor channel material nanosheet.

16. The method of claim 8, further comprising:

prior to forming the first source/drain and the second source/drain:

recessing exposed portions of a buried oxide layer (BOX) beneath the first FET; and forming a second dielectric layer in the recess of the BOX.

17. The method of claim 15, further comprising:

flipping the semiconductor structure;

removing the sacrificial gate structure;

selectively etching expose portions of the second dielectric layer; and forming a metal bottom contact in an area previously occupied by the sacrificial gate structure and the selectively etched portions of the second dielectric layer.

18. The method of claim 17, further comprising forming a backside power rail (BPR), wherein the BPR contacts a bottom surface of the metal bottom contact.

\* \* \* \* \*